United States Patent
Jung et al.

(10) Patent No.: US 6,784,950 B2
(45) Date of Patent: Aug. 31, 2004

(54) LIQUID CRYSTAL DISPLAY AND A METHOD FOR MANUFACTURING THE SAME

(75) Inventors: Byung-Hoo Jung, Kyungki-do (KR); Chang-Won Hwang, Kyungki-do (KR); Byung-Seong Bae, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/367,769

(22) Filed: Feb. 19, 2003

(65) Prior Publication Data

US 2003/0147022 A1 Aug. 7, 2003

Related U.S. Application Data

(62) Division of application No. 09/956,145, filed on Sep. 20, 2001, now Pat. No. 6,549,249, which is a division of application No. 09/222,783, filed on Dec. 30, 1998, now Pat. No. 6,317,173.

(30) Foreign Application Priority Data

Dec. 31, 1997 (KR) .............................................. 97-79791
Jan. 26, 1998 (KR) .............................................. 98-2311
Jan. 26, 1998 (KR) .............................................. 98-2312

(51) Int. Cl.$^7$ .................................................. G02F 1/13
(52) U.S. Cl. .............................. 349/39; 349/74; 349/113
(58) Field of Search ................................ 349/39, 47, 113

(56) References Cited

U.S. PATENT DOCUMENTS

| | | | |
|---|---|---|---|
| 5,814,529 A | | 9/1998 | Zhang |
| 5,899,548 A | * | 5/1999 | Ishiguro ...................... 349/47 |
| 5,917,563 A | | 6/1999 | Matsushima |
| 5,920,362 A | | 7/1999 | Lee |
| 5,940,151 A | | 8/1999 | Ha |
| 5,966,193 A | | 10/1999 | Zhang et al. |
| 5,982,460 A | | 11/1999 | Zhang et al. |
| 5,990,491 A | | 11/1999 | Zhang |
| 6,067,132 A | | 5/2000 | Kim |
| 6,078,365 A | | 6/2000 | Ueda et al. |

* cited by examiner

Primary Examiner—James A. Dudek
(74) Attorney, Agent, or Firm—McGuireWoods, LLP

(57) ABSTRACT

A source electrode and a metal pattern for a storage capacitor are formed on an insulating substrate, a silicon layer having a doped source region and a doped drain region is formed on the substrate and the source and the drain regions directly contact to the source electrode and the metal pattern. A gate insulating film is formed thereon, and a storage electrode is formed on the gate insulating film opposite the metal pattern. A passivation film covering the storage electrode is formed and the pixel electrode is formed thereon. The pixel electrode is directly connected to the drain region or to the metal pattern.

12 Claims, 45 Drawing Sheets

LIQUID CRYSTAL DISPLAY AND A METHOD FOR MANUFACTURING THE SAME

This application is a divisional of U.S. application Ser. No. 09/956,145 filed Sep. 20, 2001 now U.S. Pat. No. 6,549,249, which is a divisional of U.S. application Ser. No. 09/222,783 filed Dec. 30, 1998 and now became U.S. Pat. No. 6,317,173.

BACKGROUND OF THE INVENTION (a) Field of the Invention

The present invention relates to liquid crystal displays (LCDs) having storage capacitors, manufacturing methods and a driving method thereof.

(b) Description of the Related Art

In general, a thin film transistor liquid crystal display (TFT-LCD) includes data lines transmitting display signals, gate lines transmitting scan signals, thin film transistors (TFTs) as switching devices, liquid crystal capacitors and storage capacitors. The TFT-LCDs are classified into two modes according to structures of the storage capacitors. One mode has a separate storage line connected to the storage electrodes and the other mode connects the storage capacitor to a gate line.

The principle of driving the LCD in the former mode and a conventional structure of an LCD will be described.

FIG. 1 is an equivalent circuit diagram of a conventional LCD.

A plurality of gate lines G1 and G2 and a plurality of data lines D1, D2 and D3 extend respectively in the horizontal direction and in the vertical direction. The gate lines G1 and G2 and the data lines D1, D2 and D3 intersect each other to define a plurality of pixels. A storage wire COM1 and COM2 passes through the pixels and a TFT is formed in each pixel. A gate electrode (g) of the TFT is connected to the gate line G1 or G2, and a source and a drain electrodes (s and d) of the TFT are respectively connected to the data line and a liquid crystal capacitor (LC). The drain electrode (d) is connected to the storage wire COM 1 or COM 2 to form a storage capacitor (STG).

If a gate-on voltage is applied to the gate electrode (g) of the TFT through the gate line G1, a display signal voltage from the data line is transmitted to the pixels via the TFT and charged in the liquid crystal capacitor (LC) and the storage capacitor (STG). The charged voltage is maintained until the next gate-on voltage in the next frame is applied in the pixel. Generally, when the gate voltage is changed from "on" level to "off" level, the pixel voltage slightly drops. The storage capacitor reduces the voltage-drop.

The TFTs have amorphous silicon layers or polycrystalline silicon layers as active layers and are classified into a top gate mode and a bottom gate mode according to the relative location of the gate electrode and the active layer. Most of the polycrystalline silicon TFT-LCDs use the top gate mode.

A storage capacitor of the conventional polycrystalline silicon TFT-LCD includes a doped storage region in the silicon layer, a storage electrode overlapping the storage region and a gate insulating film interposed therebetween. Moreover, another storage capacitor is formed of the storage electrode, a pixel electrode overlapping the storage electrode and a dielectric including an interlayer insulating film and a passivation film interposed between the pixel electrode and the storage electrode. However, the capacitance between the pixel electrode and the storage electrode is relatively small and negligible, since the interlayer insulating film and the passivation film, which is respectively 5,000 Å thick, are much thicker than the gate insulating film, which is 500 Å~3,000 Å thick.

In this conventional structure, it is required to add an ion implanting step to make a storage region. In other words, additional steps of depositing photoresist film, patterning the photoresist to make openings by using a mask, injecting ions into the silicon layer through the openings and annealing the injected ions are required.

SUMMARY OF THE INVENTION

It is therefore an object of the present invention to reduce the manufacturing steps by getting rid of photolithography and ion implanting in the steps of forming a TFT and a storage capacitor.

It is another object of the present invention to obtain a sufficient storage capacitance.

It is another object of the present invention to reduce the storage capacitance difference between pixels.

It is another object of the present invention to reduce the effective resistance in a storage region which serves as one of the electrodes of a storage capacitor.

To solve these objects, a silicon layer of an LCD according to the present invention includes a doped source region, a doped drain region, an undoped channel region and an undoped storage capacitor region. The channel region is located between the source and the drain region, and the storage capacitor region is next to the drain region. A gate insulating film is formed on the silicon layer, a gate electrode is formed on the gate insulating film opposite the channel region, and a storage electrode is formed opposite the storage capacitor region. In other words, a storage capacitor includes the storage capacitor region, the storage electrode and the gate insulating film interposed therebetween. Since the storage capacitor region is not doped, the storage capacitor can be used by applying to the storage electrode a voltage which is equal to or larger than the sum of the threshold voltage of the TFT and the maximum value of the display signals voltage.

This LCD is manufactured by forming a silicon layer and a gate insulating film, forming a gate electrode and a storage electrode, and implanting ions into the silicon layer using the gate electrode and the storage electrode as a mask.

To solve the above-mentioned object, in another LCD according to the present invention, a metal pattern for a source electrode and a metal pattern for a storage electrode are formed, and a silicon layer is formed on the two patterns. Regions of the silicon layer which contact the patterns are doped to become a source and a drain regions. A gate insulating film is formed on the silicon layer and the metal pattern for a storage electrode, and a storage electrode is formed on the gate insulating film opposite the metal pattern for a storage electrode. In other words, a storage capacitor includes the metal pattern for a storage electrode, the storage electrode, and the gate insulating film interposed therebetween.

Since a passivation film is formed on the storage electrode, and a pixel electrode is formed on the passivation film opposite the storage electrode, another storage capacitor that includes the pixel electrode, the storage electrode and the passivation film may be formed.

The pixel electrode may contact the drain region of the silicon layer, and the metal pattern for a storage electrode.

In this manufacturing method, the step of forming contact holes to connect a silicon layer to a metal pattern for storage electrode is omitted by forming a metal pattern for storage electrode of the metal for data wire and then forming a silicon layer on the metal pattern for a storage electrode.

To solve the above-mentioned object, in another LCD according to the present invention, a gate electrode and a storage electrode are formed on a gate insulating film which is formed on an insulating substrate, and an interlayer insulating film covers the gate electrode and the storage electrode. A passivation film is formed on the interlayer insulating film. Since a certain amount of the passivation film and the interlayer insulating film over the storage electrode is removed, the thickness of dielectric of the storage capacitor can be thinner, which means that the capacitance can be increased.

A double-layered structure or a multi-layered structure may be adopted to achieve a uniform thickness for the interlayer insulating film. In this case, the most upper layer is made of a material having a similar etch rate to the passivation film and the lower layers are made of materials having a lower etch rate than the most upper layer so that the most upper layer can be removed and the other layers can remain in the step of removing the passivation film over the storage electrode.

To solve the above-mentioned object, a silicon layer of an LCD according to the present invention includes doped regions of source and drain, an undoped channel region, a doped storage capacitor region, and sub-regions. The channel region is located between the source region and the drain region, the storage region is adjoining to the drain region and disconnected from the channel region, and the sub-regions are adjoining to edges of the storage capacitor regions and connected to the drain region. A gate insulating film is formed on the silicon layer, a gate electrode and a storage electrode are formed on the gate insulating film opposite the respective channel region and storage capacitor region. In other words, a storage capacitor includes the storage capacitor region, the storage electrode and the gate insulating film interposed therebetween. The storage capacitor region cannot be used as one electrode of a storage capacitor in the "off" state because it is not doped. However, in the "on" state where a voltage which is equal to or larger than the sum of threshold voltage of the TFT and the maximum value of the image signals is applied to the storage electrode, the storage capacitor region can be used as an electrode of a capacitor. In this structure, the sub-regions decrease the resistance of the charge accumulation layer, because it becomes a portion of charge transmitting paths.

This LCD can be manufactured by forming a silicon layer and a gate insulating film, forming a gate electrode and a storage electrode thereon, and then implanting ions into the silicon layer using the gate electrode and the storage electrode as a mask.

To solve the above-mentioned object, in another LCD of the present invention, a silicon layer is formed on an insulating substrate and a gate insulating film covers the silicon layer including a doped source and drain regions, and an undoped channel region interposed between the source and the drain regions. A gate electrode is formed on the gate insulating film opposite the channel region, and a storage capacitor including a lower storage capacitor electrode made of a metal for gate wire, an insulating film on the storage capacitor electrode and an upper storage capacitor electrode on the insulating film is formed. The upper storage capacitor electrode is connected to a transparent pixel electrode.

It is required to form the upper and the lower storage capacitor electrodes and the insulating film having the same pattern.

Moreover, each of the upper and the lower storage capacitor electrodes and the insulating film interposed therebetween may be double-layered or multi-layered.

In the manufacturing method of the above LCD, the storage capacitor is manufactured by sequentially depositing a metal film for a gate wire, an insulting film for a storage capacitor, and a metal film for a storage capacitor, patterning the three films to form a storage capacitor and a gate wire including a gate electrode, implanting ions into a silicon layer using the gate electrode as a mask to form a source and a drain regions, and then forming a transparent pixel electrode contacting the metal for the storage capacitor.

An interlayer insulating film and a passivation film may be deposited over the storage capacitor. It is desirable to simultaneously remove a portion of the interlayer insulating film and the passivation film to expose the metal film for storage capacitor by forming the interlayer insulating film and the passivation film as materials having the same etch rate. The metal film for storage capacitor works as an etch-stopper in the etching step.

As described above, since the storage capacitor is formed by the lower and the upper storage capacitor electrodes and an insulating film with a thin thickness, it is possible to obtain a sufficient storage capacitance. Since the thickness of the insulating film in the pixels is uniform, it is possible to reduce a storage capacitance difference between the pixels. Moreover, since it is not required to inject ions into the silicon layer to form a storage electrode, the manufacturing process becomes simple.

DETAILED DESCRIPTION OF THE PREFERRED EMBODIMENTS

Figure 1:
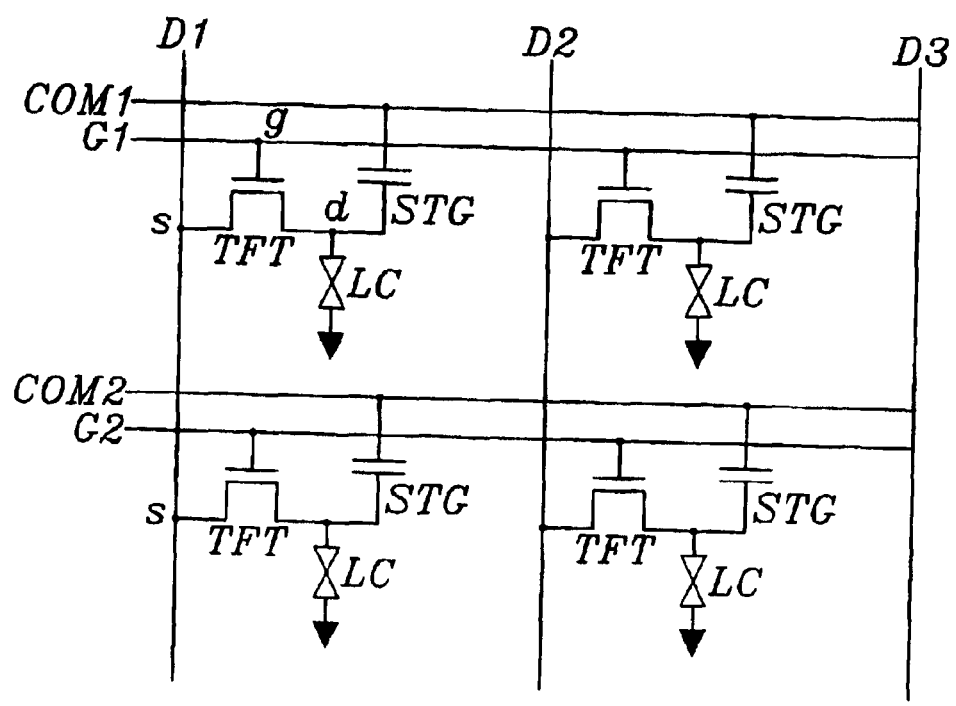
FIG. 1 is an equivalent circuit diagram of a conventional LCD.

The present invention will now be described more fully hereinafter with reference to the accompanying drawings, in which preferred embodiments of the present invention are shown. This invention may, however, be embodied in different forms and should not be construed as limited to the embodiments set forth herein. In the drawings, the thickness of layers and regions are exaggerated for clarity.

A structure and a driving method of an LCD according to the first embodiment will be described hereinafter.

In the first embodiment, a silicon layer located opposite a storage electrode remains undoped and works as an electrode of a storage capacitor.

Figure 2:
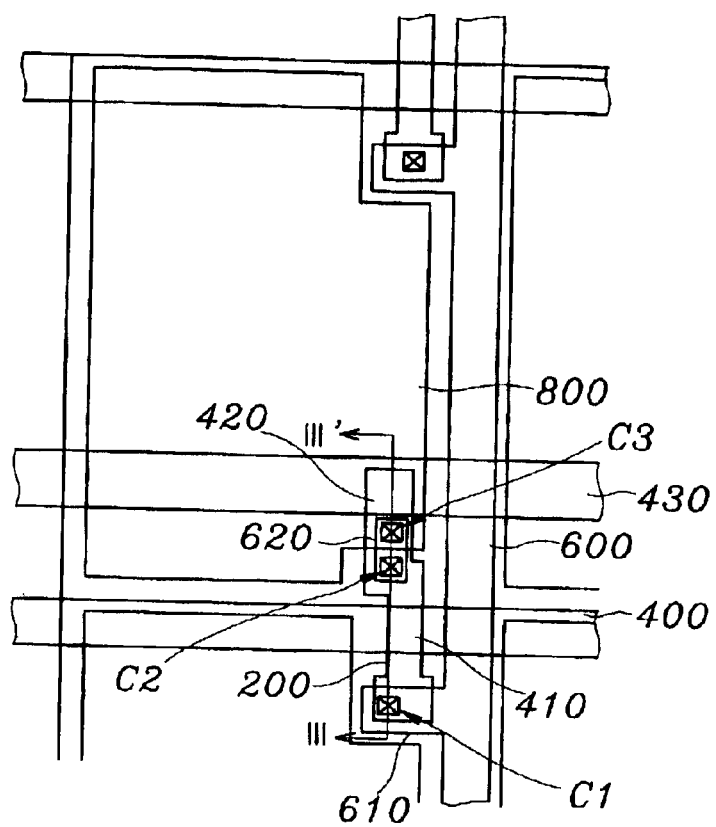
FIG. 2 is a layout view of an LCD according to the first embodiment of the present invention.
Figure 3:
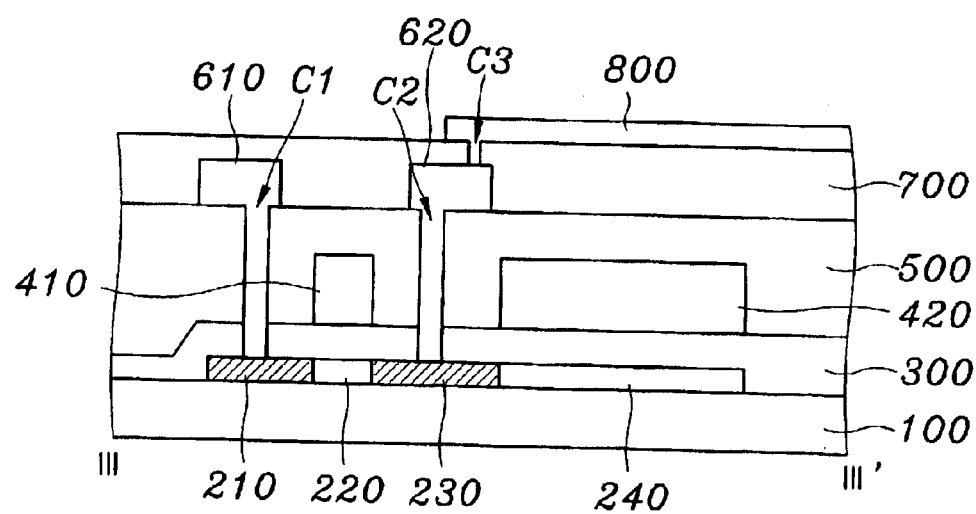
FIG. 3 is a cross sectional view taken along line III–III' in FIG. 2.

FIG. 2 is a layout view of an LCD according to the first embodiment of the present invention, and FIG. 3 is a cross sectional view taken along the line III–III' in FIG. 2.

As shown in FIGS. 2 and 3, a polycrystalline silicon layer 200 is formed on an insulating substrate 100, and a gate insulating film 300 made of $SiO_2$ or $SiN_x$, which is 500 Å-3,000 Å thick, is formed on the substrate 100.

A gate line 400 including one layer or double layers made of Al, Cr or MoW is formed on the gate insulating film 300 and extends in the horizontal direction. The gate line 400 intersects the silicon layer 200 and a portion 410 of the gate line 400 overlapping the silicon layer 200 plays a role of a gate electrode. A storage electrode line 430 made of the same layer as the gate line 400 extends parallel to the gate line 400 and intersects the silicon layer 200. A portion 420 of the storage electrode line 430 overlapping the silicon layer 200 plays a role of a storage electrode.

A region 220 of the silicon layer 200 located opposite the gate electrode 410 is undoped, and a source region 210 and a drain region 230 located outside the undoped region 220 are doped with n type dopant. A region 240 which is adjoining to the drain region 230 and located under the storage electrode 420 is undoped and named "a storage region".

An interlayer insulating film 500 made of $SiO_2$ or $SiN_x$ covers a gate wire including the gate line 400 and the storage electrode line 430, and is 3,000 Å-10,000 Å thick. Contact holes C1 and C2 are made in the gate insulating film 300 and the interlayer insulating film 500 and expose the source and the drain regions 210 and 230.

A data line 600 made of Cr or Mo is formed on the interlayer insulating film 500 and extends in the vertical direction. A source electrode 610 extends from the date line 600 and overlaps the source region 210 of the silicon layer 200, and a drain electrode 620 is formed on the interlayer insulating film 500 opposite side of the source electrode 610 with respect to the gate line 400 and overlaps the drain region 240. The source and the drain electrodes 610 and 620 are respectively connected to the source and the drain regions 210 and 230 through the contact holes C1 and C2.

A passivation film 700 made of $SiO_x$ or $SiN_x$ covers a data wire including the data line 600 and the source and the drain electrodes 610 and 620 and is 3,000 Å~10,000 Å thick. A transparent pixel electrode 800 made of an indium-tin-oxide is formed thereon, and located in the region surrounded by the data lines 600 and the gate lines 400. The pixel electrode 800 is connected to the drain electrode 620 through a via hole C3 made in the passivation film 700 and overlaps the storage electrode line 430. The pixel electrode 800 may be opaque in the case of reflective type LCD.

In the structure of the storage capacitor including the storage region 240, the storage electrode 420, and the gate insulating film 300, a specific driving method is required to obtain the storage capacitor since the storage region 240 is undoped.

Figure 4:
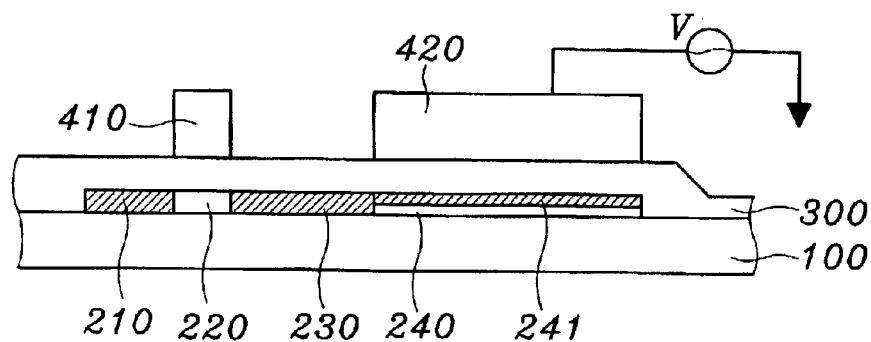
FIG. 4 shows a principle of the formation of a storage capacitor in the LCD according to the first embodiment.

FIG. 4 is a cross sectional view schematically showing the state where a voltage V which is equal to or larger than the sum of the threshold voltage $V_{th}$ of the TFT and the display signal voltage is applied to the storage electrode.

If a gate-on voltage is applied to the gate electrode 410, a channel which transmits electrons is generated between the source region 210 and the drain region 230, and a display signal voltage is applied to the pixel electrode 800 through the channel. To the storage electrode 420, a direct current or an alternate current V is applied.

In the case that the voltage V applied to the storage electrode 420 is equal to or larger than the sum of the threshold voltage $V_{th}$ of the TFT and the maximum value of the display signal voltage, a charge accumulation layer 241 is formed near the surface of the undoped storage region 240. As a result, the accumulation layer 241 becomes conductive even though it has a large resistance, and plays a role of the storage electrode.

As mentioned above, since the undoped silicon region 240 can be used as one of the electrodes of the storage capacitor, one of doping steps can be reduced in an LCD manufacturing process.

Next, a manufacturing method of an LCD according to the first embodiment will be described with reference to FIG. 2, FIGS. 5A to 5J.

FIGS. 5A to 5J are cross sectional views of the intermediate structures of an LCD shown in FIGS. 2 and 3 according to the first embodiment.

Figure 5A:
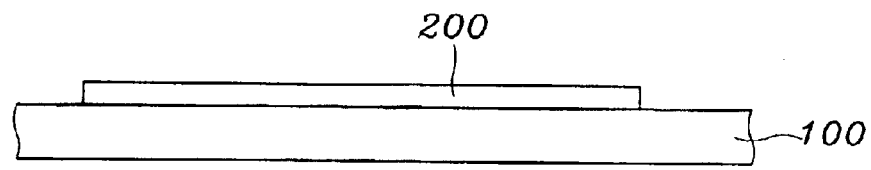
FIGS. 5A to 5J are cross sectional views of the intermediate structures of an LCD shown in FIGS. 2 and 3 according to the first embodiment.

As shown in FIG. 2 and FIG. 5A, a polycrystalline silicon layer 200 is formed on an insulating substrate 100. A thermal process or a laser annealing of the silicon layer 200 may perform to improve the quality of crystallization of the silicon layer 500.

Figure 5B:
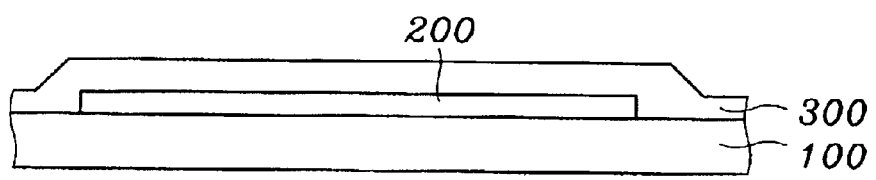

As shown in FIG. 2 and FIG. 5B, $SiO_2$ or $SiN_x$ layer is deposited to 500 Å~3,000 Å thick to form a gate insulating film 300.

Figure 5C:
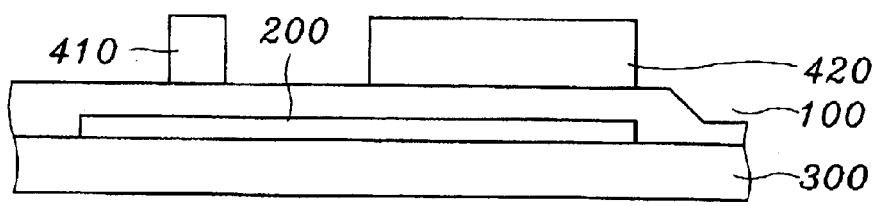

As shown in FIG. 2 and FIG. 5C, a conductive layer for a gate wire is deposited and patterned to form a gate line 410, a gate electrode 420, a storage electrode line 430 and a storage electrode 420. As described above, the gate electrode 410 which is a portion of the gate line 400 and the storage electrode 420 which is a portion of the storage electrode line 430 are located over the silicon layer 200.

Figure 5D:
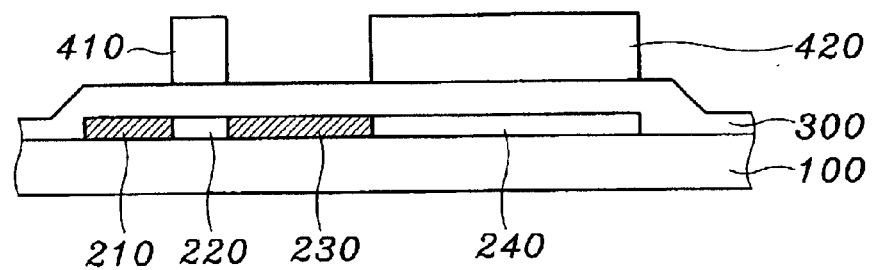

As shown in FIG. 5D, ions are injected into the silicon layer 200 by using the wire 410, 410, 420 and 430 as an implant mask and then diffused to define a source and a drain regions 210 and 230. Undoped regions which are located opposite the gate electrode 410 and the storage electrode 420 are respectively a channel region 220 and a storage region 240. The storage region 240 is adjoining to the drain region 230.

Figure 5E:
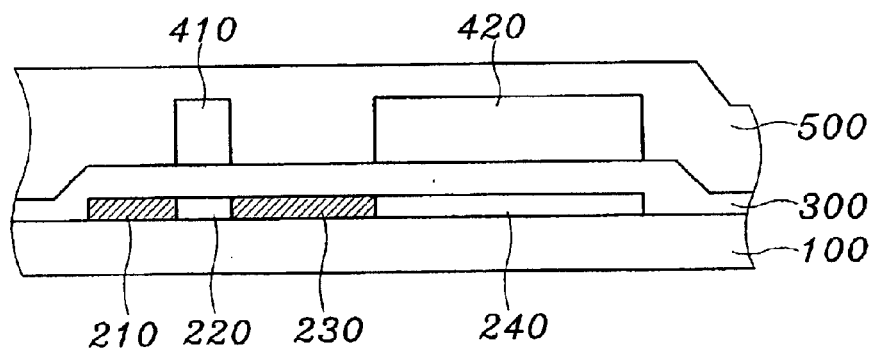

As shown in FIG. 5E, a interlayer insulating film 500 is formed to insulate the gate electrode 410 from a source and a drain electrode which will be formed later on.

Figure 5F:
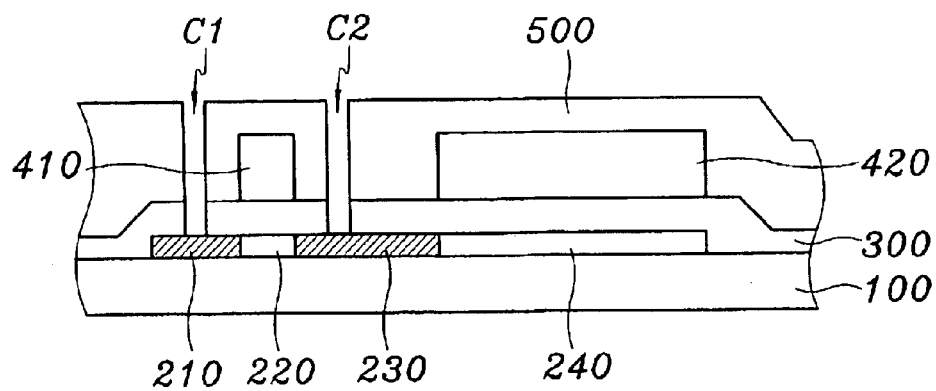

As shown in FIG. 5F, portions of the gate insulating film 300 and the interlayer insulating film 500 over the source and the drain regions 210 and 230 of the silicon layer 200 are removed to form contact holes C1 and C2.

Figure 5G:
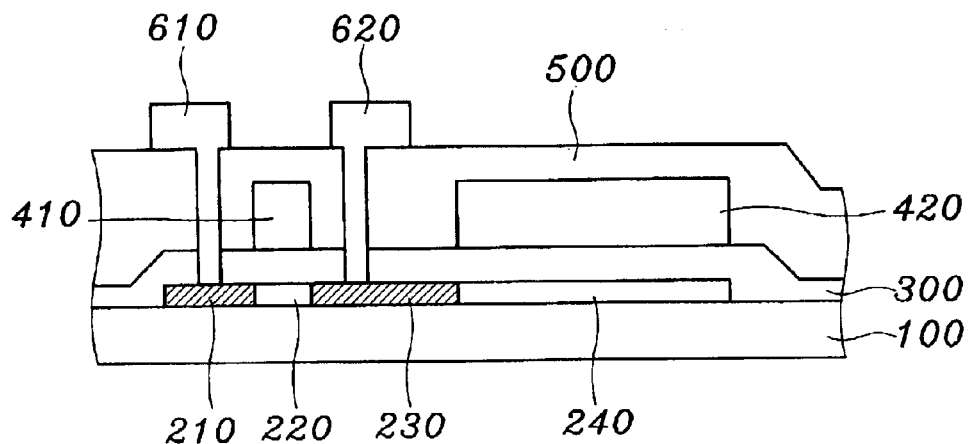

As shown in FIG. 2 and FIG. 5G, a metal layer for a data wire such as Al, Cr, Mo or MoW is deposited and patterned to form a data line 600 and a source and a drain electrodes 610 and 620.

Figure 5H:
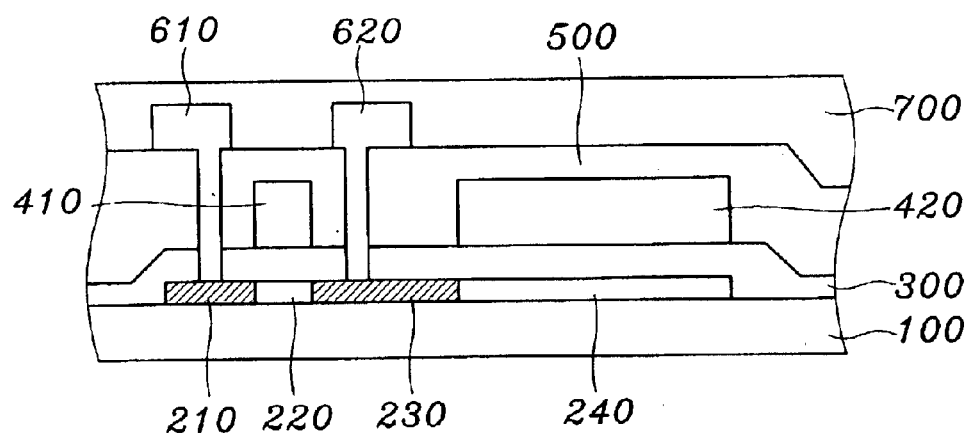
Figure 5I:
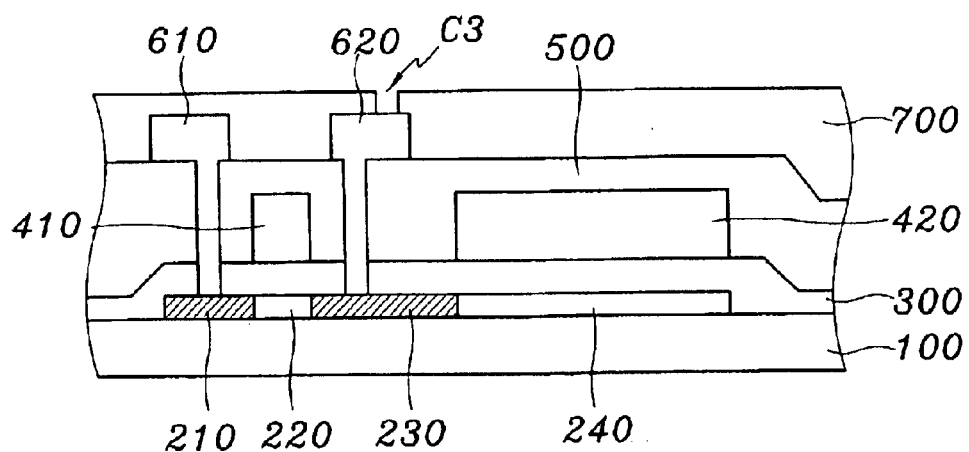

As shown in FIGS. 5H and 5I, a passivation film is deposited and etched to form a via hole C3 over the drain electrode 620.

Figure 5J:
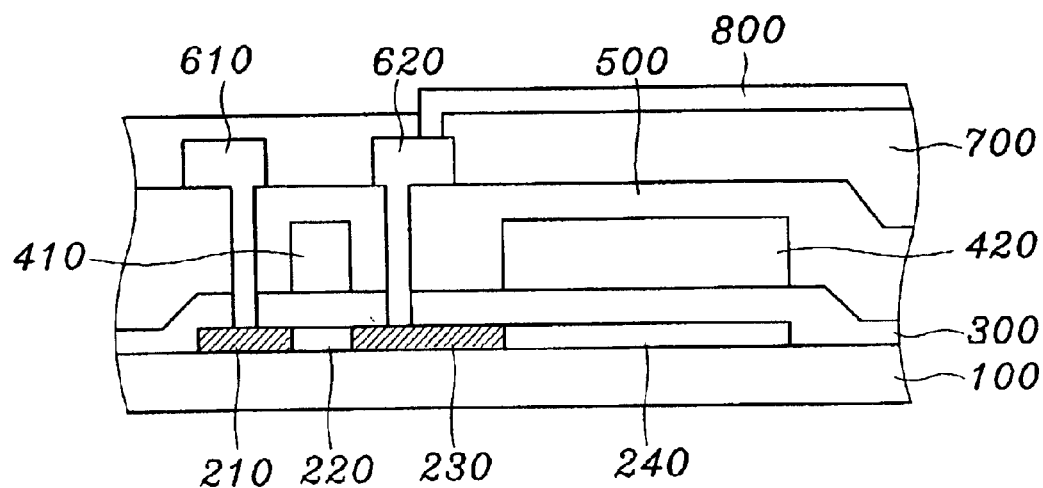

As shown in FIG. 2 and FIG. 5J, a transparent conductive layer made of a material such as an indium-tin-oxide is deposited and patterned to form a pixel electrode 800 overlapping the storage electrode 420. The pixel electrode 800 is connected to the drain electrode through the via hole C3.

As described above, since the storage region 240 can be used as one electrode of a storage capacitor if voltages for the storage electrode 420 are effectively controlled, the storage region 240 is not required to be doped.

Next, an LCD according to the second embodiment of the present invention will be described. In the second embodiment, instead of a portion of a silicon layer, an additional metal pattern is used as one storage electrode of a storage capacitor, and a metal pattern for a data wire and the metal pattern are formed in the lowest layer.

Figure 6:
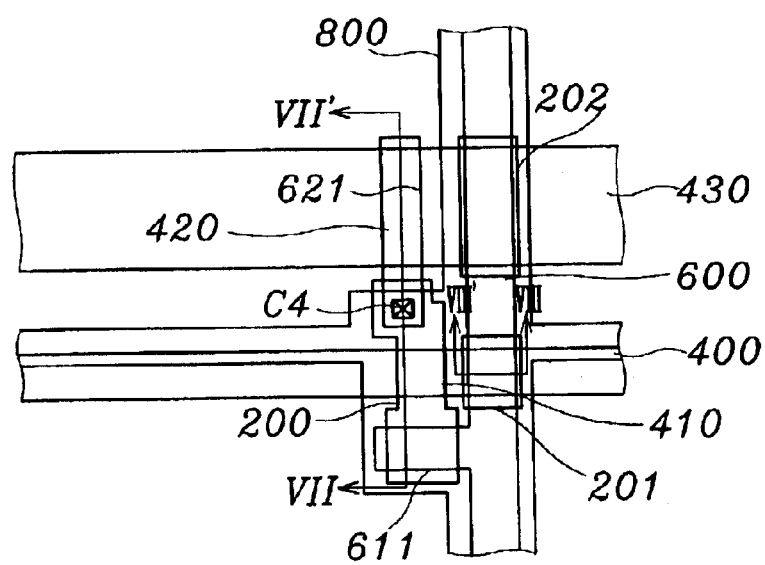
FIG. 6 is a layout view of an LCD according to the second embodiment of the present invention.
Figure 7:
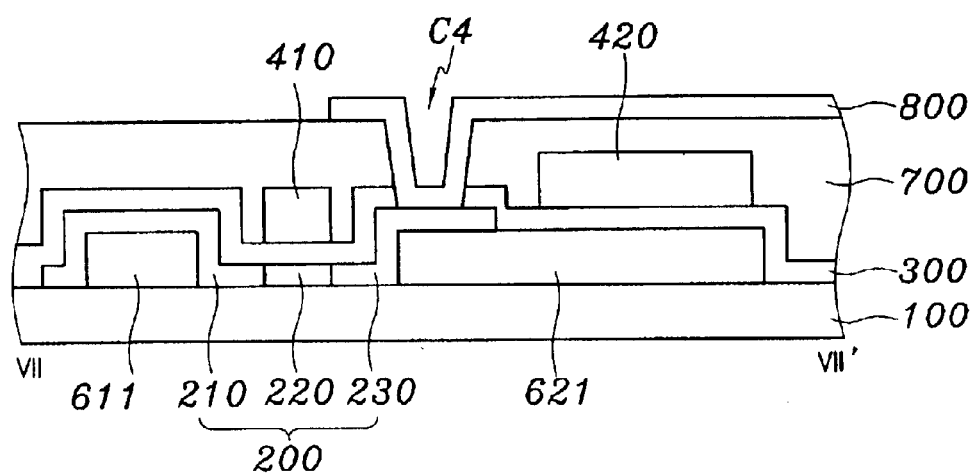
FIG. 7 is a cross sectional view taken along the line VII–VII' in FIG. 6.
Figure 8:
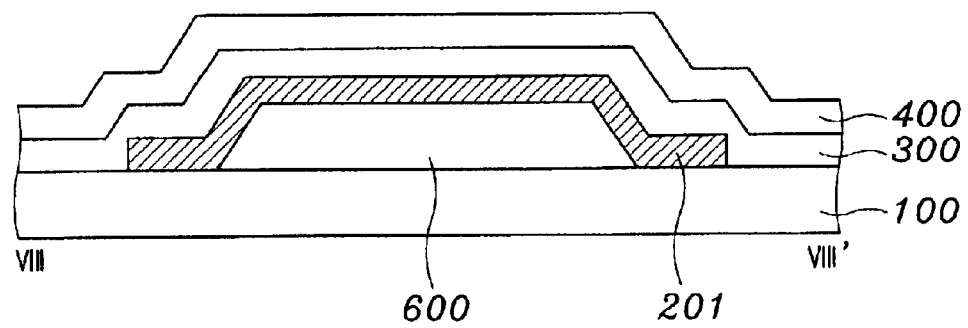
FIG. 8 is a cross sectional view taken along the line VIII–VIII' in FIG. 8.

FIG. 6 is a layout view of an LCD according to the second embodiment of the present invention, FIG. 7 is a cross sectional view taken along the line VII–VII' in FIG. 6, and FIG. 8 is a cross sectional view taken along the line VIII–VIII' in FIG. 6.

As shown in FIGS. 6 to 8, a data line 600 is formed on an insulating substrate 100 and extends in the vertical direction, and a source electrode 611 extends from the data line 600. A storage electrode metal pattern 621 made of the same layer as the data line 600 is formed on the insulating substrate 100 and extends parallel to the data line 600. A silicon layer 200 extends from the source electrode 611 to the metal pattern for storage electrode 621 and contacts the source electrode 611 and the storage electrode metal pattern 621. A gate insulating film 300 made of $SiO_x$ or $SiN_x$ is formed thereon and is 500 Å~3,000 Å thick.

A gate line 400 is formed on the gate insulating film 300 and overlaps the silicon layer 220 between the source electrode 611 and the storage electrode metal pattern 621. The overlapping portion 410 of the gate line 400 plays a role of a gate electrode. A region 220 of the silicon layer 200 opposite the gate electrode 410 is undoped and becomes a channel region. Two doped regions 210 and 230 of the silicon layer 200 are located opposite each other with respect to the channel region 220. One region 210 located over the source electrode 611 is a source region and the other region 230 located over the drain electrode 621 is a drain region.

A storage electrode line 430 made of the same layer as the gate line 400 is formed on the gate insulating film 300 and extends parallel to the gate line 400. A storage electrode 420, a portion of the storage electrode line 430, overlaps the storage electrode metal pattern 621 to form a storage capacitor.

A passivation film 700 made of $SiO_2$ or $SiN_x$ is formed on the gate insulating film 300, the gate electrode 410 and the storage electrode metal pattern 420, and is 3,000 Å~10,000 Å thick. A pixel electrode 800 made of an indium-tin-oxide is formed on the passivation film 700 and located inside a pixel region surrounded by the gate line 400 and the data line 600. The pixel electrode 800 contacts the drain region 230 through a contact hole C4 made in the passivation film 700 and the gate insulating film 300.

As described, since the source region 210 and the drain region 230 directly contact the source electrode 611 and the pixel electrode 800 respectively, an additional interlayer insulating film and contact holes for connecting the source and the drain electrodes to the source and the drain regions are not required.

As shown in FIG. 8, in the case that only the gate insulating film 300 is interposed between the data line 600 and the gate line 400, short-circuit defects between the two lines 600 and 400 may occur. Therefore, it is advisable to provide a silicon pattern 201 at an intersection of the lines 600 and 400 to reduce a short-circuit.

Figure 9:
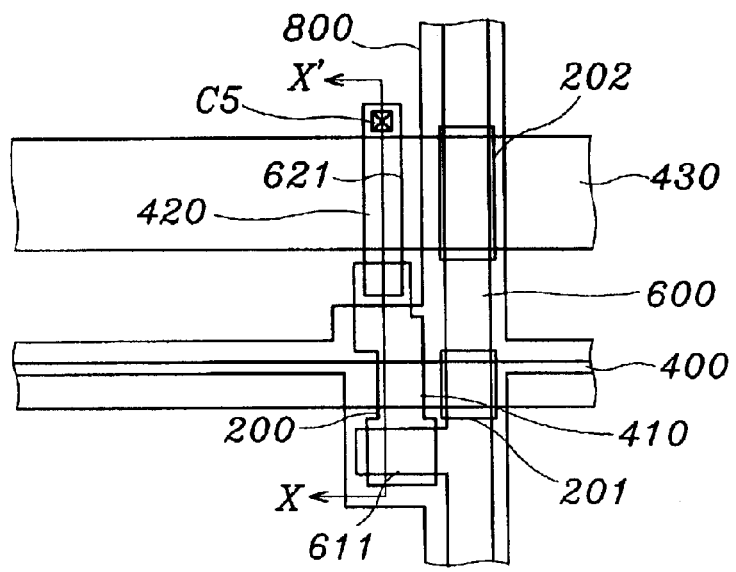
FIG. 9 is a layout view of an LCD according to the third embodiment of the present invention.
Figure 10:
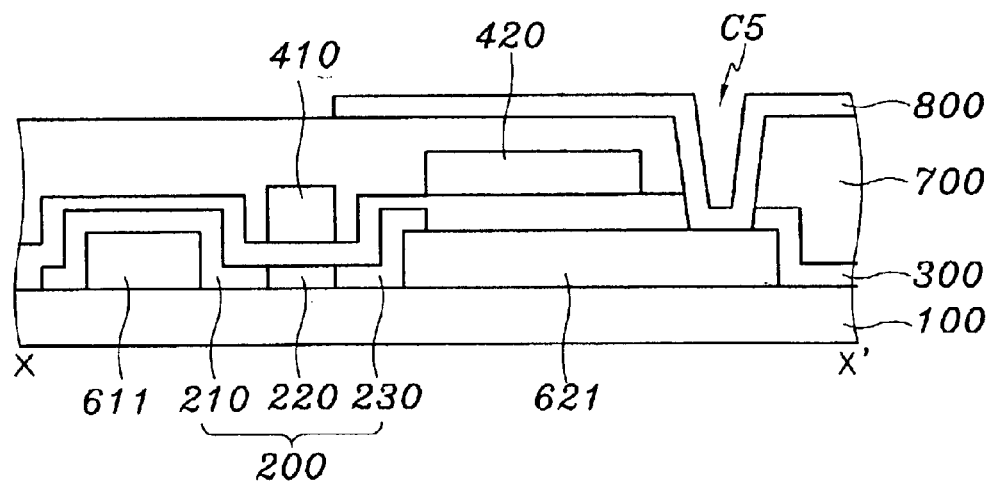
FIG. 10 is a cross sectional view taken along the line X–X' in FIG. 9.

FIGS. 9 and 10 are a layout view and a cross sectional view of an LCD according to the third embodiment of the present invention respectively. The LCD according to the third embodiment has the substantially same structure as that according to the second embodiment except the point that a pixel electrode directly contacts not a silicon layer but a storage electrode metal pattern.

That is, the LCD according to the third embodiment has the similar structure in TFT and storage electrode to that according to the second embodiment. However, the pixel electrode 800 does not contact the drain region 230, but to the storage electrode metal pattern 621 through a contact hole C5 made in the passivation film 700 and the gate insulating film 300.

In the second and the third embodiments, one storage capacitor including the metal pattern 621, the gate insulating film 300 and the storage electrode 420, and the other storage capacitor including the storage electrode 420, the passivation film 700 and the pixel electrode 800 are provided. Since the thickness of the dielectrics 300 and 700 of the storage capacitors are thinner than that of the conventional structure, it is possible to obtain a sufficient storage capacitance.

Next, a manufacturing method of an LCD according to the second and the third embodiment will be described with reference to FIG. 6 and FIGS. 11A to 11H hereinafter.

FIGS. 11A to 11H are cross sectional views of the intermediate structures of an LCD according to the second embodiment.

Figure 11A:
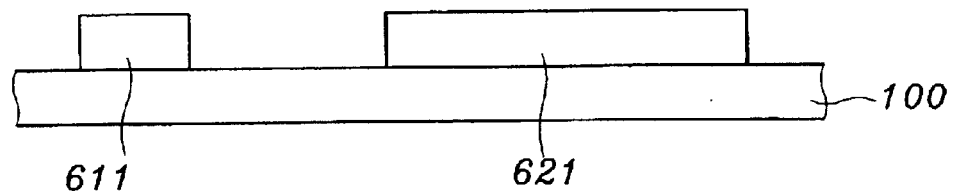
FIGS. 11A to 11H are cross sectional views of the intermediate structures of an LCD shown in FIGS. 6 and 7 according to the second embodiment.

As shown in FIGS. 6 and 11A, a metal layer for a data wire is deposited on an insulating substrate 100 and patterned to form a data line 600, a source electrode 611 and a storage electrode metal pattern 621.

Figure 11B:
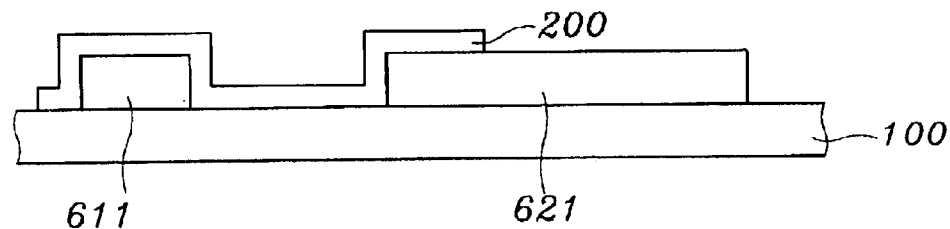
Figure 11C:
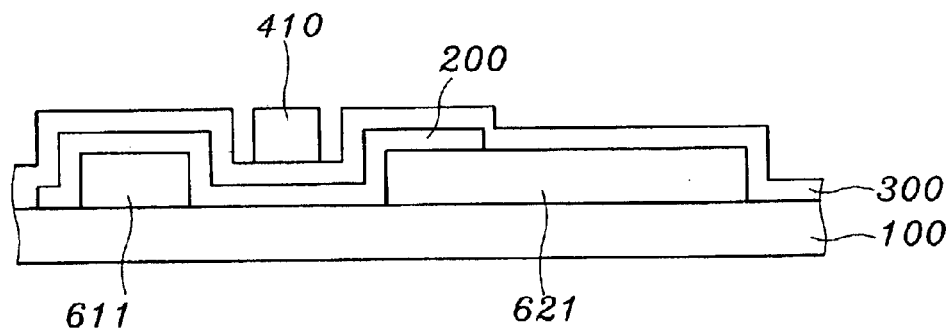

As shown in FIGS. 6 and 11B, a silicon layer is deposited thereon and patterned to form a silicon layer 200 which contacts the source electrode 611, the storage electrode metal pattern 621 and a portion of the substrate 100 between the source electrode 611 and the storage electrode metal pattern 621. A thermal process or a laser annealing may be performed to improve the crystallization characteristics of the silicon layer 200. Moreover, silicon patterns 201 and 202 may remain at the intersections of the wires to prevent a short-circuit defect between the data line 600 and the gate line 400 or the storage electrode line 420.

Figure 11D:
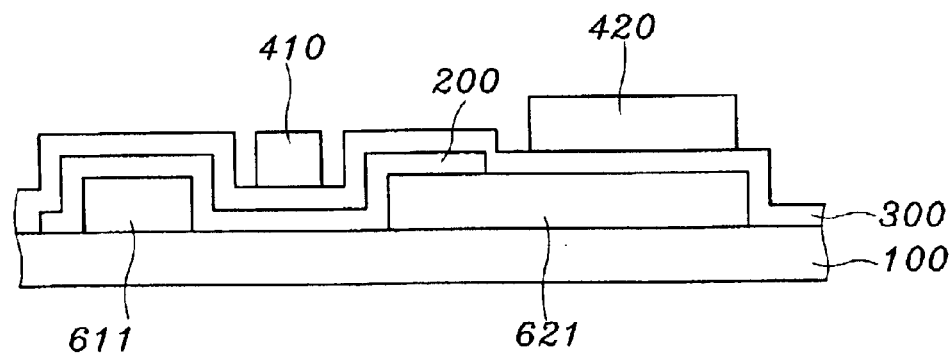

As shown in FIGS. 6 and 11D, a gate insulating film 200 made of $SiO_2$ or $SiN_x$ is formed, and a metal layer for a gate wire is deposited and patterned to form a gate line 400, a gate electrode 410 and a storage electrode.

Figure 11E:
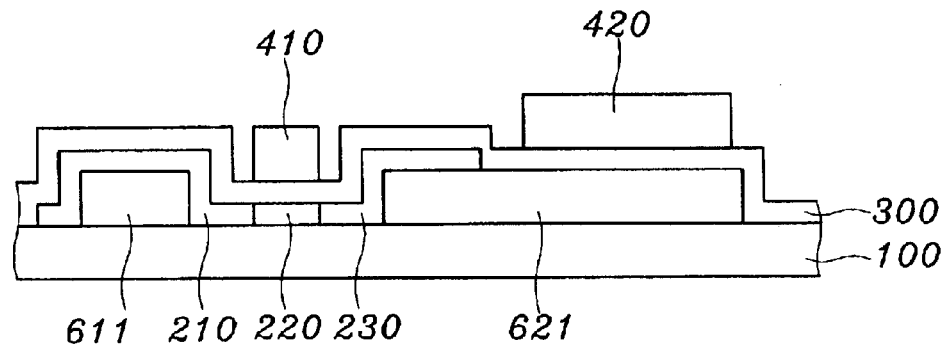

As shown in FIG. 11E, ions are injected into the silicon layer 200 by using the gate electrode 410 as an implant mask to form a source and a drain regions 210 and 230. A thermal process or a laser annealing may be performed to diffuse the injected ions.

Figure 11F:
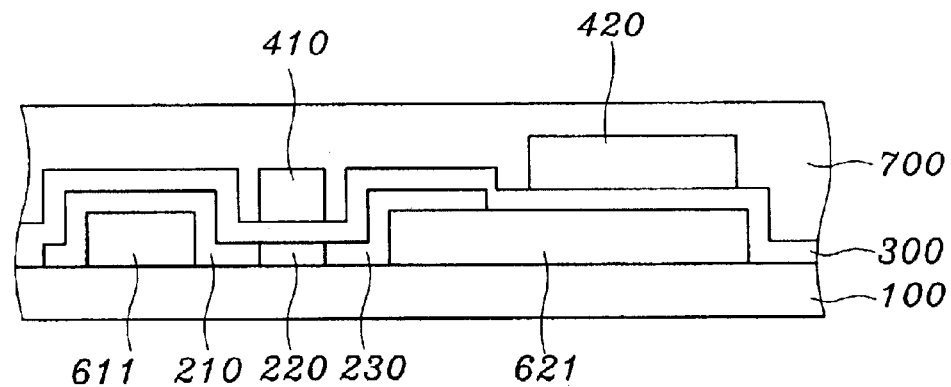
Figure 11G:
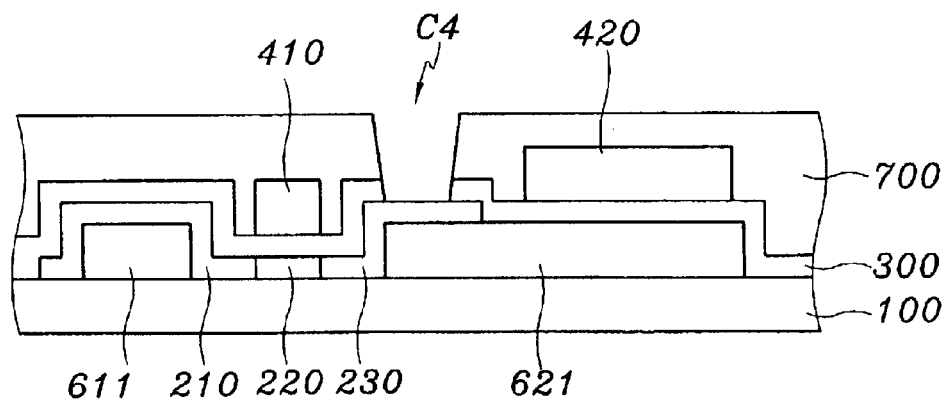

As shown in FIGS. 11F and 11G, a passivation film 700 is deposited and portions of the passivation film 700 and the gate insulating film 300 over the storage electrode metal pattern 621 and the drain region 230 are respectively removed to form contact holes C4 and C5.

Figure 11H:
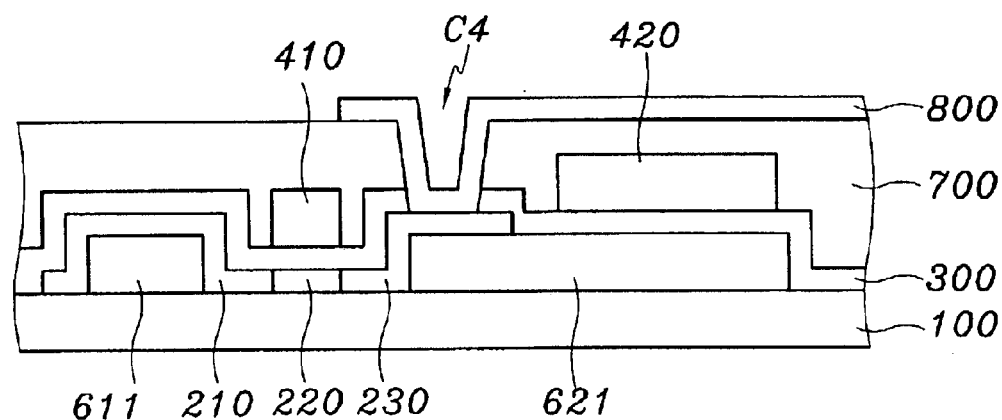

Next, as shown in FIGS. 6 and 11H, an indium-tin-oxide layer is deposited and patterned to form a pixel electrode 800. The pixel electrode is directly connected to the drain region 230 through the contact hole C4.

Meanwhile, the pixel electrode 800 may be directly connected to the storage electrode metal pattern 621 through the contact hole C5.

As mentioned above, since the silicon layer is formed right on the data wire, the conventional etching step for forming contact holes is not required. Moreover, the steps of depositing an interlayer insulating film and doping step for forming a storage electrode are removed.

Next, an LCD according to the fourth to the sixth embodiments of the present invention will be described. In these embodiments, a storage electrode and a pixel electrode are used for a storage capacitor, and a dielectric interposed between the storage electrode and the pixel electrode has a relatively thin thickness.

Figure 12:
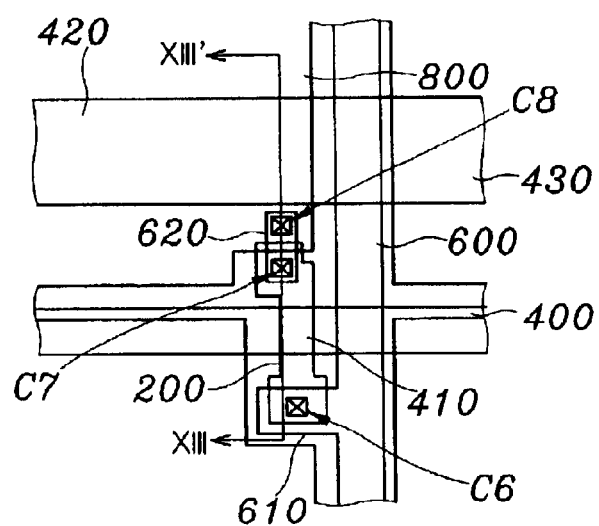
FIG. 12 is a layout view of LCDs according to the fourth to the sixth embodiments of the present invention.
Figure 13:
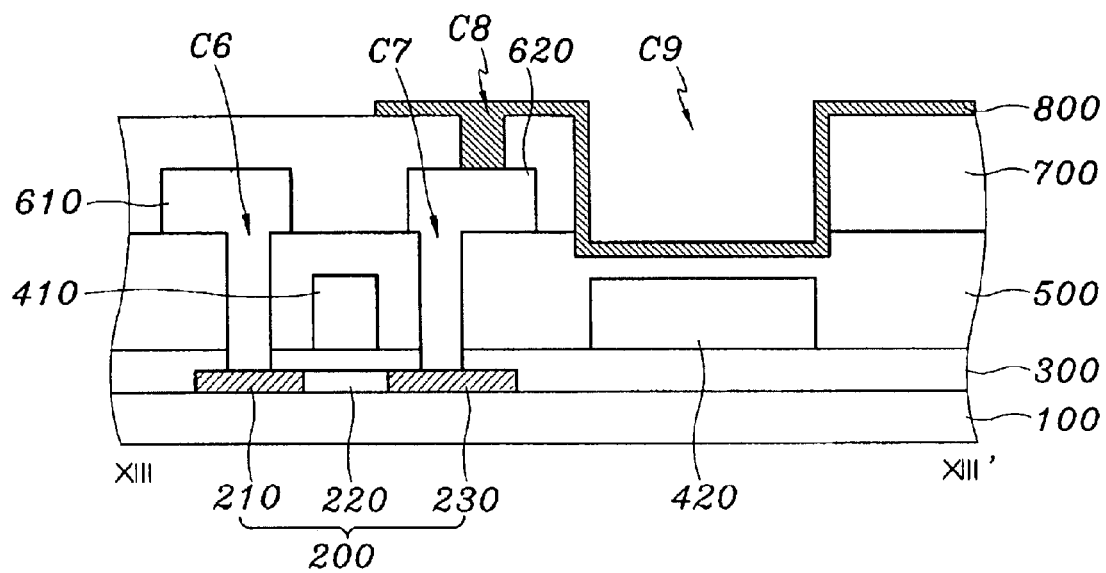
FIGS. 13 to 15 are cross sectional views taken along the line XII–XII' in FIG. 12 according to the fourth to the sixth embodiments, respectively.
Figure 14:
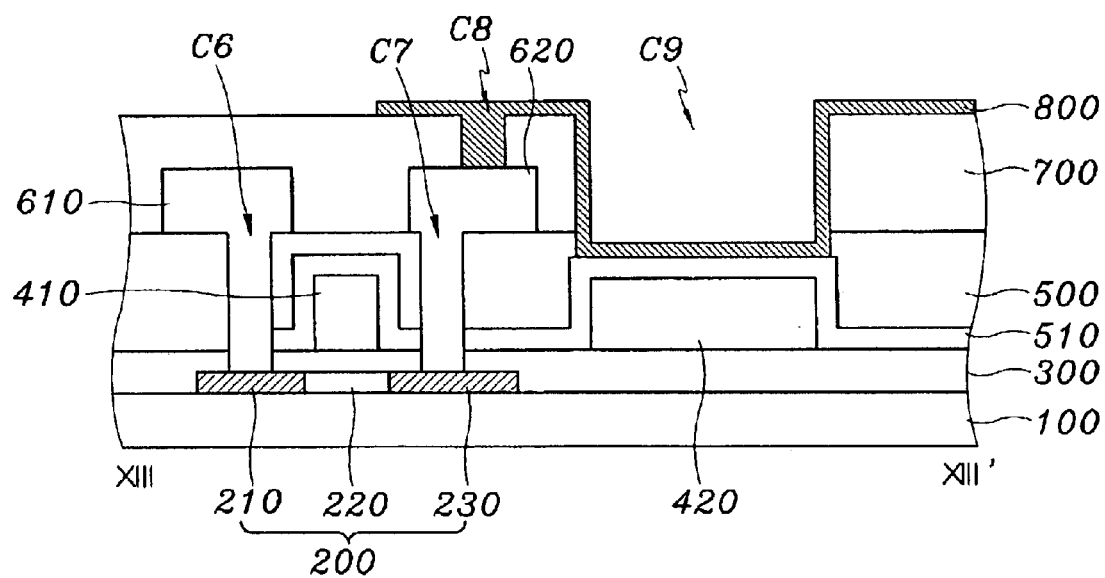
Figure 15:
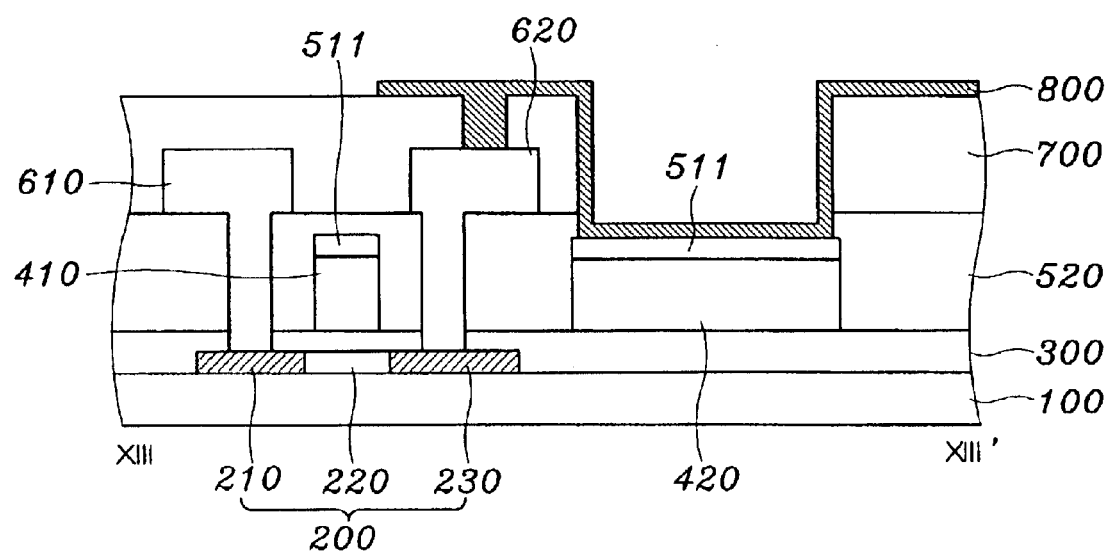

FIG. 12 is a layout view showing a TFT and a storage capacitor according to the fourth to the sixth embodiments, and FIGS. 13 to 15 are cross sectional views taken along the line XIII–XIII' in FIG. 12 according to the fourth to the sixth embodiments, respectively.

As shown in FIGS. 12 and 13, a polycrystalline silicon layer 200 partially doped is formed on an insulating film 100, and a gate insulating film 300 made of $SiO_2$ or $SiN_x$ is formed thereon. A gate line 400 is formed on the gate insulating film 300 and extends in the horizontal direction, and a portion 410 of the gate line 400 plays a role of a gate electrode. A channel region 220, a portion of the silicon layer 200 located opposite the gate electrode 410, is undoped, and a source and a drain regions 210 and 230 located outside the channel region 220 are doped.

A storage electrode line 430 is formed on the gate insulating film 300 and extends parallel to the gate line 400, and a portion 420 of the storage electrode line 430 plays a role of a storage electrode.

An interlayer insulating film 500 made of $SiO_2$ or $SiN_x$ is formed on the gate insulating film 300, the gate electrode 410, the gate line 400, the storage electrode 420 and the storage electrode line 430, and is 3,000 Å~10,000 Å thick. Contact holes C6 and C7 exposing the source and the drain regions 210 and 230 are formed in the gate insulting film 300 and the interlayer insulating film 500. A data line 600 and a source and a drain electrodes 610 and 620 are formed on the interlayer insulating film 500, and the source and the drain electrodes 610 and 620 are respectively connected to the source and the drain regions 210 and 230 through the contact holes C6 and C7.

A passivation film 700 is formed on the interlayer insulating film 500 and the source and the drain electrodes 610 and 620. A contact hole C8 exposing the drain electrode 620 is formed in the passivation film 700, and a portion of the passivation film 700 and an upper portion of the interlayer insulating film 500 over the storage electrode 420 are removed to form a hole C9.

An indium-tin-oxide pixel electrode 800 is formed on the passivation film 700 and connected to the drain electrode through the contact hole C8.

As described above, the storage capacitor includes the pixel electrode 800, the storage electrode 420, and the interlayer insulating film 500 interposed between the two electrodes 420 and 800. Since the portion of the passivation film 700 over the overlapping portion of the electrodes 420 and 800 is removed and the thin thickness of the interlayer insulating film 500 at the portion increases the storage capacitance.

However, it is hard to maintain the thickness uniformity of the partially removed portion of the interlayer insulating film 500.

FIGS. 14 and 15 show the structure according to the fifth and the sixth embodiments where the thickness of the interlayer insulating film 500 over the storage electrode is uniform.

As shown in FIGS. 14 and 15, the fifth embodiment has the same structure as the fourth embodiment except that the interlayer insulating film is double-layered. The interlayer insulating film includes the first film 510 as a lower layer having a 500 Å~3,000 Å thickness and the second film 520 as an upper layer having a 3,000 Å~10,000 Å thickness. A portion of the second film 520 over the storage electrode 420 is removed.

As shown in FIG. 15, the sixth embodiment has the same double-layered interlayer insulating film 511 and 520 as the fifth embodiment, but the first film 511 is formed only over a gate wire including the gate electrode 410 and the storage electrode 420. The portion of the second film 520 over the storage electrode 420 is removed as in the fifth embodiment.

Like the fourth embodiment, in the structures of the fifth and the sixth embodiments, it is possible to increase the storage capacitance by reducing the thickness of the dielectric of the storage capacitor. In addition, it is possible to obtain a uniform thickness of the dielectric layer.

Manufacturing methods of LCDs according to the fourth to the sixth embodiments are described.

In the methods, since a doped silicon pattern is not used as an electrode of the storage capacitor, an ion doping step of the silicon pattern for forming the storage capacitor is omitted, and an additional photolithography step for etching the interlayer insulating film is not required.

FIGS. 16A to 16H are cross sectional views of the intermediate structures of the LCD according to the fourth embodiment.

Figure 16A:
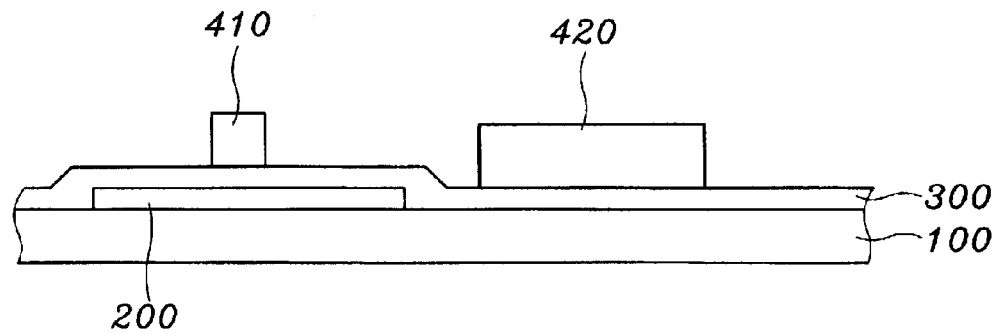
FIGS. 16A to 16H are cross sectional views of the intermediate structures of an LCD shown in FIG. 13 according to the fourth embodiment.

As shown in FIGS. 12 and 16A, a silicon layer 200 is formed on an insulating substrate 100. As in the previously described embodiments, a thermal process or a laser annealing may be performed to improve the crystallization characteristics of the silicon layer 200. A gate insulating film 300 is formed thereon, and is 500 Å~3,000 Å thick. A metal for a gate wire is deposited and patterned to form a gate line 400, a gate electrode 410 and a storage electrode 420.

Figure 16B:
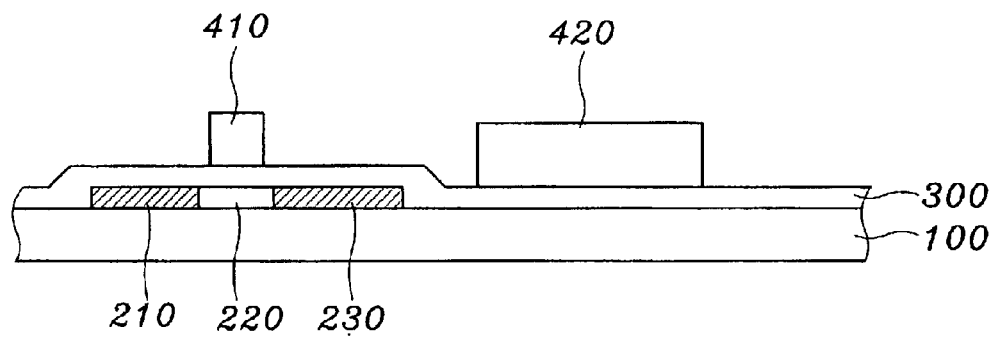

As shown in FIG. 16B, an ion doping is performed to the silicon layer 200 by using the gate electrode 410 as an implant mask to form a source region 210 and a drain region 230.

Figure 16C:
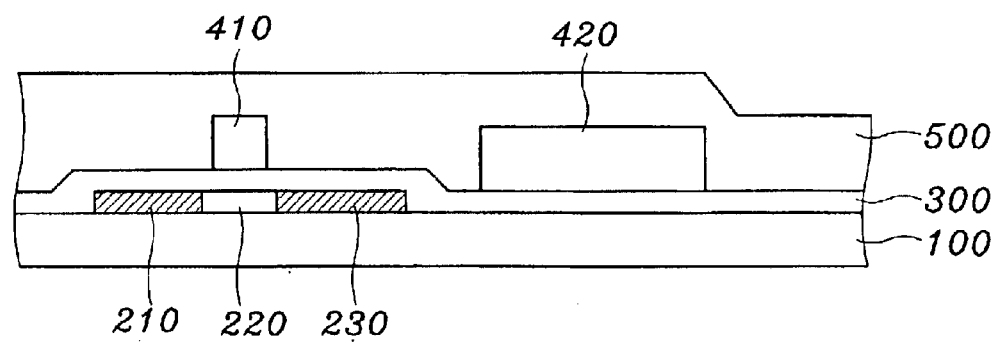
Figure 16D:
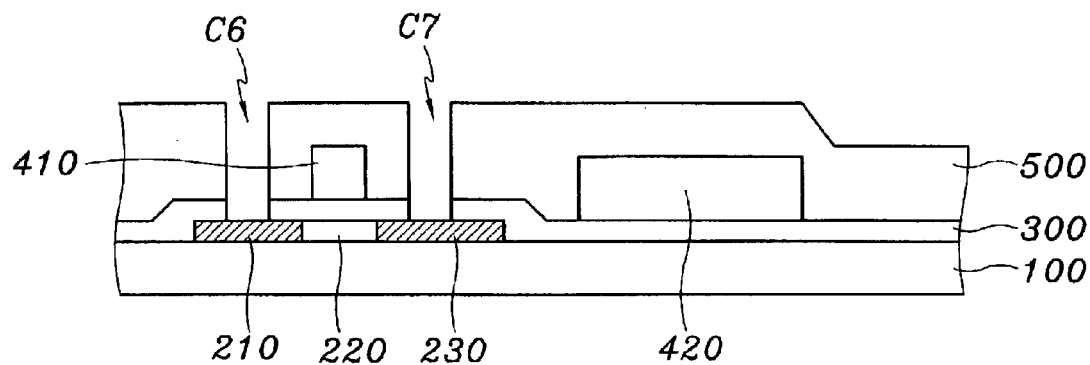

As shown in FIGS. 16C and 16D, an interlayer insulating film 500 is deposited and then the gate insulting film 300 and the interlayer insulating film 500 over the source and the drain regions 210 and 230 are removed to form contact holes C6 and C7.

Figure 16E:
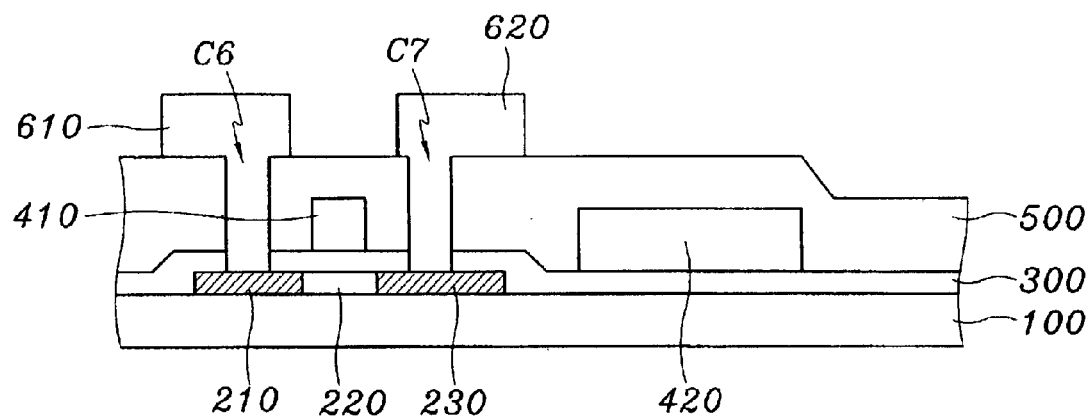

As shown in FIGS. 12 and 16E, a metal layer for a data wire is deposited and patterned to form a data line 600, a source electrode 610 and a drain electrode 620. The source and the drain electrodes 610 and 620 are respectively connected to the source and the drain regions 210 and 230 through the contact holes C6 and C7.

Figure 16F:
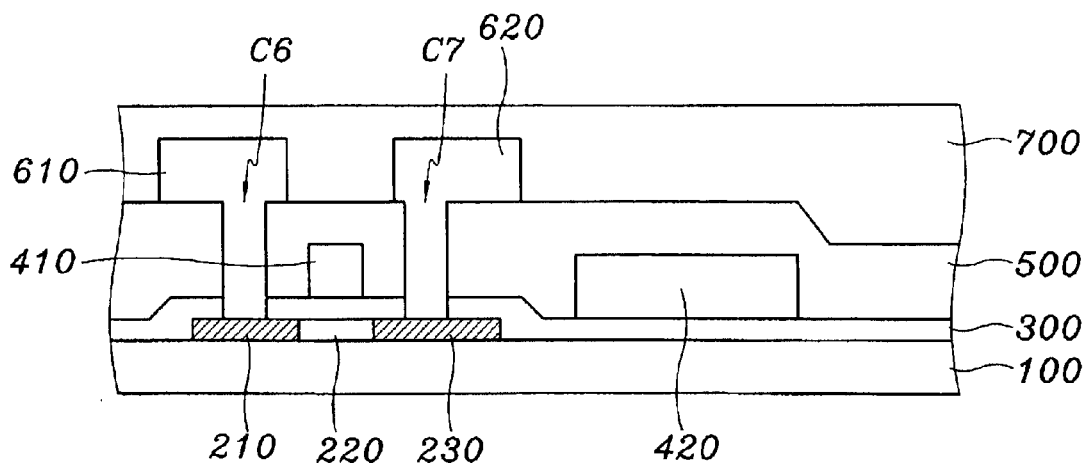

As shown in FIG. 16F, a passivation film 700 is deposited. The passivation film 700 is made of the material having the same etch rate as the interlayer insulting film 500.

Figure 16G:
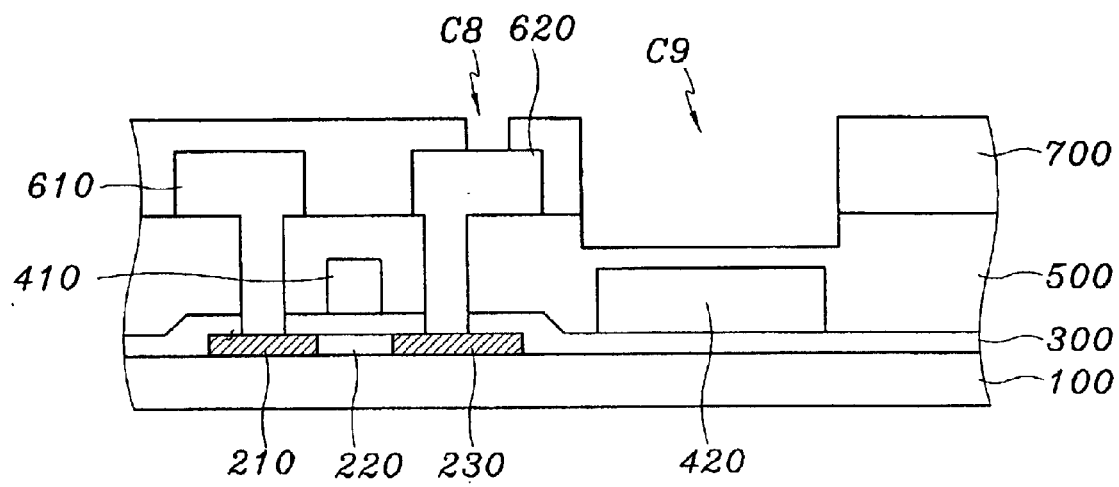

Next, as shown in FIG. 16G, the passivation film 700 is etched to form contact holes C8 and C9 respectively exposing the drain electrode 620 and the interlayer insulating film 500 over the storage electrode 420. In this process, the thickness of the exposed interlayer insulating film 511 becomes decreased. Therefore, it is required to control the etching time to keep the thickness of the interlayer insulating film as 500 Å~3,000 Å.

Figure 16H:
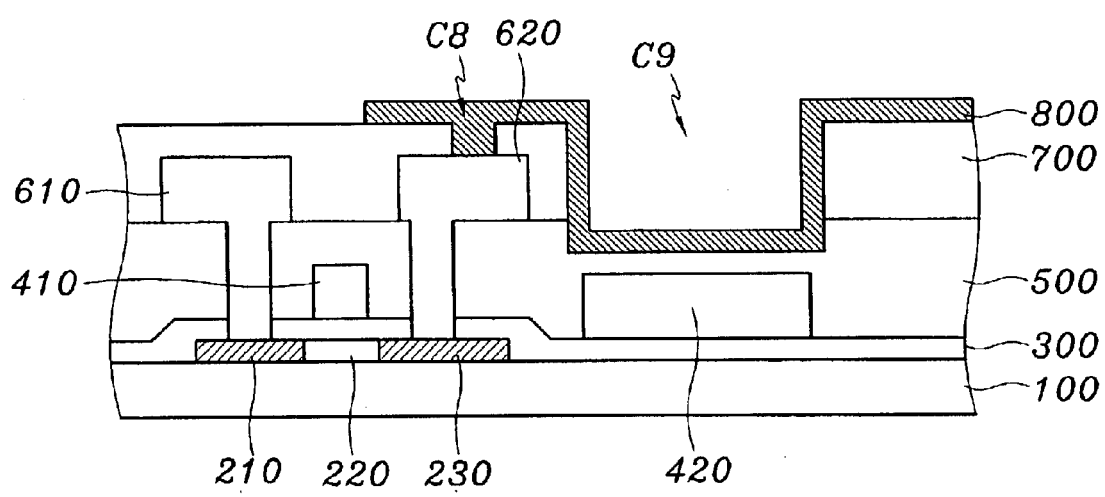

As shown in FIGS. 12 and 16H, an indium-tin-oxide layer is deposited and patterned to form a pixel electrode 800. The pixel electrode 800 is connected to the drain electrode 620 through the contact hole C8 and overlaps the storage electrode 420.

As mentioned above, in the step of removing the passivation film 700 over the drain electrode 620, the thickness of the interlayer insulating film 511 over the storage electrode 420 is controlled to have a relatively thin thickness by partially removing the interlayer insulating film. However, it is hard to control the thickness to be uniform.

FIGS. 17A to 17F are cross sectional views of the intermediate structures of an LCD according to the fifth embodiment. In the fifth embodiment, an interlayer insulating film is double-layered and the etch rates of the layers are different from each other.

A source and a drain regions 210 and 230, a gate insulating film 300, a gate line 400, a gate electrode 410 and a storage electrode 420 are formed by the same steps as shown in FIGS. 16A and 16B.

Figure 17A:
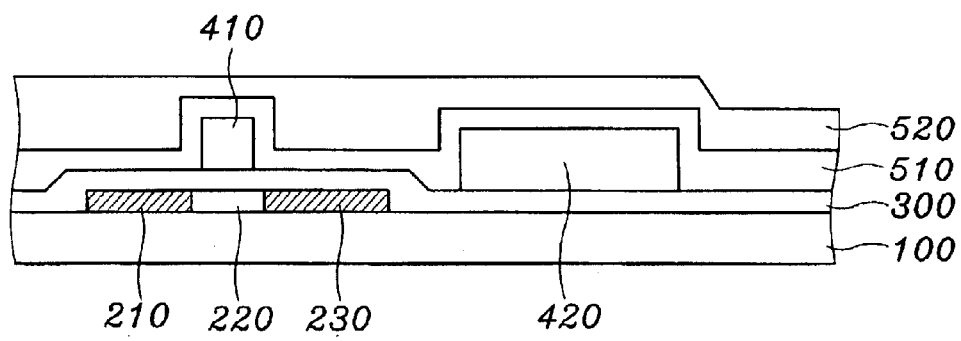
FIGS. 17A to 17F are cross sectional views of the intermediate structures of an LCD shown in FIG. 14 according to the fifth embodiment.

Then, as shown in FIG. 17A, a first film 510 and the second film 520 are sequentially deposited to 500 Å~3,000 Å and 3,000 Å~10,000 Å thickness. The etching selectivity of the first and the second films 510 and 520 is preferably sufficiently large, and the first film 510 is made of a material having much smaller etch rate than a material for the second film 520.

Figure 17B:
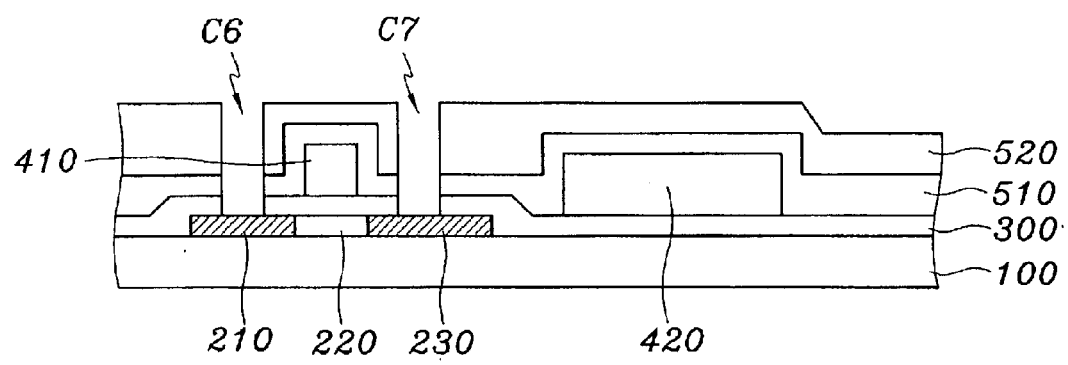

As shown in FIG. 17B, the portions of the gate insulating film 300, and the first and the second films 510 and 520 over the source and the drain regions 210 and 230 are simultaneously etched and removed to form contact holes C6 and C7.

Figure 17C:
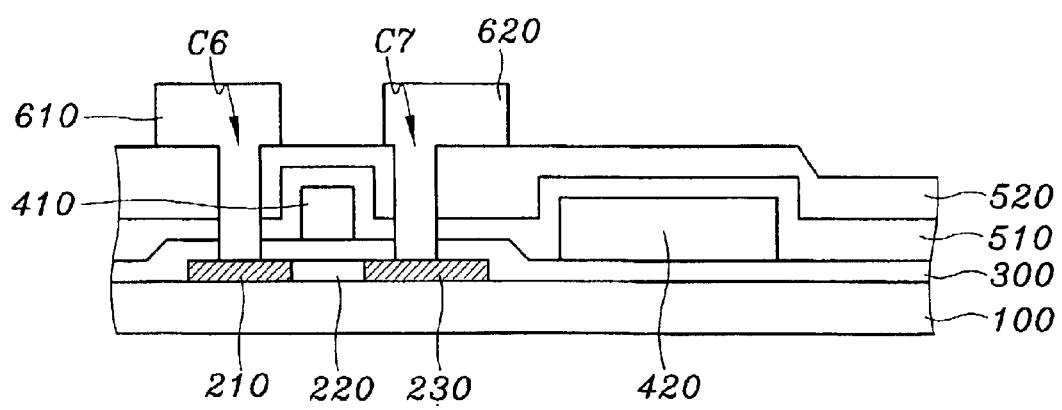

As shown in FIGS. 12 and 17C, a metal layer for a data wire is deposited and patterned to form a data line 600, and a source and a drain electrodes 610 and 620. The source and the drain electrodes 610 and 620 are respectively connected to the source and the drain regions 210 and 230 through the contact holes C6 and C7.

Figure 17D:
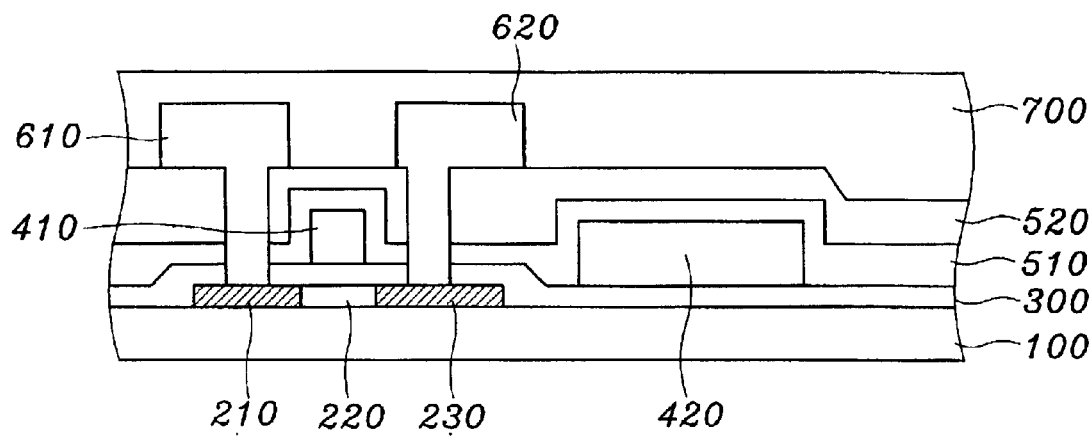
Figure 17E:
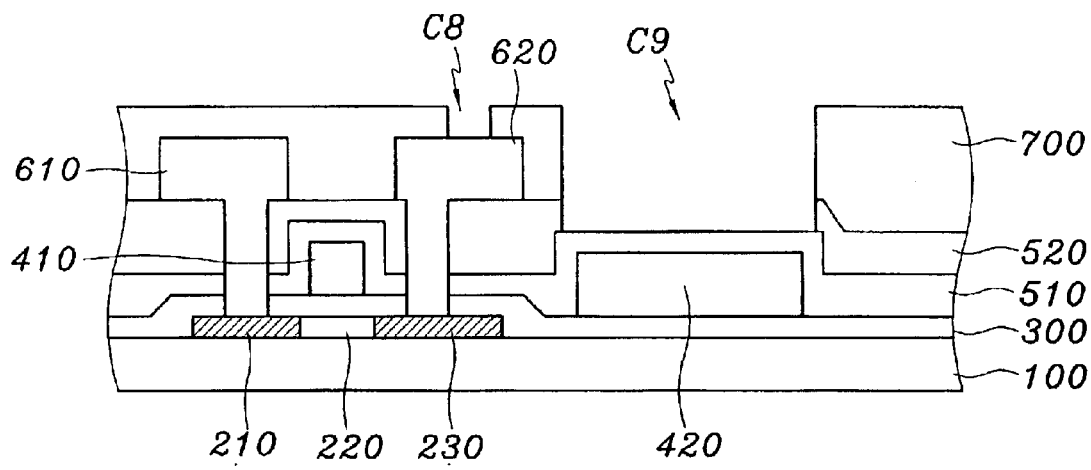

As shown in FIGS. 17D and 17E, a material layer having the same etch rate as the second film 520 is deposited to form a passivation film 700, and the passivation film 700 is patterned to form a contact hole C8 exposing the drain electrode 620 and a via hole C9 exposing the second film 520. Thereafter, the exposed portion of the second film 520 is removed to form a via hole C9. As described above, since the etch rate of the first film 510 is much smaller than the etch rate of the second film 520, and the second film and the passivation film 700 has the substantially same etch rate, only the second film 520 is removed.

Figure 17F:
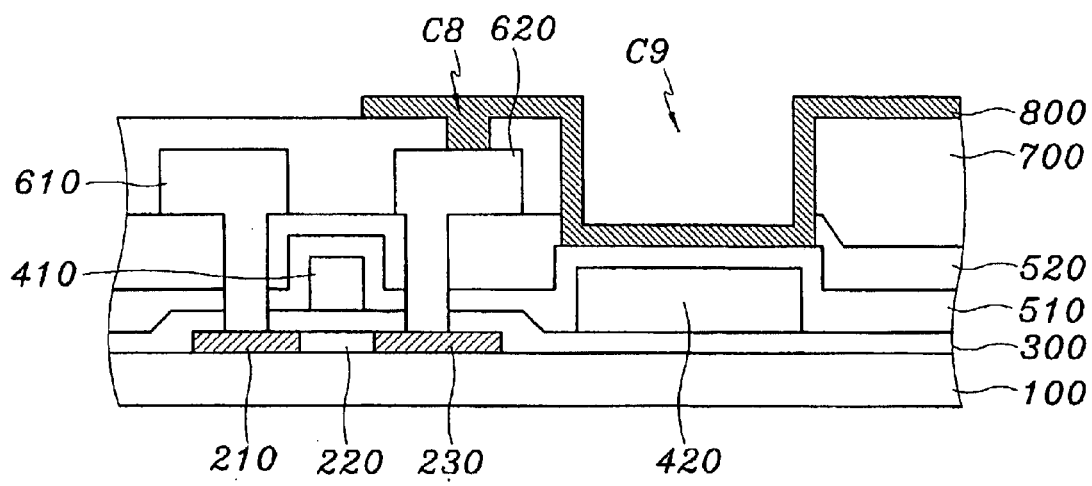

As shown in FIGS. 2 and 17F, an indium-tin-oxide layer is deposited and patterned to form a pixel electrode 800. The pixel electrode 800 is connected to the drain electrode 620 through the contact hole C8 and covers the via hole C9.

As described above, since the interlayer insulating film has double layers having different etch rates, the thickness of the remaining interlayer insulating film is uniform.

FIGS. 18A to 18D are cross sectional views of the intermediate structures of an LCD according to the sixth embodiment. In the sixth embodiment, the double films 510 and 520 have different etch rates as in the fifth embodiment, but the lower film is patterned along with the gate wire.

Figure 18A:
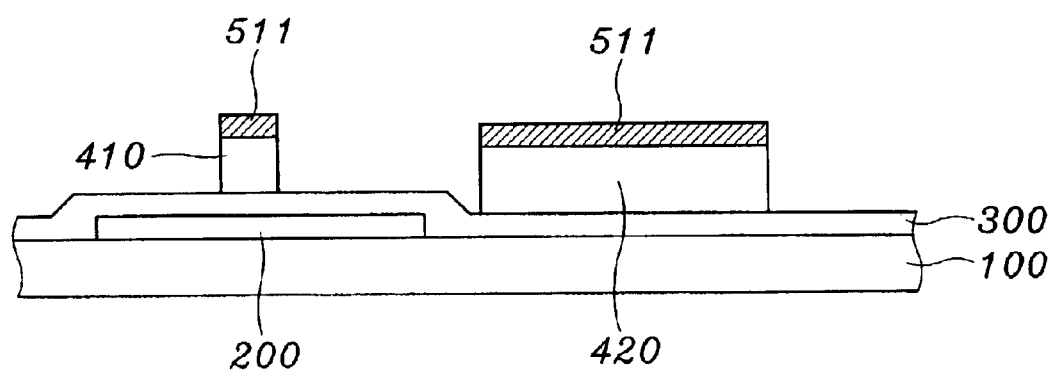
FIGS. 18A to 18D are cross sectional views of the intermediate structures of an LCD shown in FIG. 15 according to the sixth embodiment.

As shown in FIGS. 12 and 18A, a silicon layer 200 is formed on an insulating substrate 100 and a gate insulating film 300 is deposited thereon. Next, a metal layer for a gate wire and the first film 511 of a 500 Å~3,000 Å thickness are sequentially deposited, and simultaneously patterned. In other words, the first film 511 only over a gate pattern including the gate line 400, the gate electrode 410 and the storage electrode 420 remains.

Figure 18B:
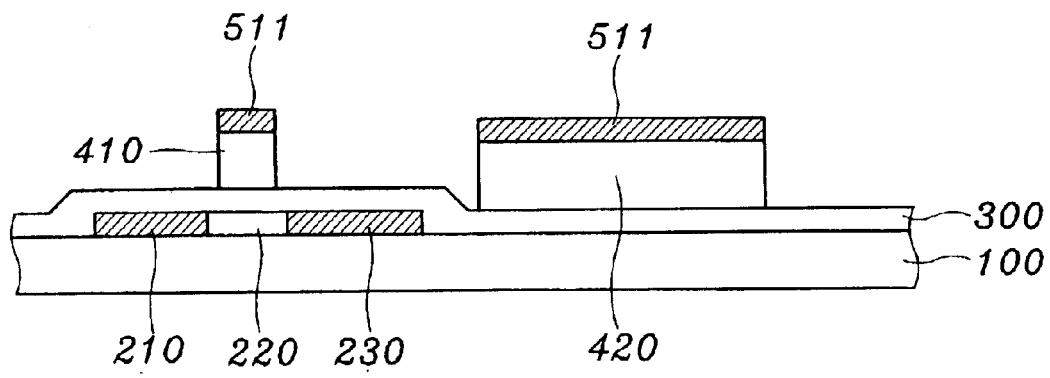
Figure 18C:
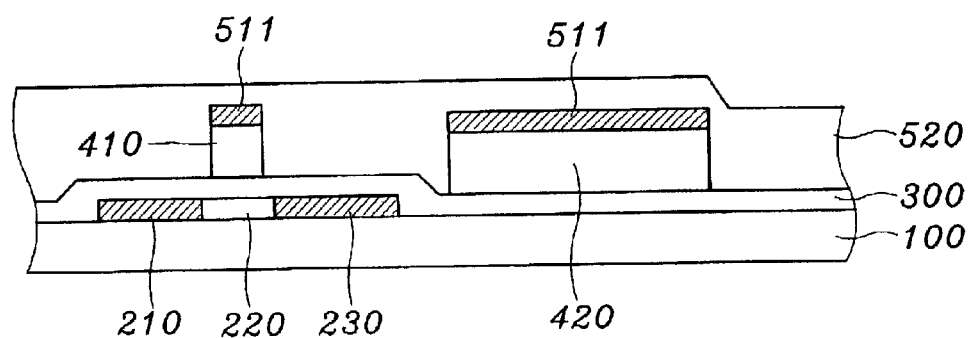

As shown in FIGS. 18B and 18C, ions are injected into the silicon layer 200 by using the gate pattern 400, 410 and 420 as an implant mask to form a source and a drain regions 210 and 230, and the second film 520 is deposited. The second film 520 has a larger etch rate than that of the first film 511 and the same etch rate as that of the passivation film 700.

Next, a data line 600, a source and a drain electrodes 610 and 620, and a passivation film 700 are formed by the same method as in the fifth embodiment. In the etching step, the first film 511 having a small etch rate remains, and the second film 500 and the passivation film 700 over the storage electrode 420 are removed.

Figure 18D:
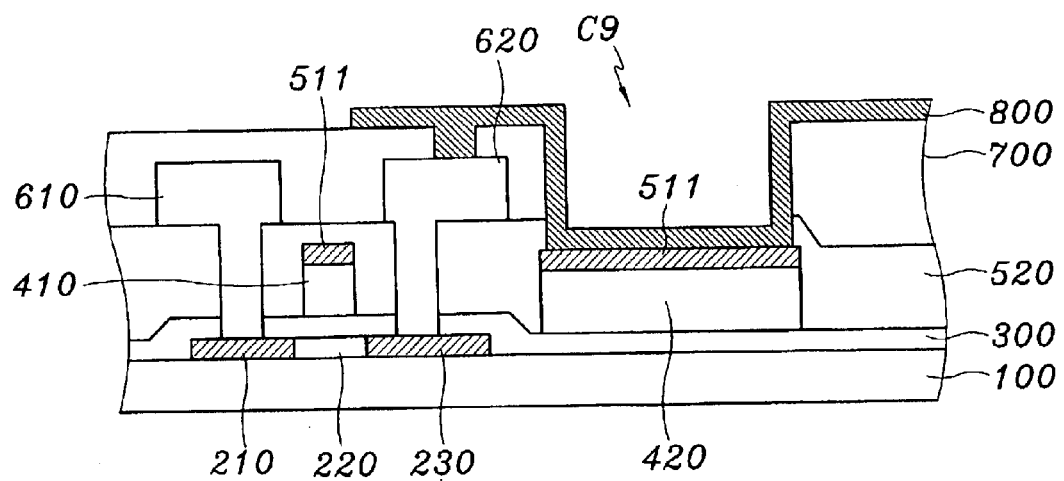

As shown in FIGS. 12 and 18D, a pixel electrode 800 is formed on the passivation film 700 and the first film 511, and a storage capacitor is formed of the pixel electrode 800, the storage electrode 420 and the first interlayer insulating film 511 interposed between the electrodes 800 and 420.

In the fifth and the sixth embodiments, the first films 510 and 511 are used as an over-etch protecting layer. The first films 510 and 511 may be formed as multiple layers.

In the above embodiments, the LCDs and the manufacturing methods thereof have been described in a mode having an separate storage line. Those embodiments can be adopted to a mode in which a portion of a previous gate line is used as an electrode of a storage capacitor. Moreover, the semiconductor layer may be an amorphous silicon layer.

Next, the structure according to the seventh embodiment of the present invention is described. In the seventh embodiment, a silicon layer is not required to be doped for a storage region, but can play a role of one electrode of a storage capacitor by a specific driving method.

Figure 19:
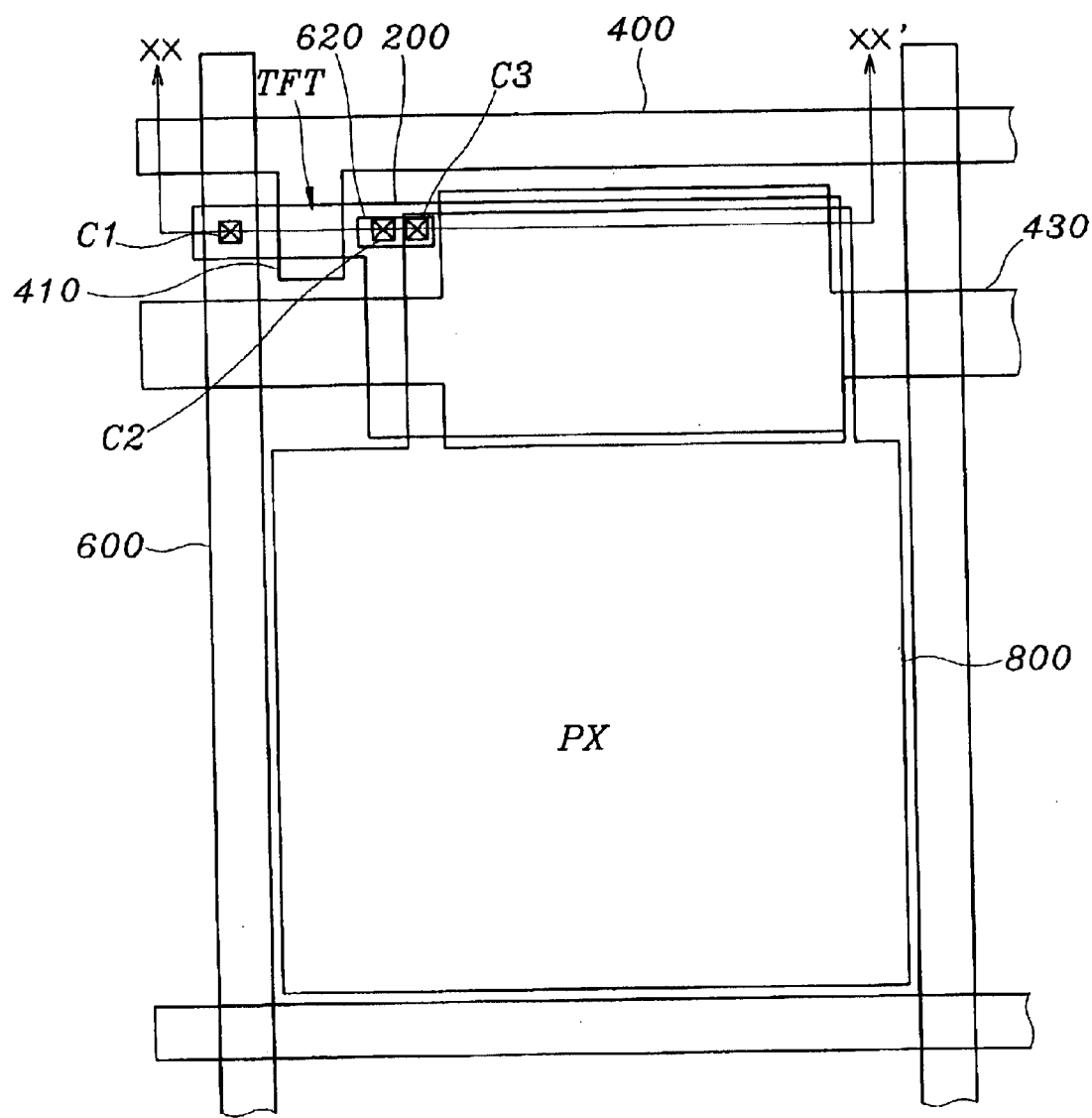
FIG. 19 is a layout view of an LCD according to the seventh embodiment of the present invention.
Figure 20:
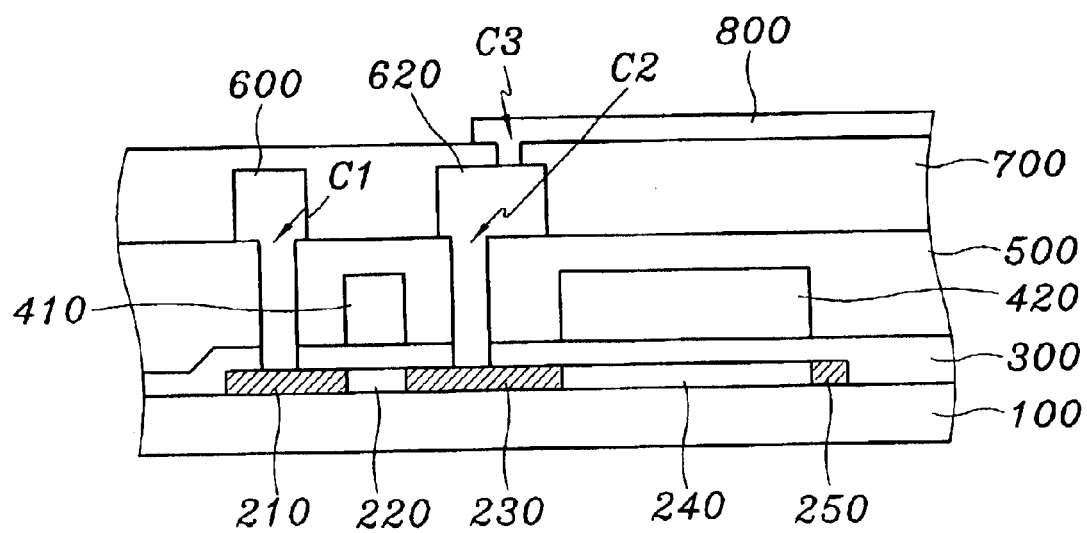
FIG. 20 is a cross sectional view taken along the line XX–XX' in FIG. 19.
Figure 21:
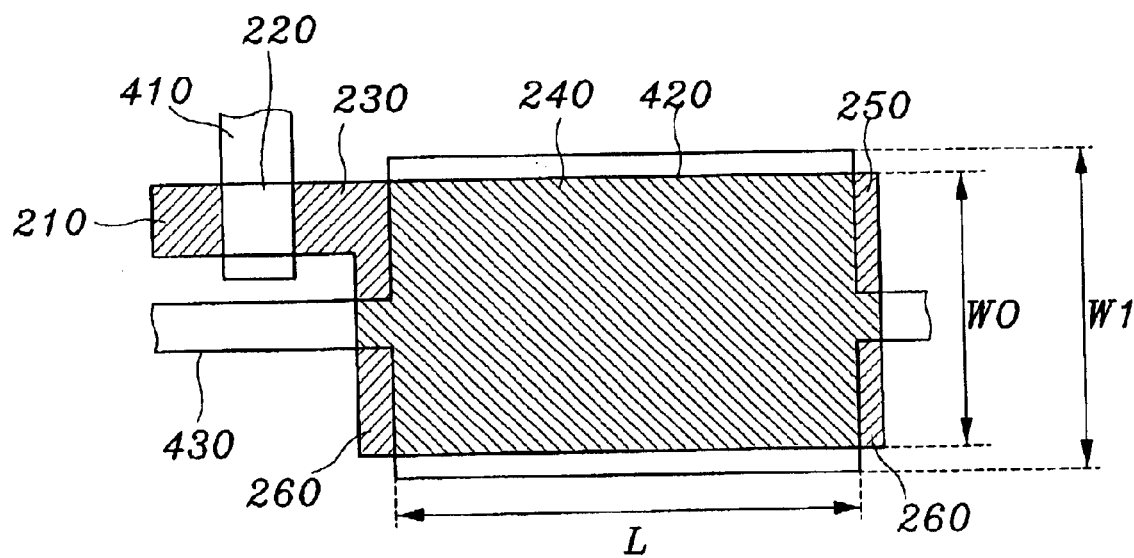
FIG. 21 is a layout view showing only a silicon layer, a storage line and a gate electrode in FIG. 19.

FIG. 19 is a layout view of an LCD according to the seventh embodiment of the present invention, FIG. 20 is a cross sectional view taken along the line XX–XX' in FIG. 19, and FIG. 21 is an enlarged layout view showing a storage electrode line, a silicon layer and a gate electrode only.

As shown in FIGS. 19 and 20, a polycrystalline silicon layer 200 is formed on an insulating film 100 and extends in the vertical direction, and a gate insulating film 300 made of $SiO_2$ or $SiN_x$ is formed on the substrate 100 and the silicon layer 200 and has a 500 Å~3,000 Å thickness.

A gate line 400 is formed on the gate insulating film 300 and extends in the horizontal direction. The gate line 400 expands to form a gate electrode 410, and the gate electrode 410 overlaps a portion 220 of the silicon layer 200. A storage electrode line 430 made of the same layer as the gate line 400 is formed on the gate insulating film 300 and extends parallel to the gate line 400. The storage electrode line 430 overlaps a portion 240 of the silicon layer 200, and the portion 420 of the storage electrode line 430 overlapping the silicon layer 200 is a storage electrode.

As shown in FIG. 21, the silicon layer 200 includes a portion which has a small width and overlaps the gate electrode 410, and a portion which has a large width located on the right side of the gate electrode 410 and overlaps the storage electrode 420 with overlapping length L. The storage electrode 420 expands upward and downward to increase the total overlapping area and both the edges of the storage electrode 420 are located outside the silicon layer 200. In this embodiment, the width W1 of the storage electrode 420 is wider than the width W0 of the silicon layer 200, and the length L is longer than the width W1 of the storage electrode 420.

Meanwhile, a portion of the silicon layer 200 opposite the gate electrode 410 and the storage electrode 420 is undoped, and the rest portions of the silicon layer 200 are doped with n-type dopant. The doped portions are divided into several regions with respect to the gate electrode 410 and the storage electrode 420. The undoped portion opposite the gate electrode is a channel region 220, the undoped portion opposite the storage electrode is a storage region 240, and the doped portions corresponding to the both sides with respect to the channel region 220 are a source region 210 and a drain region 230. The drain region 230 is adjoining to the storage region 240. Moreover, sub-regions 250 and 260 due to the difference between the silicon layer 200 and the storage electrode 420 in length and width are formed outside the storage electrode 420. The sub-regions 250 and 260 are doped, adjoining to the storage region 240 and divided from the drain region 230.

An interlayer insulating film 500 covers the gate wire including the gate line 400, the gate electrode 410 and the storage electrode line 430, and contact holes C1 and C2 exposing the source and the drain regions 210 and 230 are formed in the gate insulating film 300 and the interlayer insulating film 500.

A data line 600 is formed on the interlayer insulating film 500, extends in the vertical direction and intersects the gate line 400 and the storage electrode line 430. The data line 600 is connected to the source region 210 through the contact hole C1. A drain electrode 620 made of the metal for the data wire is formed opposite side with respect to the data line 600 and connected to the drain region 230 through the contact hole C2.

A passivation film 700 covers the data line 600 and the interlayer insulating film 500, and a via hole C3 exposing the drain electrode 620 is formed in the passivation film 700. A pixel electrode 800 made of an indium-tin-oxide is formed on the passivation film 700 and located inside a pixel region surrounded by the data line 600 and the gate line 400. The pixel electrode 800 is connected to the drain electrode 620 through the via hole C3 and overlaps the storage electrode 420.

Meanwhile, the drain region 230 may be directly connected to the pixel electrode 800. It is described with reference to FIGS. 22 and 23.

Figure 22:
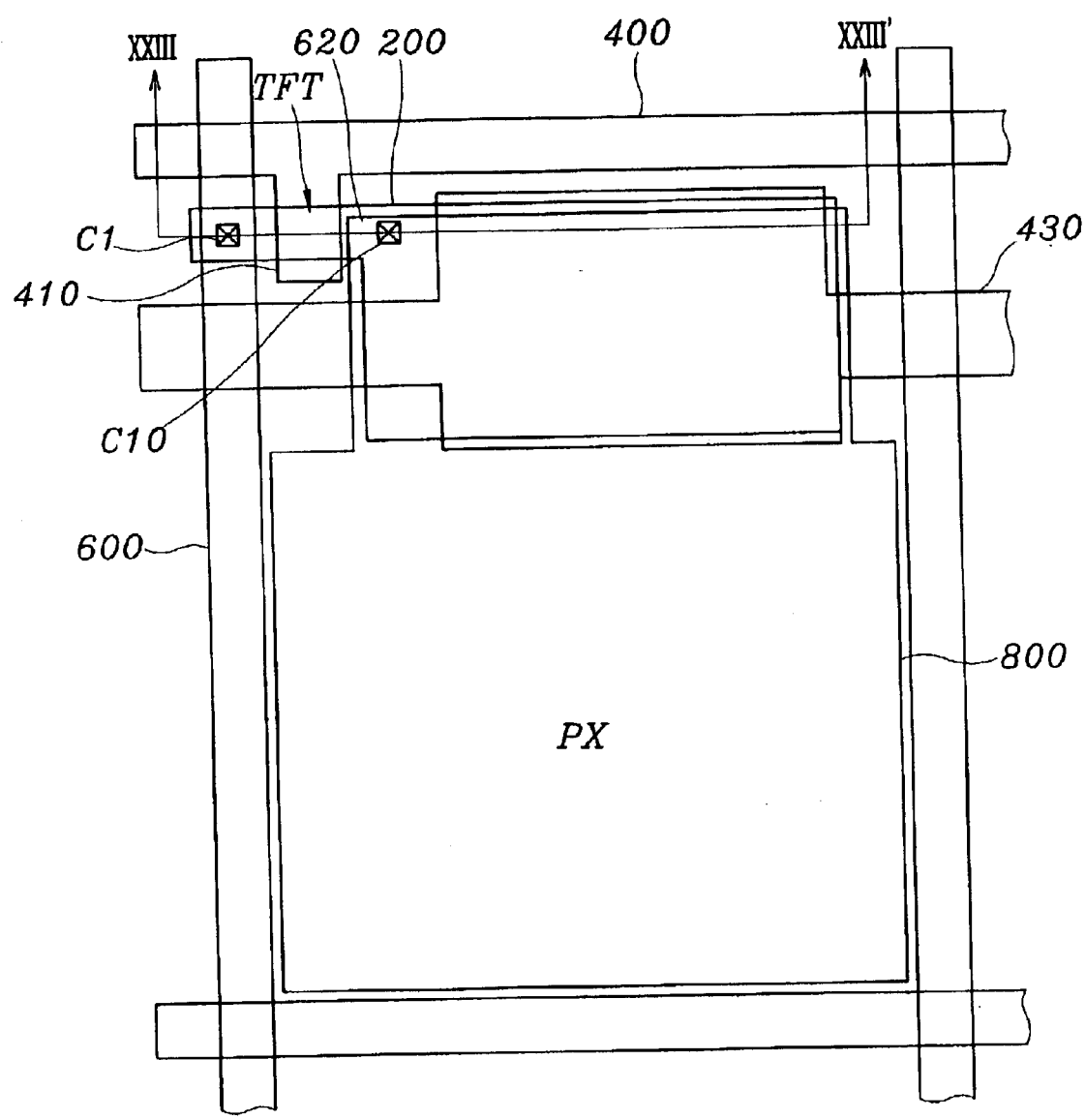
FIG. 22 is a layout view of an LCD according to the eighth embodiment of the present invention.
Figure 23:
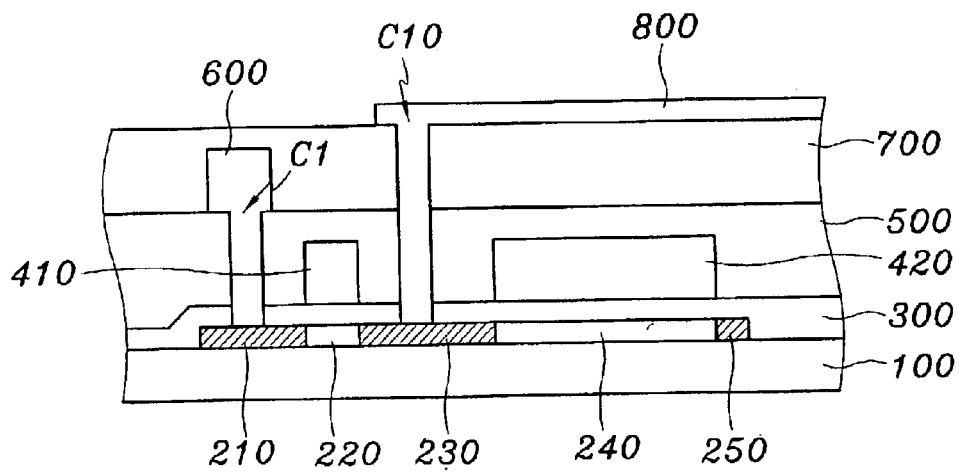
FIG. 23 is a cross sectional view taken along the line XXII–XXII' in FIG. 22.

FIG. 22 is a layout view of an LCD according to the eighth embodiment of the present invention and FIG. 23 is a cross sectional view taken along the line XXII–XXII' in FIG. 22. In this embodiment, a metal pattern for a drain electrode is not required.

As shown in FIGS. 22 and 23, the eighth embodiment has the same structure as the seventh embodiment except that a contact hole C10 exposing the drain region 230 is formed in the passivation film 700, the interlayer insulating film 500 and the gate insulating film 300, and the pixel electrode 800 is directly connected to the drain region 230 through the contact hole C10.

As described above, a storage capacitor includes the storage region 240, the storage electrode 420 and the gate insulating film 300 interposed therebetween. Since the storage region 240 is undoped, it cannot play a role of one electrode of the storage capacitor. Therefore, it is required to apply specific voltages.

Figure 24:
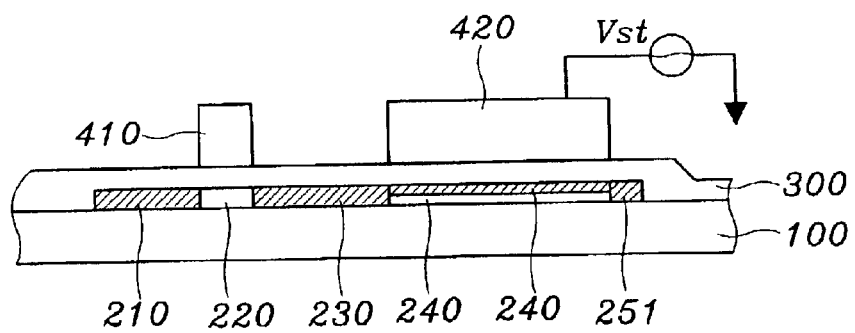
FIG. 24 is a cross sectional view of the LCD according to the eighth embodiment schematically showing the principle of the formation of the storage capacitor.

FIG. 24 is a cross sectional view of the LCD according to the eighth embodiment schematically showing the principle of formation of the storage capacitor then voltages are applied to a storage electrode. The voltage V applied to the storage electrode is equal to or larger than the sum of the threshold voltage $V_{th}$ of the TFT and the display signal voltage.

If gate-on voltage is applied to the gate electrode 410, a channel is formed in the channel region 220 located between the source region 210 and the drain region 230. A display signal voltage from the data line 600 is transmitted from the source region 210 to the drain region 230 through the channel and applied to the pixel electrode 800.

If voltage $V_{st}$ applied to the storage electrode 420 is equal to or larger than the sum of the threshold voltage $V_{th}$ and the maximum value of the display signal voltage $V_{ds}$, a charge accumulation layer 241 is formed below the surface of the undoped storage region 240 adjoining to the drain region 230 since the storage electrode 420 plays a role as a gate electrode of a field effect transistor. The charge accumulation layer 241 becomes conductive and plays a role of a storage electrode.

Figure 25:
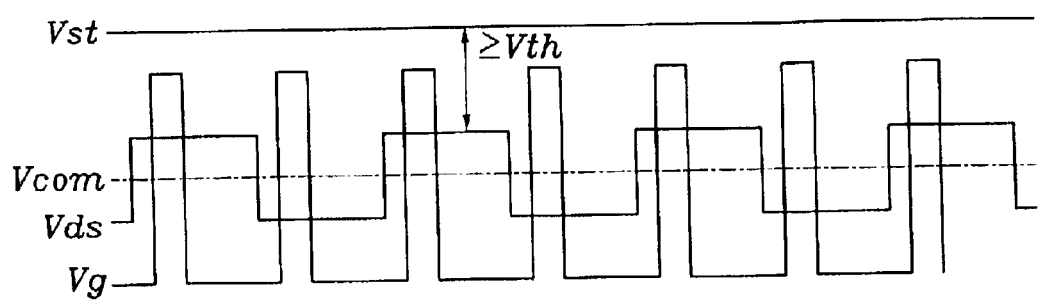
FIGS. 25 and 26 shows waveforms of signal voltages applied to the LCD according to the eighth embodiment.
Figure 26:
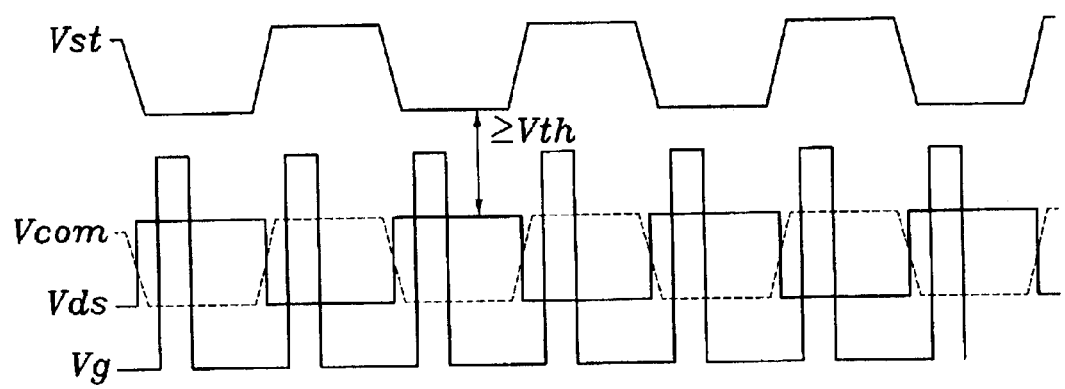

FIGS. 25 and 26 shows the wave forms of signal voltages applied to the LCD. A gate voltage $V_g$ and a display signal voltage $V_{ds}$ are respectively applied to a gate line and a data line, a common voltage $V_{com}$ is applied to a common electrode, and a storage voltage $V_{st}$ is applied to a storage electrode line and a storage electrode.

In a frame, gate-on voltages which are high level voltages of the gate voltage $V_g$ are sequently applied to the gate lines, and display signal voltages are applied via the data lines to the pixels connected to a gate line where the gate-on voltage is applied and charged to the liquid crystal capacitors of the pixels. The polarity of the data voltages $V_{ds}$ with respect to the common voltage $V_{com}$ may be inverted periodically.

This process is repeated in frames.

As illustrated in FIGS. 25 and 26, the gate voltage $V_g$ applied to one gate line has pulses periodically rising, and the display signal voltage $V_{ds}$ applied to the data lines periodically inverses their polarities with respect to the common voltage $V_{com}$.

Meanwhile, the common voltage $V_{com}$ is either a direct current as in FIG. 25 or an alternate current having the same inversion period as the gate voltage $V_g$ as in FIG. 26.

According to the types of the common voltage $V_{com}$ wave forms of the storage voltage $V_{st}$ can vary. In other words, if the common voltage $V_{com}$ is a direct current as in FIG. 25, the storage voltage $V_{st}$ is the direct current, and if the common voltage is an alternate current as in FIG. 26, the storage voltage $V_{st}$ is the alternate current. In the latter case, it is preferable that the storage voltage $V_{st}$ has a low value if the common voltage $V_{com}$ has a low value, and the storage voltage $V_{st}$ has a high value if the common voltage $V_{com}$ has a high value.

In both the cases shown in FIGS. 25 and 26, the storage voltage $V_{st}$ applied to the storage electrode 420 is equal to or larger than the sum of the threshold voltage $V_{th}$ and the maximum value of the display signal voltage $V_{ds}$.

Figure 27:
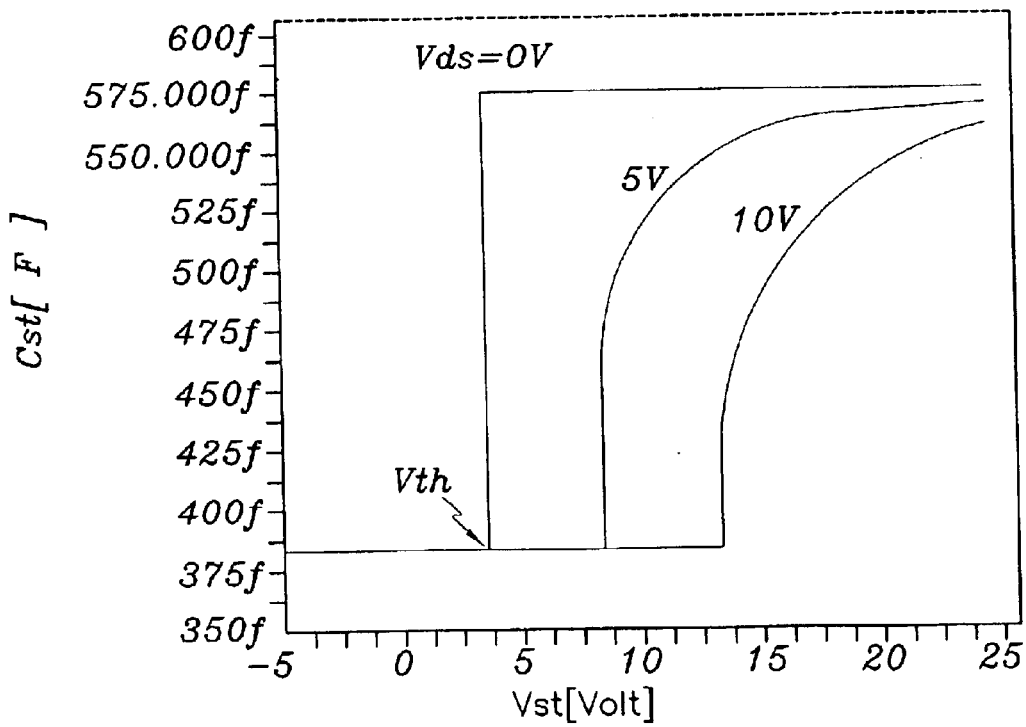
FIG. 27 illustrates the variation of the storage capacitance as a function of the storage voltage.

FIG. 27 show the variation of the storage capacitance $C_{st}$ as a function of the storage voltages $V_{st}$ for display signal voltages $V_{ds}$ of 0 V, 5 V and 10V.

In the case that the display signal voltage is 0V, if the storage voltage $V_{st}$ is equal to or larger than the threshold voltage 3.5 V of the TFT, a storage capacitor is formed. The capacitance of the storage capacitor is about 575 Farad, which is almost the same as in the case using a metal electrode. In the cases that the display signal voltages are 5V and 10V, the storage capacitance $C_{st}$ is formed when the storage voltages $V_{st}$ are equal to or larger than 8.5V and 13.5 V, respectively, which are the sums of the respective display signal voltages and 3.5 V. Unlikely the case of the display signal voltage 0V, the value of the storage capacitance $C_{st}$ are affected by the variation of the storage voltage $V_{st}$. That is, when the applied storage voltage $V_{st}$ is higher than 3.5 V plus the display signal voltage $V_{ds}$, the storage capacitance $C_{st}$ increases critically. As the storage voltage $V_{st}$ increases, the increasing rate of the storage capacitance $C_{st}$ is decreased and the storage capacitance approaches the value for the display signal voltage of 0V.

Figure 28:
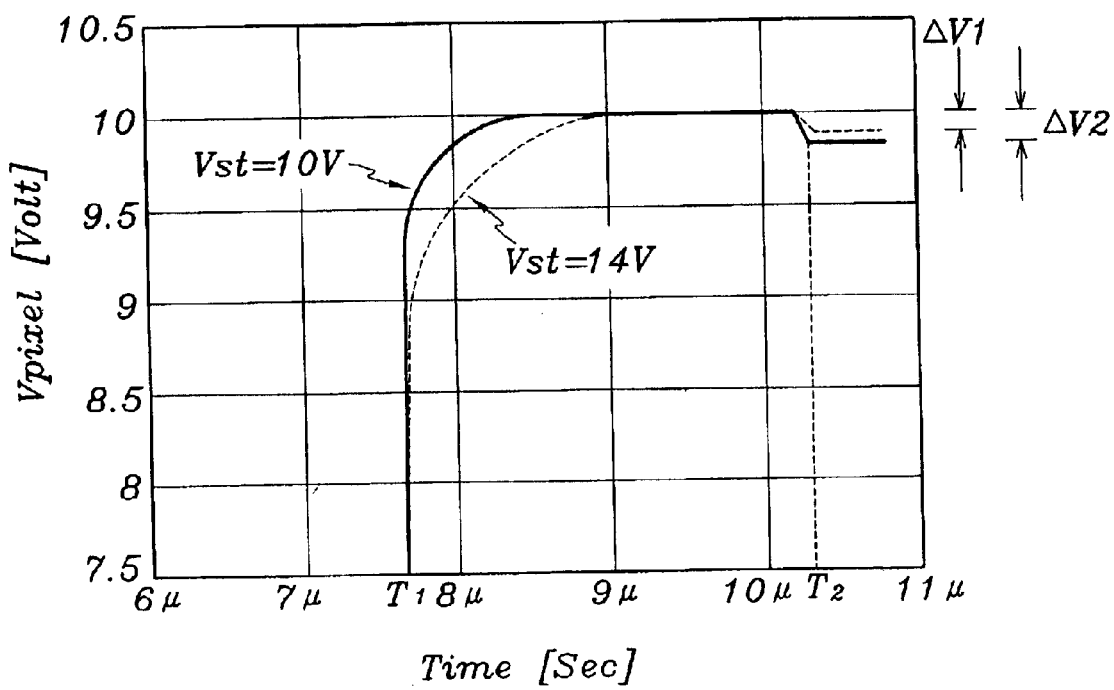
FIG. 28 illustrates a charging characteristics of the storage capacitor for the storage voltages of 10 V and 14 V when the maximum value of the display signal voltage is 10 V and the threshold voltage of the TFT is 3.5 V in the eighth embodiment.

FIG. 28 shows a charging characteristics of the storage capacitor for the storage voltages $V_{st}$ of 10V and 14 V when the maximum value of the display signal voltage $V_{ds}$ is 10V, and the threshold voltage of the TFT is 3.5 V. Charging of a pixel starts at the moment T1 that a gate-on voltage is applied and the pixel voltage $V_{pixel}$ arrives to the maximum value in a short time. The pixel voltage $V_{pixel}$ abruptly drops at the moment T2 when the gate-off voltage is applied. The voltage drop $\Delta V_1$ and $\Delta V_2$ is a kick back voltage.

As shown in FIG. 28, if the storage voltage $V_{st}$ applied to the storage electrode 420 is 10V, the pixel is quickly charged and arrived at the maximum value compared to the case of the storage voltage $V_{st}$ 14V. However, the voltage drop $\Delta V_1$ for the storage voltage $V_{st}$ of 10V is larger than the voltage drop $\Delta V_2$ for the storage voltage $V_{st}$ of 14V.

As a result, if the storage voltage is equal to or larger than the sum of the threshold voltage of the TFT and the maximum value of the display signal voltage, a storage capacitance is formed so that charging time delays and the kick back voltage is reduced.

As described above, since the undoped storage region 240 can be used as an electrode of the storage capacitor by applying adequate voltages, an additional doping step for the storage region 240 is not required.

Next, a manufacturing method of an LCD according to the seventh and the eighth embodiments will be described with reference to FIGS. 19 to 23, and FIGS. 29A to 29J.

Figure 29A:
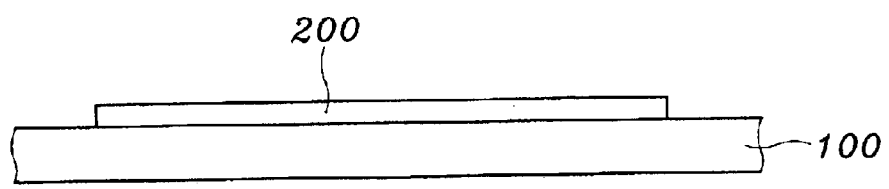
FIGS. 29A to 29J are cross sectional views of the intermediate structures of an LCD shown in FIGS. 22 and 23 according to the eighth embodiment.

As shown in FIG. 29A, a polycrystalline silicon layer 200 is formed on an insulating substrate 100. Then, a thermal process or a laser annealing may be performed to improve the crystallization characteristics of the silicon layer 200.

Figure 29B:
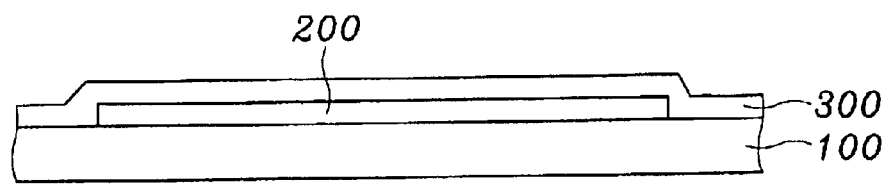

As shown in FIG. 29B, a gate insulating film 300 made of $SiN_x$ or $SiO_2$ is formed and has a 500 Å~3,000 Å thickness.

Figure 29C:
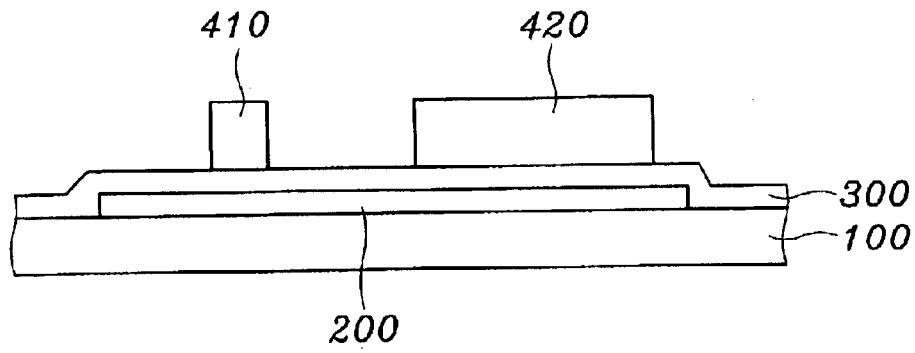

As shown in FIGS. 19 and 29C, a conductive layer for a wire is deposited and patterned to form the gate wire including a gate line 400, a gate electrode 410, a storage electrode line 430 and a storage electrode 420. As described above, the gate electrode 410 extending from the gate line 400 and the storage electrode 420 extending from the storage electrode line 430 are located over the silicon layer 200.

Figure 29D:
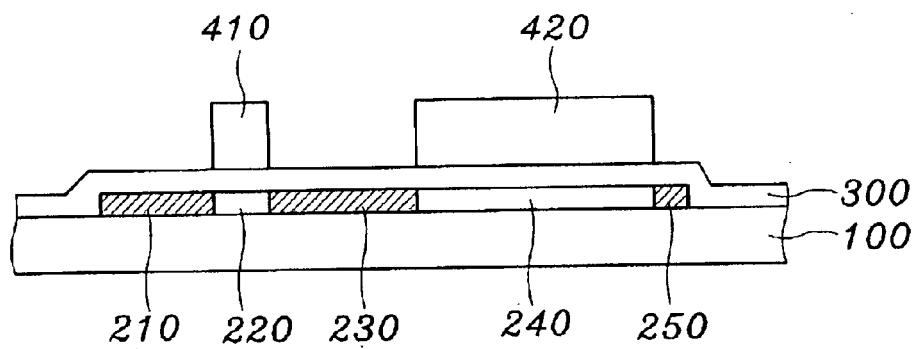

As shown in FIGS. 21 and 29D, ions are injected into the silicon layer 200 by using the wire 400, 410, 420 and 430 as an implant mask and diffused to form a source region 210 and a drain region 230. In this step, a channel region 220, a portion of the silicon layer 200 opposite the gate electrode 410, and a storage region 240, a portion of the silicon layer 200 opposite the storage electrode 420, are formed. The channel region 220 and the storage region 240 are undoped and the storage region 240 is adjoining to the drain region 230. Moreover, sub-regions 250 and 260 adjoining to the storage region 240 and separated from the drain region 230 are formed.

Figure 29E:
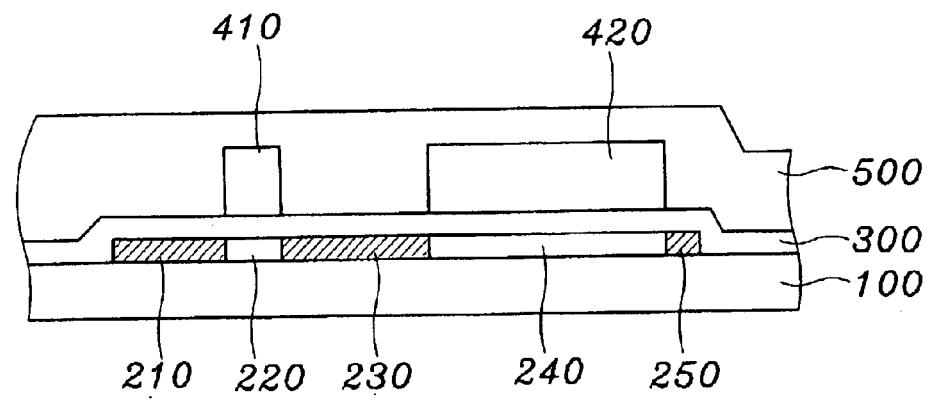

As shown in FIGS. 19 and 29E, an interlayer insulating film 500 which will insulate the gate line 400, the gate electrode 410, the storage electrode 420 and the storage electrode line 430 from a data line and a drain electrode are formed.

Figure 29F:
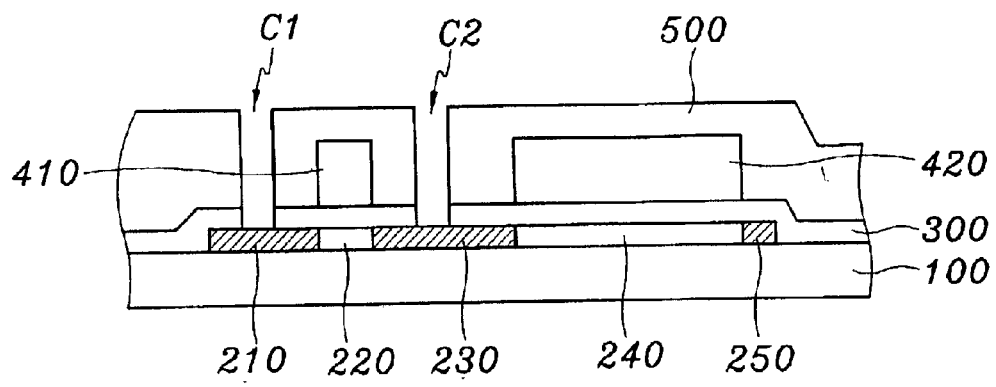

Next, as shown in FIG. 29F, the gate insulating film 300 and an interlayer insulating film 500 over the source and the drain regions 210 and 230 are removed to form a contact hole C2. The eighth embodiment does not require the contact hole C2.

Figure 29G:
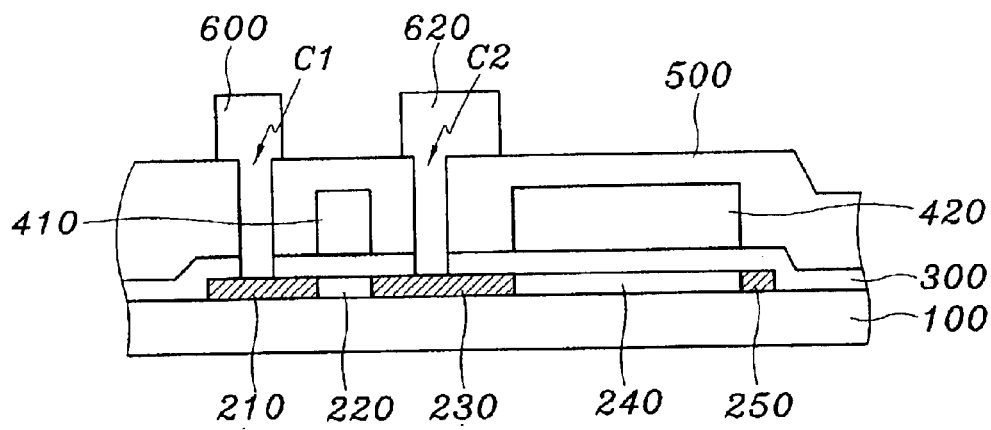

As shown in FIGS. 19 and 29G, a metal layer for a data wire such as Cr or Mo is deposited and patterned to form a data line 600 and a drain electrode 620. The data line 600 and the drain electrode 620 are respectively connected to the source and the drain regions 210 and 230 through the contact holes C1 and C2. The eighth embodiment does not require the drain electrode.

Figure 29H:
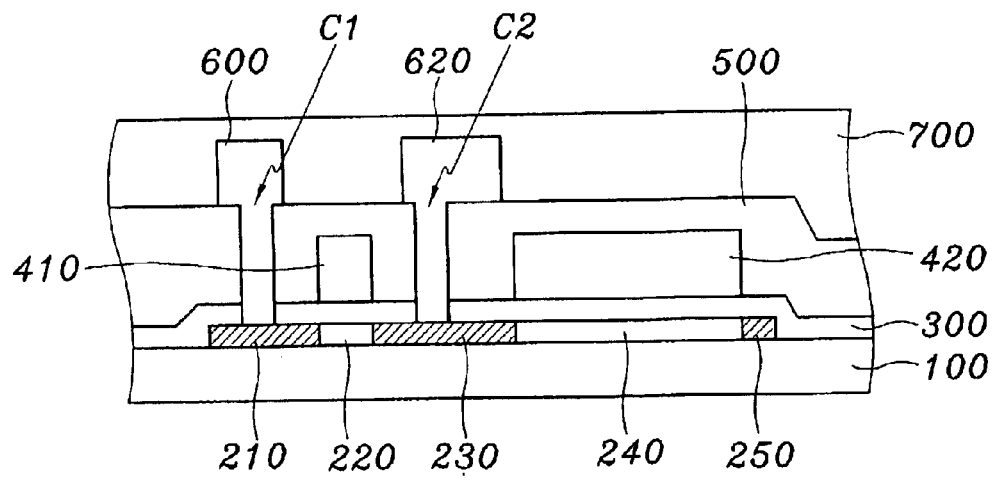
Figure 29I:
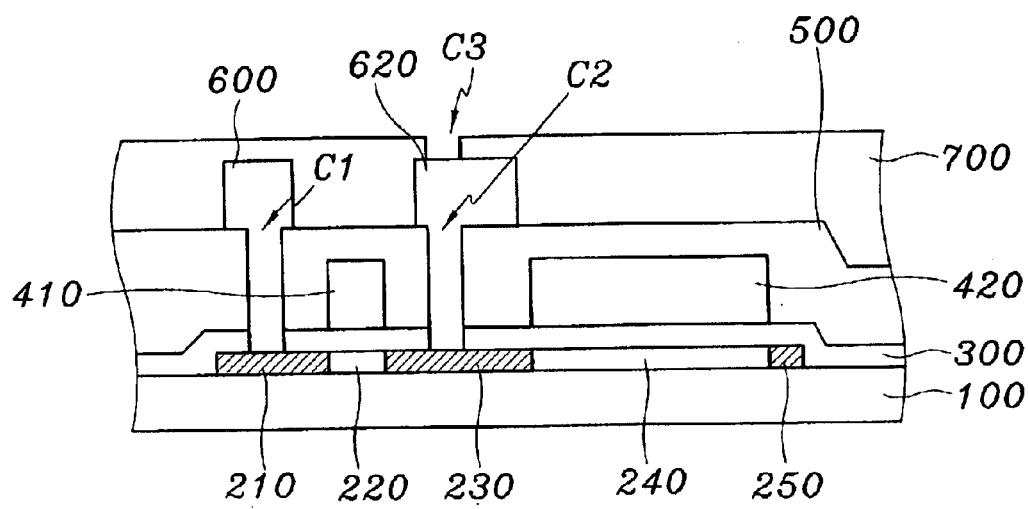

As shown in FIGS. 29H and 29I, a passivation film 700 is deposited. Then, the passivation film 700 is etched to form a via hole C3 exposing the drain electrode 620. In the eighth embodiment, the gate insulating film 300, the interlayer insulating film 500 and the passivation film 700 are removed to form a contact hole C4 exposing the drain region 230.

Figure 29J:
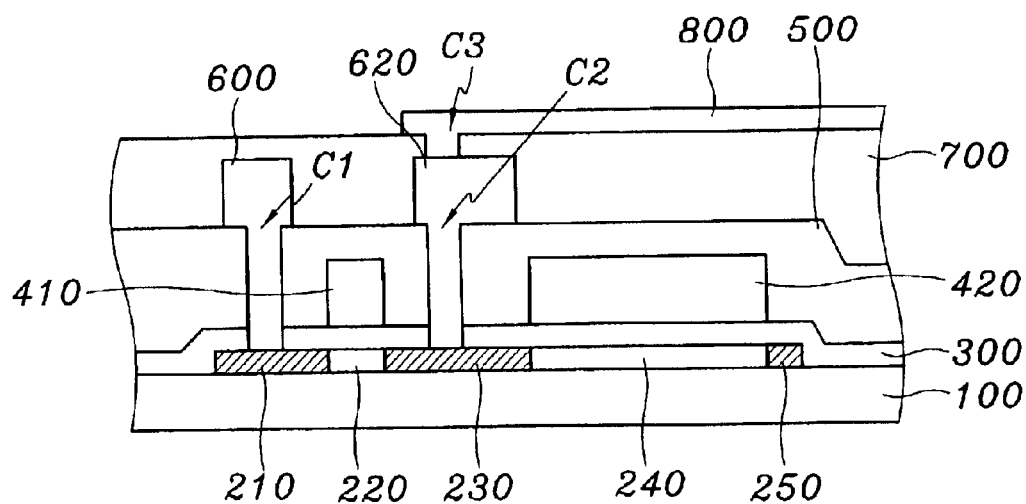

As shown in FIGS. 19 and 29J, a transparent conductive layer made of a material such as an indium-tin-oxide is deposited and patterned to form a pixel electrode 800. The pixel electrode 800 overlaps the storage electrode 420 and is connected to the drain electrode 620 through the via hole C3. In the eighth embodiment, the pixel electrode 800 is directly connected to the drain region 230 though the contact hole C4.

As described above, since the storage region 240 can be used as one electrode of the storage capacitor by controlling the voltages applied to the storage electrode 420, the storage region 240 is not required to be doped. Therefore, the number of masks are reduced.

Considering the charging process again with reference to FIG. 28, it takes a time to charge the pixel to have the maximum voltage. It may be caused by the resistance of the wire and the storage capacitor and the storage capacitance.

Figure 30:
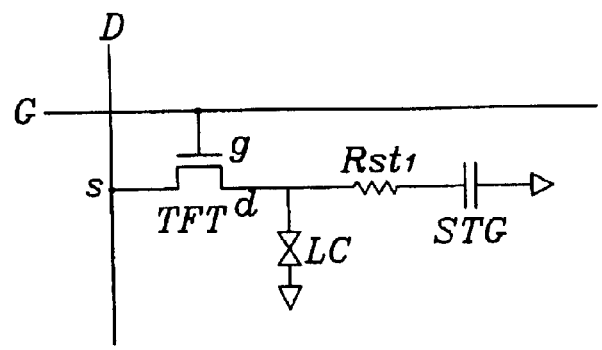
FIG. 30 is an equivalent circuit diagram of an LCD according to the seventh and the eighth of the present invention.

FIG. 30 is an equivalent circuit diagram according to the seventh and the eighth embodiments mentioned above. Only the resistance of the storage region 240 is considered.

As shown in FIGS. 21 and 30, a gate line G intersects and is insulated from a data line D. A gate and a source terminals (g and s) of a TFT are respectively connected to the gate line G and the data line D. A liquid crystal capacitor LC and a storage capacitor STG are connected to a drain terminal (d) of the TFT in parallel, and a resistance $R_{st1}$ is connected between the drain (d) and the storage capacitor STG.

The resistance $R_{st1}$ depends on the length of the moving path of charges.

If any voltage is applied to the drain region 230 and the storage electrode 420, charges move to and are accumulated to the storage region 240. The charge's moving distance from the drain region 230 to the right edge of the storage region 240 is the length L of the storage electrode. Because the resistance $R_{st1}$ is directly proportional to the distance and the charging time of the storage capacitor is proportional to the resistance $R_{st1}$, it is required to reduce the charge moving distance.

Next, an embodiment for reducing the length will be described with reference to FIG. 31.

Figure 31:
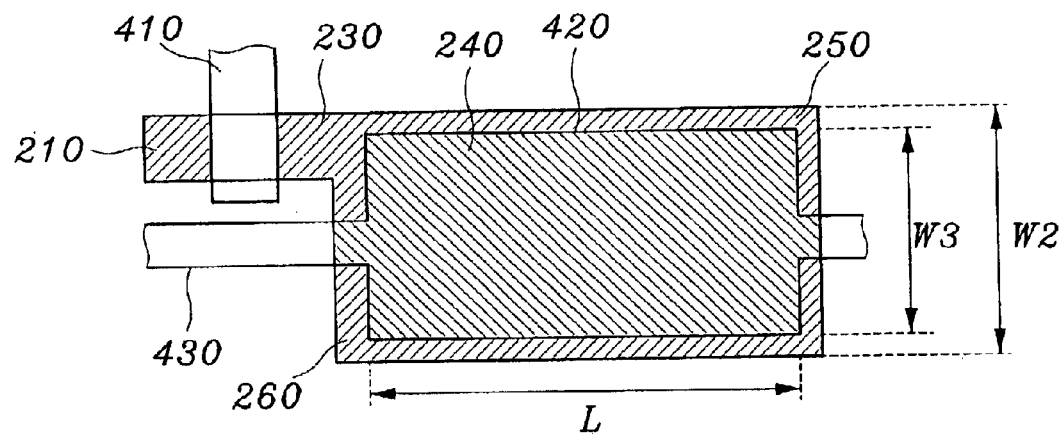
FIG. 31 is a layout view showing a silicon layer, a storage line and a gate electrode of an LCD according to the ninth embodiment of the present invention.

FIG. 31 is a layout view of an LCD according to the ninth embodiment of the present invention and illustrates only a silicon layer, a storage electrode line, a storage electrode and a gate electrode.

As shown in FIG. 31, the width W3 of the storage electrode 420 is smaller than the width W2 of the silicon layer 200, and the edges of the storage electrode 420 are located inside the silicon layer 200. To obtain the same storage capacitance as in the structure of the seventh embodiment shown in FIG. 21, the length L of the storage electrode 420 keeps the same as the seventh embodiment and the width W3 of the storage electrode 420 is equal to the width W0 of the silicon layer 200 in FIG. 21.

In this structure, doped sub-regions 250 and 260 are formed in the silicon layer 200 and located outside the storage region 240 at an upper and a lower sides. One of the sub-region 250 is connected to the drain region 230 and the other of the sub-region 260 is separated from the drain region 230.

If the storage voltage $V_{st}$ is applied to the storage electrode 420, a charge accumulation layer 241 is formed below the surface of the storage region 240. Since the doped sub-region 250 has a smaller resistance than the charge accumulation layer 241, the charges of the drain region 230 move into the sub-region 250 first and then move across the accumulation layer 241 in the vertical direction. Supposing the moving distance is the width W3 of the storage electrode 420, since the width W3 is shorter than the length L, the charge moving distance is shorter and the resistance in the storage region 240 is smaller than in the seventh embodiment shown in FIG. 21.

Figure 32:
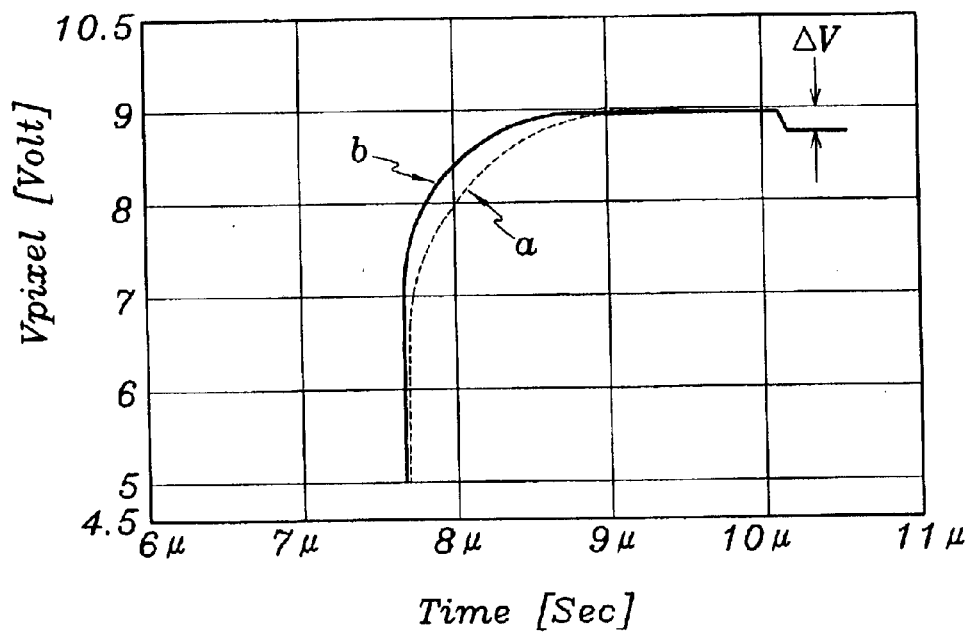
FIG. 32 illustrates a pixel charging characteristics according to the seventh and the ninth embodiments shown in FIGS. 21 and 31.

FIG. 32 shows pixel charging characteristics according to the seventh embodiment in FIG. 21 and the ninth embodiment in FIG. 31. A dotted line (a) represents a charging characteristics in the seventh embodiment and a solid line (b) represents a charging characteristics in the ninth embodiment. There are no difference between the two embodiments in the storage capacitance and the kick back voltage, but charging time of (b) is shorter than that of (a).

Figure 33:
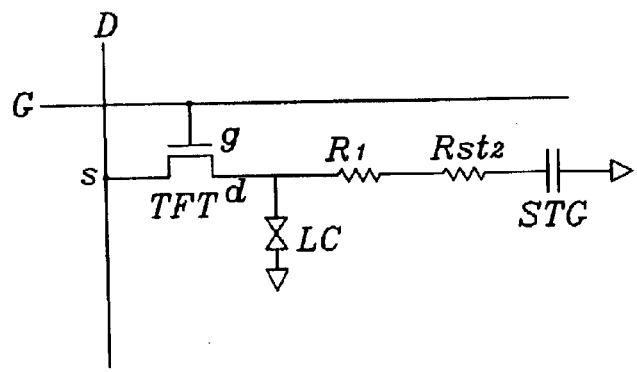
FIG. 33 is an equivalent circuit diagram of an LCD according to the ninth embodiment of the present invention.

FIG. 33 is an equivalent circuit diagram of the ninth embodiment.

As shown in FIG. 33, a resistance $R_1$ of the sub-region 240 is connected between a resistance $R_{st2}$ of the storage region 240 and a drain (d) of a TFT. In this embodiment, the resistance $R_{st2}$ of the storage region 240 is decreased according to the above described reason, while the resistance $R_1$ of the sub-region 240 is added to the resistance $R_{st2}$.

Even though smaller than the decrease of the resistance of the storage region 240, the resistance $R_1$ of the sub-region 250 is required to be decreased to shorten the charging time.

Next, embodiments for decreasing the resistance of the sub-region will be described with reference to FIGS. 34 to 38.

Figure 34:
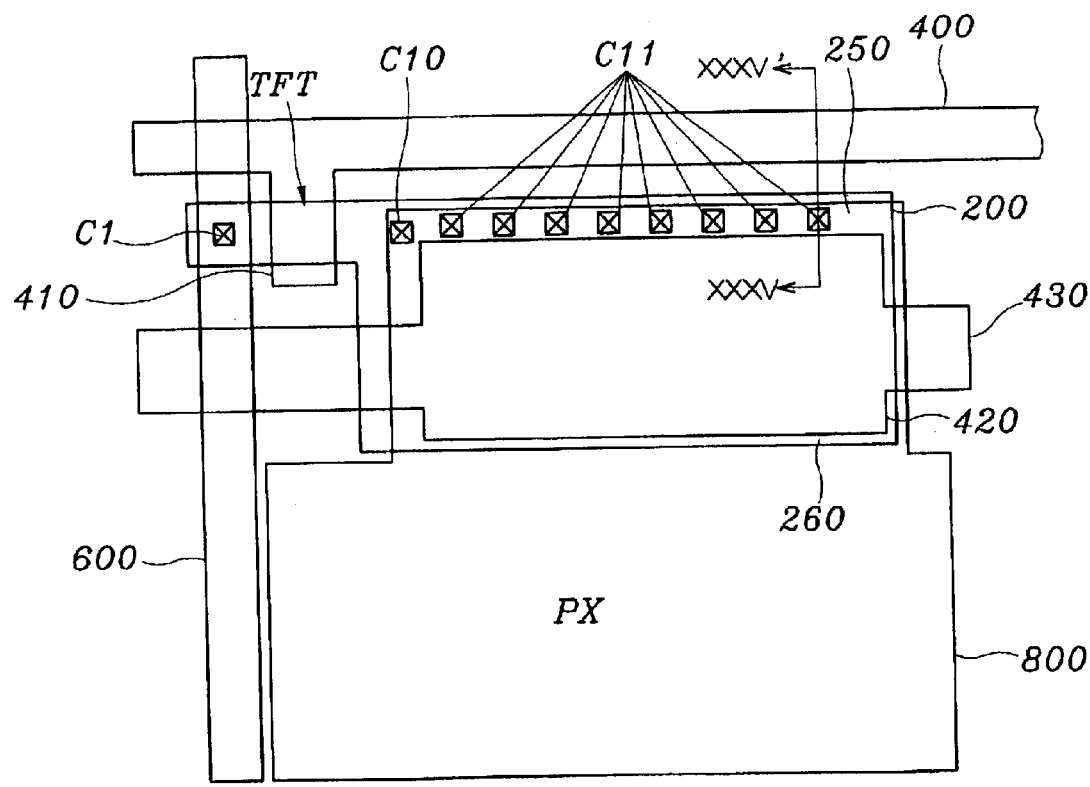
FIG. 34 is a layout view of an LCD according to the tenth embodiment of the present invention.
Figure 35:
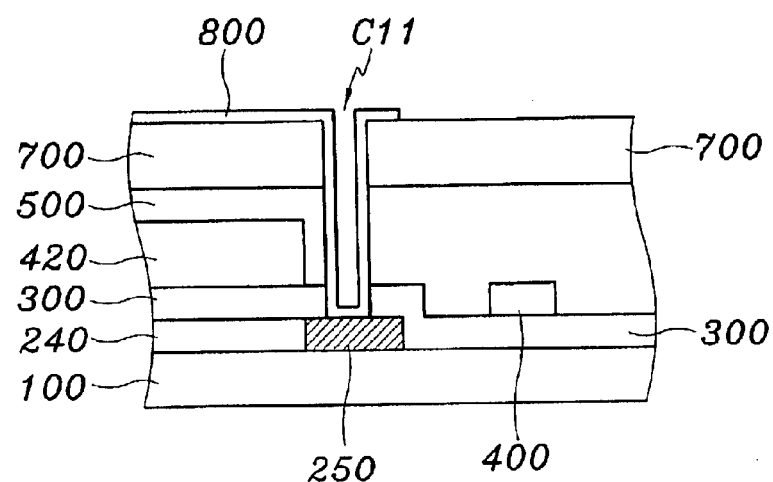
FIG. 35 is a cross sectional view taken along the line XXXV–XXXV' in FIG. 34.

FIG. 34 is a layout view of an LCD according to the tenth embodiment of the present invention and FIG. 35 is a cross sectional view taken along the line XXXV–XXXV' in FIG. 34. The tenth embodiment has substantially the same structure as the ninth embodiment except that a plurality of contact holes C11 exposing the sub-region 250 are formed in the gate insulating film 300, the interlayer insulating film 500 and the passivation film 700 are arranged in the horizontal direction, and the sub-region 250 is connected to the ITO pixel electrode 800 through the contact holes C11.

In this structure, since the pixel electrode 800 has a smaller resistance than the doped sub-region 250, the charges move to the whole sub-region 250 through the pixel electrode 800 in a short time and then move into the storage region 240. As a result, the resistance of the sub-region 250 is relatively decreased and the charging time is reduced.

Figure 36:
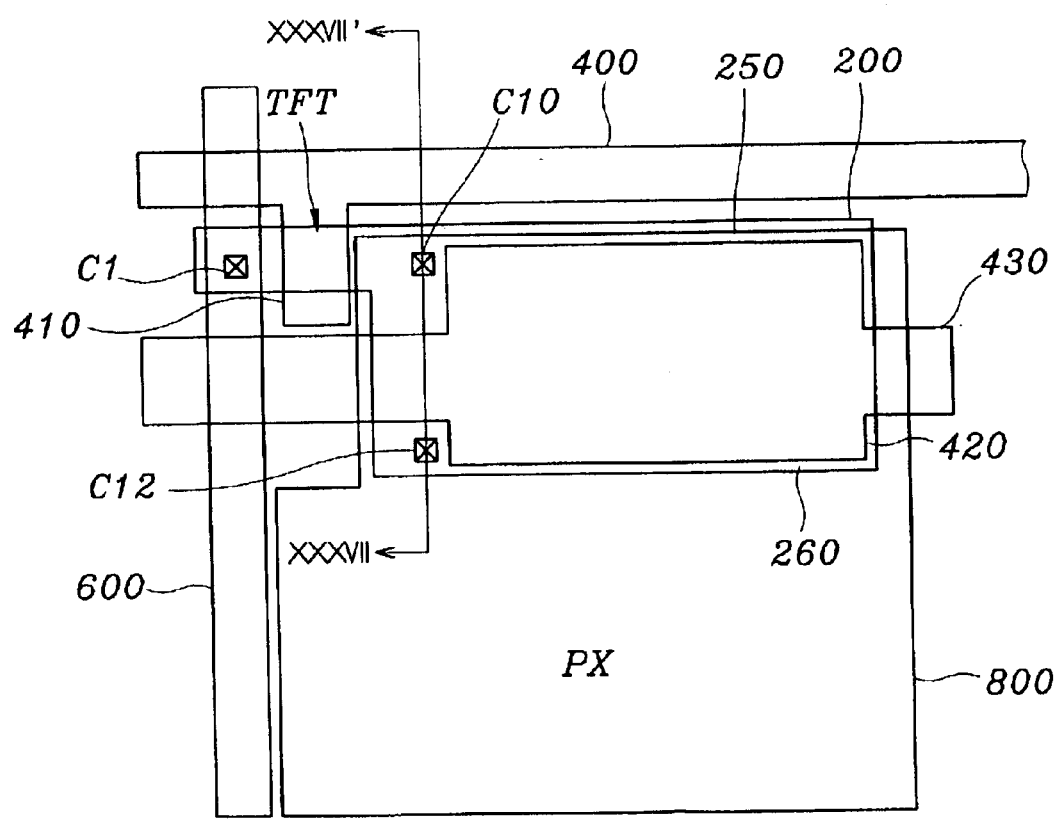
FIG. 36 is a layout view of an LCD according to the eleventh embodiment of the present invention.
Figure 37:
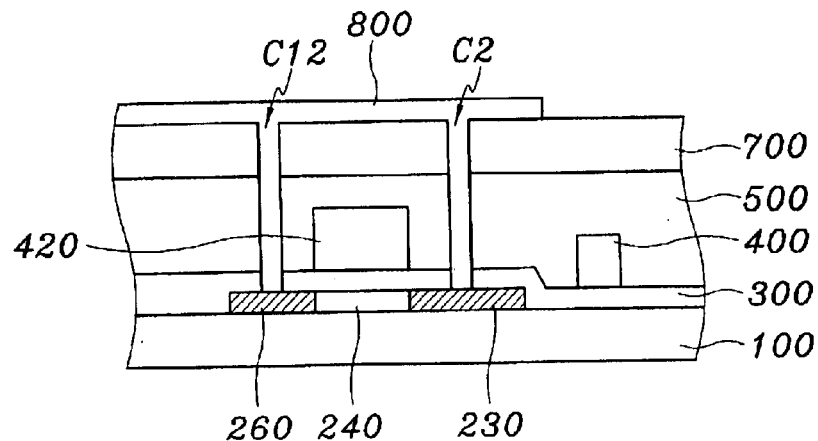
FIG. 37 is a cross sectional view taken along the line XXXVII–XXXVII' in FIG. 36.

FIG. 36 is a layout view of an LCD according to the eleventh embodiment of the present invention and FIG. 37 is a cross sectional view taken along the line XXXVII–XXXVII' in FIG. 36. The eleventh embodiment has substantially the same structure as the ninth embodiment except that a contact hole C12 is formed in the gate insulating film 300, the interlayer insulating film 500 and the passivation film 700 and a doped sub-region 260 located outside the storage region 240 at the lower side is connected to the pixel electrode 800 through the contact hole C12.

In this structure, charges move to both the sub-regions 250 and 260 through the pixel electrode 800 having a low resistance. Then, the charges move from the upper and the lower sub-regions 250 and 260 to the storage region 240 at the nearly same time. Therefore, a charge moving distance becomes a half of the width of the storage region 240, the resistance is decreased and the charging time is reduced.

Figure 38:
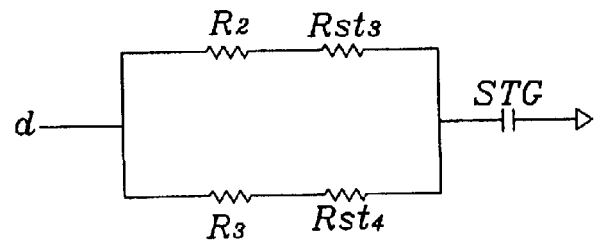
FIG. 38 is an equivalent circuit diagram of an LCD according to the eleventh embodiment of the present invention.

FIG. 38 is an equivalent circuit diagram according to the eleventh embodiment and shows a storage capacitor STG and resistance elements.

In FIG. 38, $R_2$ and $R_3$ are a resistance of an upper sub-region and a resistance of a lower sub-region, and $R_{st3}$ and $R_{st4}$ are a resistance of an upper half region of the storage region 240 and a resistance of a lower half region of the storage region 240. Supposing the structure in FIG. 36 is the same as the structure in FIG. 31, $R_{st3} \approx R_{st4} \approx \frac{1}{2} R_{st2}$, and $R_2 \approx R_1$. Supposing the resistance of the lower sub-region 260 is similar to the resistance of the upper sub-region 250, $R_3 \approx R_2 \approx R_1$ and total resistance becomes $\frac{1}{2} R_1 + \frac{1}{4} R_{st2}$. Therefore, the total resistance in the eleventh embodiment is sufficiently reduced with respect to the resistance in the ninth embodiment.

Next, structures according to the twelfth and the thirteenth embodiments will be described with reference to FIGS. 39 and 40. In the structures, the resistance of the sub-regions 250 and 260 become lower than that of the above embodiments.

Figure 39:
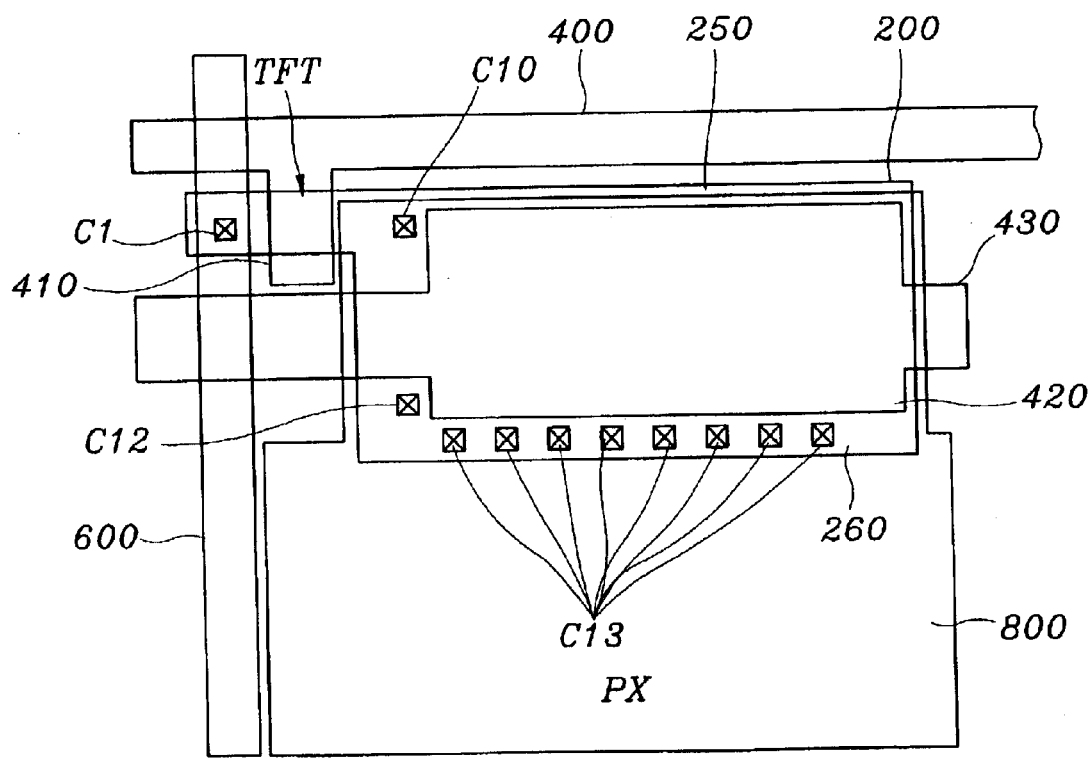
FIGS. 39 and 40 are layout views of LCDs according to the twelfth and thirteenth embodiments of the present invention.
Figure 40:
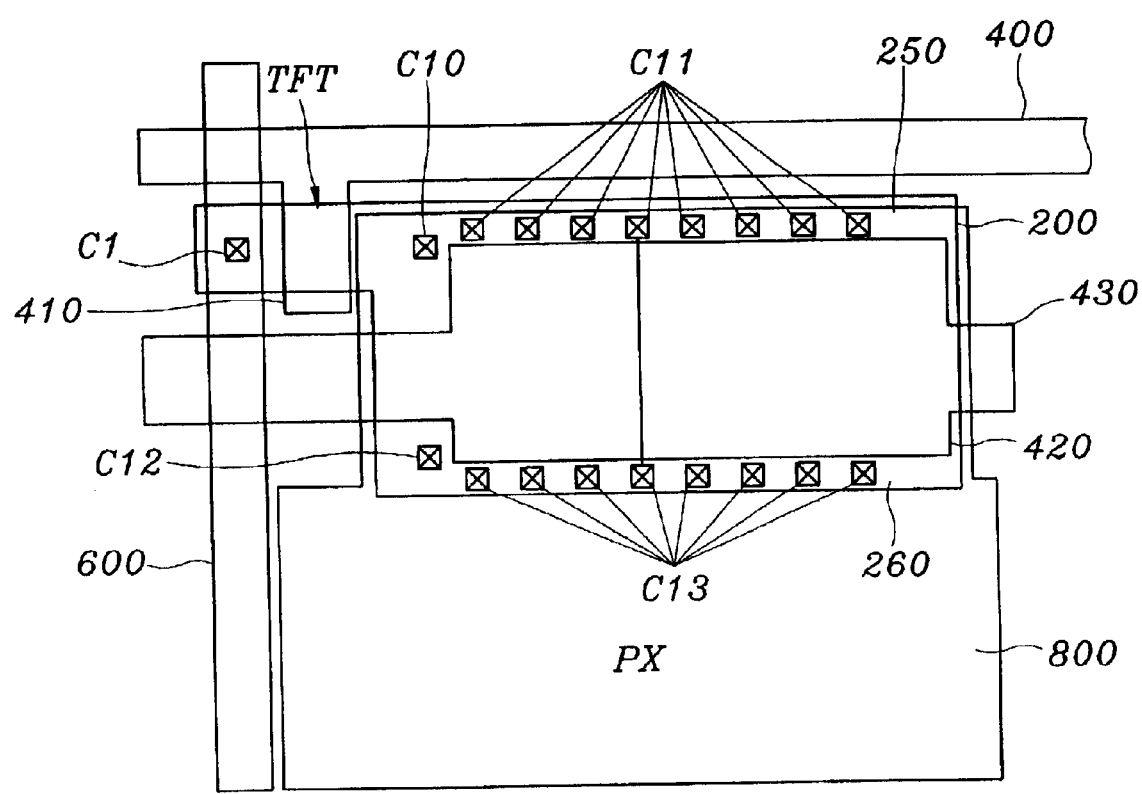

FIGS. 39 and 40 are layout views of LCDs according to the twelfth and thirteenth embodiments of the present invention.

As shown in FIG. 39, a plurality of contact holes C13 exposing the doped lower sub-region 260 are formed in the gate insulating film 300, the interlayer insulating film 500 and the passivation film 700 and arranged in the horizontal direction, and the sub-region 260 is connected to the ITO pixel electrode 800 through the contact hole C13.

Meanwhile, in FIG. 40, a plurality of contact holes C11 exposing the upper sub-region 250 and a plurality of contact holes C13 exposing the lower sub-region 260 are formed in the gate insulating film 300, the interlayer insulating film 500 and the passivation film 700. The doped upper and lower sub-regions 250 and 260 are connected to the ITO pixel electrode 800 through the contact holes C11 and C13.

As described above, since the pixel electrode 800 having a lower resistance than that of the sub-regions 250 and 260 becomes charge moving paths, the resistance can be reduced.

FIGS. 41 to 46 shows structures having metal patterns connecting the sub-regions to the pixel electrode. In the structures, charges are induced to the metal patterns having a lower resistance than the sub-regions.

Figure 41:
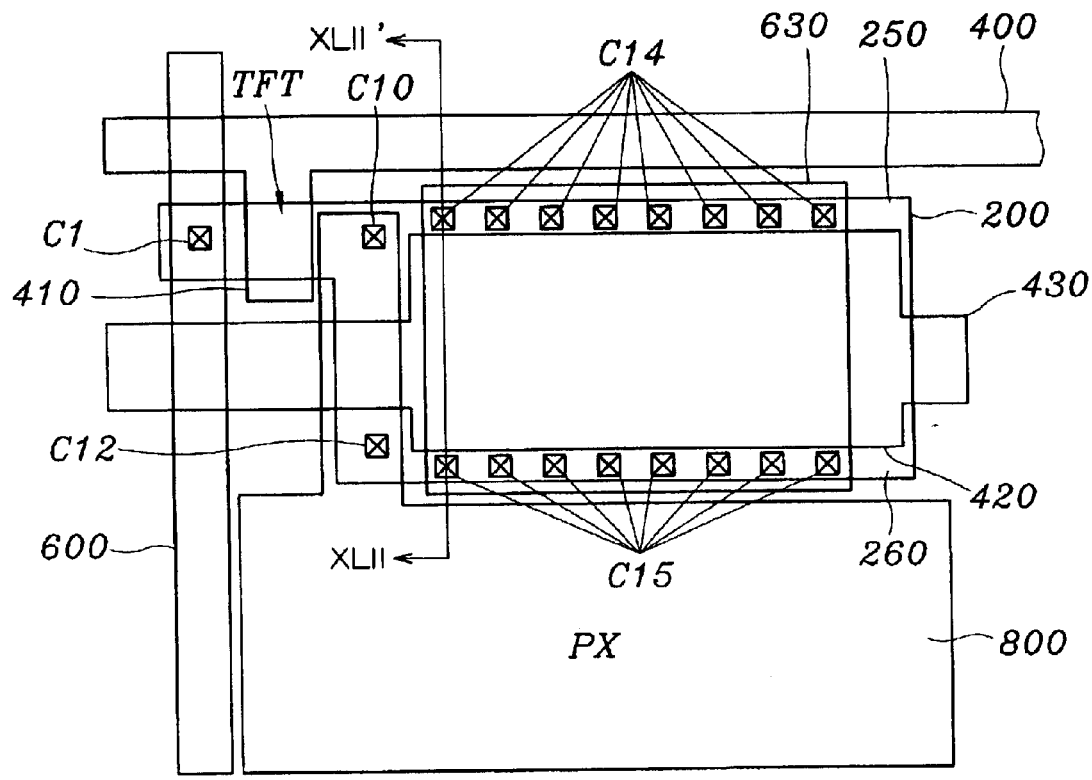
FIG. 41 is a layout view of an LCD according to the fourteenth embodiment of the present invention.
Figure 42:
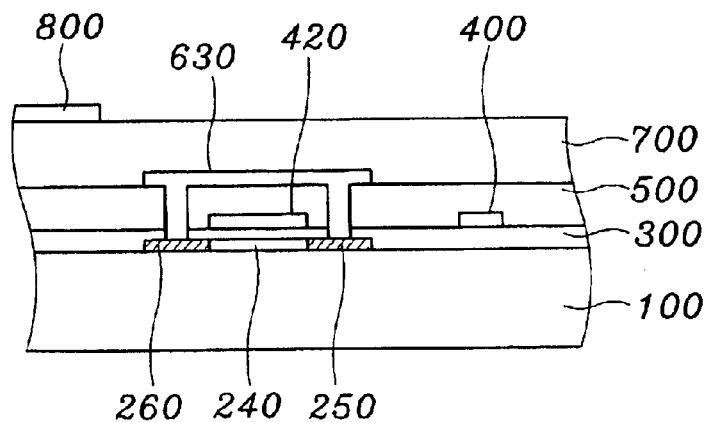
FIG. 42 is a cross sectional view taken along the line XLII–XLII' in FIG. 41.

FIG. 41 is a layout view of an LCD according to the fourteenth embodiment of the present invention, and FIG. 42 is a cross sectional view taken along the line XLII–XLII' in FIG. 41. The structure of the fourteenth embodiment is similar to the structure of the thirteenth embodiment.

As shown in FIG. 41, a metal pattern 630 is formed on the interlayer insulating film 500 and overlaps the doped sub-regions 250 and 260 and the storage electrode 420. The metal pattern 630 is connected to the upper sub-region 250 and the lower sub-region 260 through a plurality of contact holes C14 and 15 made in the gate insulating film 300 and the interlayer insulating film 500. In this embodiment, the pixel electrode does not overlap the storage electrode 420 and the metal pattern 63.

Since the metal pattern 630 has a lower resistance than the pixel electrode 800, total resistance of this embodiment is lower than that of the thirteenth embodiment. Moreover, since one more storage capacitor is formed of the storage electrode 420, the interlayer insulating film 500 and the metal pattern 630, total storage capacitance is increased.

Figure 43:
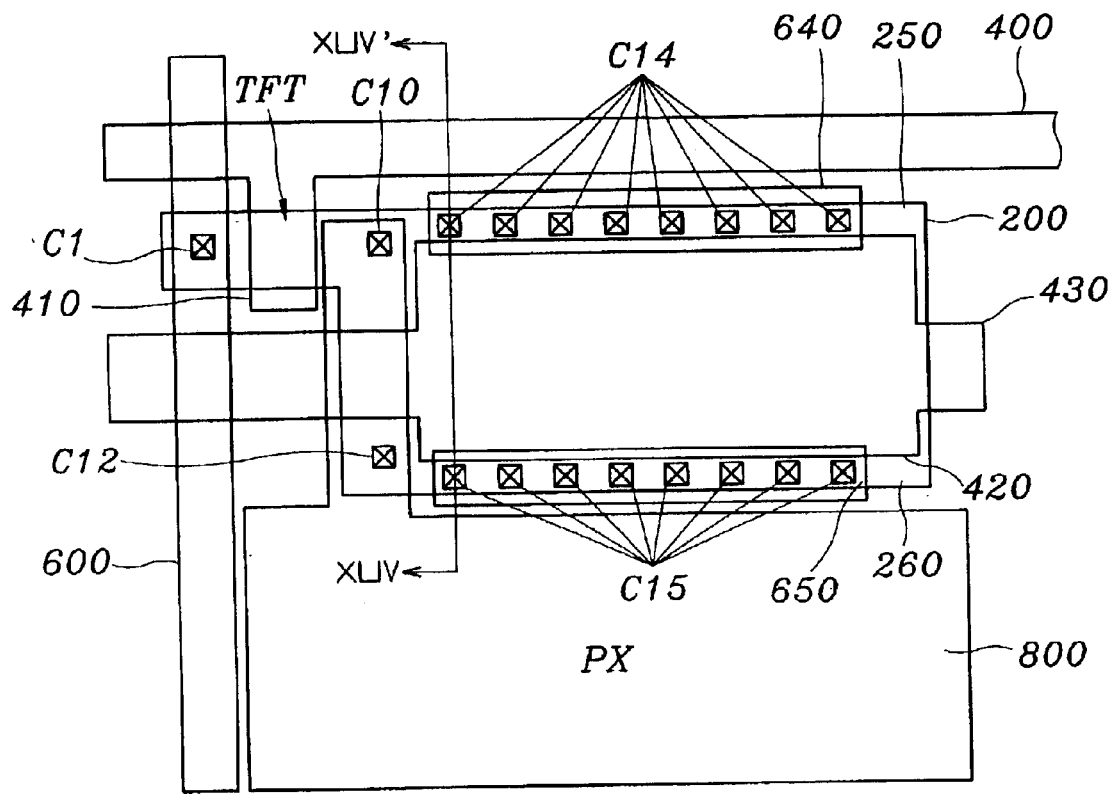
FIG. 43 is a layout view of an LCD according to the fifteenth embodiment of the present invention.
Figure 44:
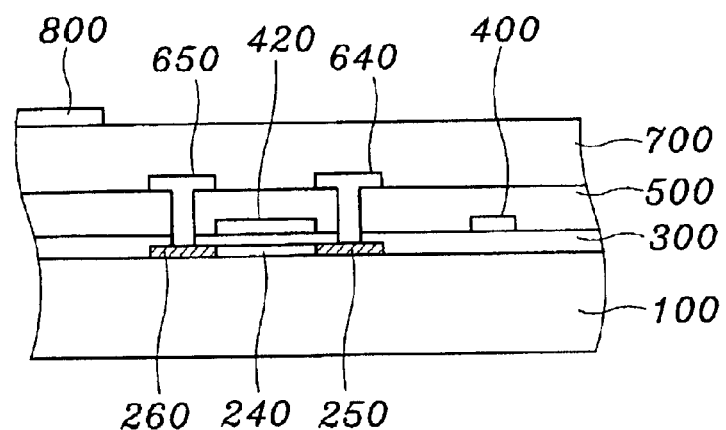
FIG. 44 is a cross sectional view taken along the line XLIV–XLIV' in FIG. 44.

FIGS. 43 and 44 are a layout view and a cross sectional view of an LCD according to the fifteenth embodiment of the present invention.

As shown in FIGS. 43 and 44, metal patterns 640 and 650 are formed over the doped sub-regions 250 and 260 and respectively connected to the upper and the lower sub-regions 250 and 260 through a plurality of contact holes C14 and C15 made in the gate insulating film 300 and the interlayer insulating film 500.

In this embodiment, the resistance of the sub-regions 250 and 260 can be reduced as in the fourteenth embodiment. However, since the metal patterns 640 and 650 do not overlap the storage electrode 420, the additional storage capacitor by the storage electrode 420 and the metal patterns 640 and 650 is not formed.

Figure 45:
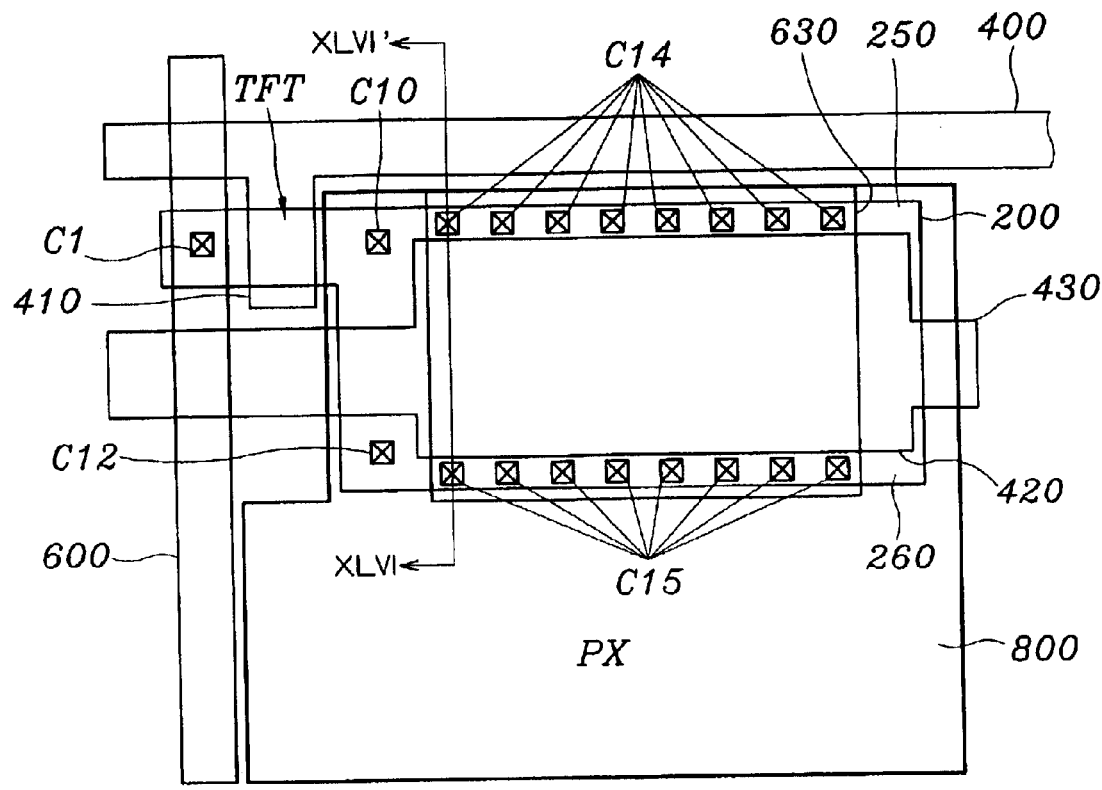
FIG. 45 is a layout view of an LCD according to the sixteenth embodiment of the present invention.
Figure 46:
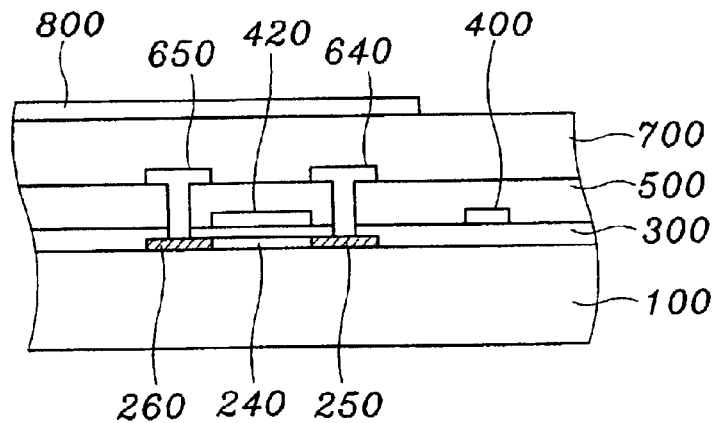
FIG. 46 is a cross sectional view taken along the line XLVI–XLVI' in FIG. 45.

FIG. 45 is a layout view of an LCD according to the sixteenth embodiment of the present invention and FIG. 46 is a cross sectional view taken along the line XLVI–XLVI' in FIG. 45.

The structure and the effects in the sixteenth embodiment are substantially the same as in the fourteenth embodiment, provided that the ITO pixel electrode 800 overlaps the storage electrode 240.

Manufacturing methods of LCDs according to the ninth to sixteenth embodiments are the same as the methods according to the first or the eighth embodiments except that the storage electrode 420 is formed inside the edges of the silicon layer 200, and the metal patterns 630, 640 and 650 are formed in the step of forming data line 600.

Figure 47:
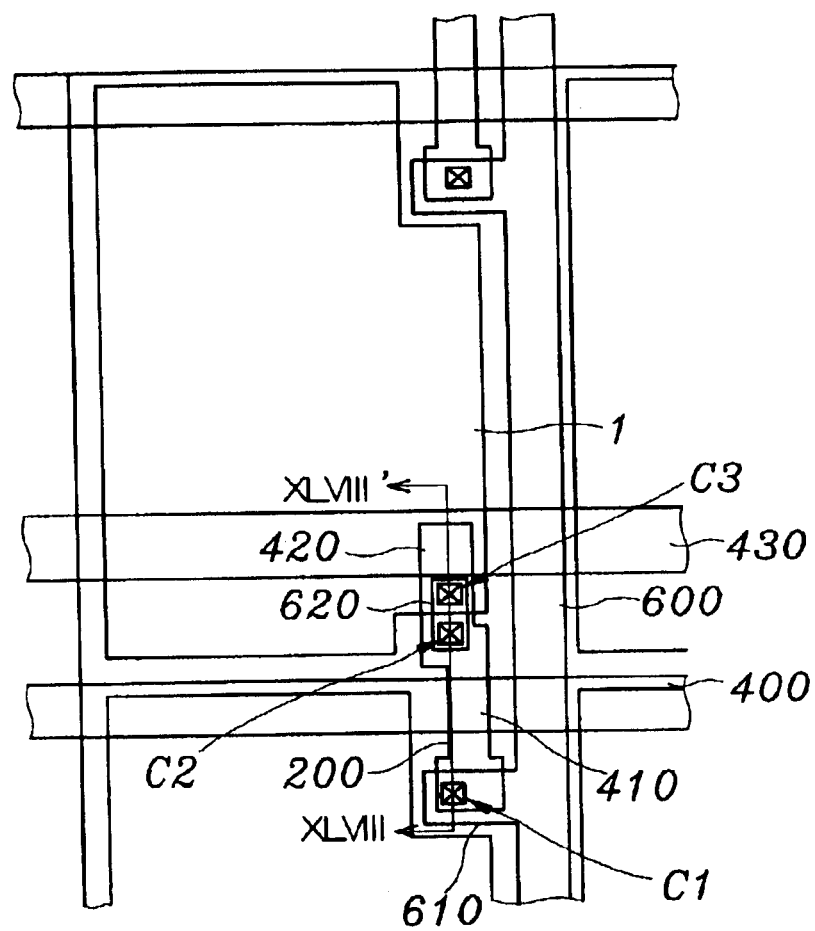
FIG. 47 is a layout view of an LCD according to the seventeenth embodiment of the present invention.
Figure 48:
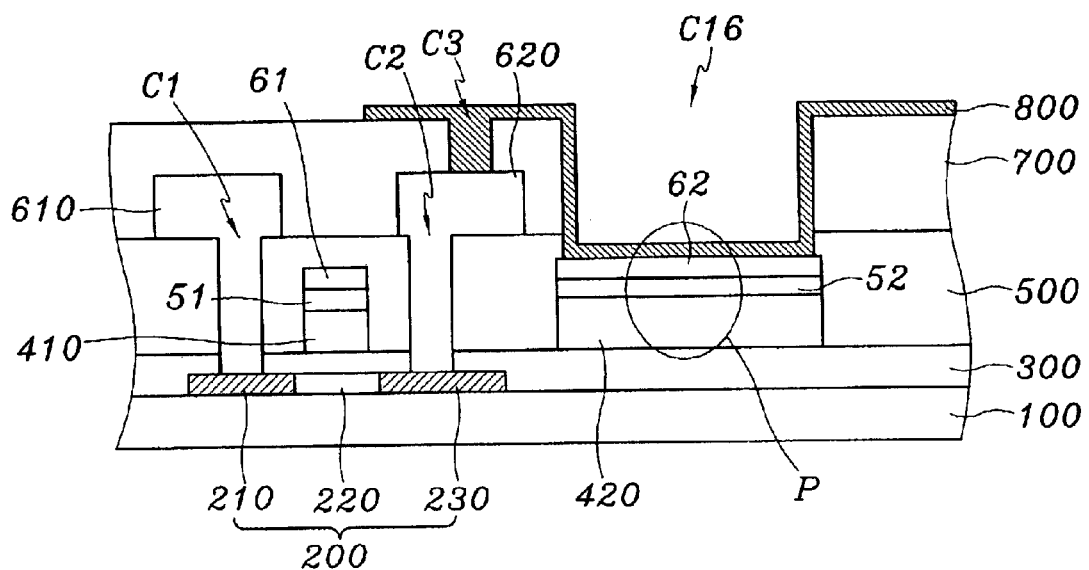
FIG. 48 is a cross sectional view taken along the line XLVIII–XLVIII' in FIG. 47.

FIG. 47 is a layout view of an LCD according to the seventh embodiment of the present invention and FIG. 48 is a cross sectional view taken along the line XLVIII–XLVIII' in FIG. 47.

As shown in FIGS. 47 and 48, a polycrystalline silicon layer 200 is formed on an insulating substrate 100, and a gate insulating film 300 made of $SiO_2$ or $SiN_x$ is formed on the silicon layer 200 and the substrate 100 and has a 500 Å~3,000 Å thickness.

A gate line 400 intersecting the silicon layer 200 is formed on the gate insulating film 300 and extends in the horizontal direction. A portion 410 of the gate line 400 intersecting the silicon layer 200 is a gate electrode. A storage electrode line 430 made of the same layer as the gate line 400 is formed on the gate insulating film 300 and located parallel to the gate line 400. A portion of the storage electrode line 430 becomes a storage electrode 420.

The gate line 400, the gate electrode 410, the storage electrode 420 and the storage electrode line 430 may be formed as a double-layered film or a multiple-layered film.

The silicon layer 200 is divided into several regions. An undoped portion of the silicon layer 200 located opposite the gate electrode 410 is a channel region 220 and doped portions of the silicon layer 200 located on both sides with respect to the channel region 220 are a source region 210 and a drain region 230.

The first insulating films 51 and 52 having a 500 Å~2,500 Å thickness is formed on the wire including the gate line 400, the gate electrode 410, the storage electrode 420 and the storage electrode line 430. The first insulating films 51 and 52 may be a multiple-layered film.

Metal patterns 61 and 62 are formed on the insulating films 51 and 52. The metal pattern 62 formed on the first insulating film 52 opposite the storage electrode 420 plays a role of another electrode of the storage capacitor. The first insulating films 51 and 52 and the metal patterns 61 and 62 are patterned with the same shape as the wire 400, 410, 420 and 430.

The second insulating film, that is, an interlayer insulating film 500 is formed on the first insulating films 51 and 52 and the gate insulating film 300, and contact holes C1 and C2 exposing the source and the drain regions 210 and 230 are formed in the interlayer insulating film 500 and the gate insulating film 500.

A data line 600 made of Ti or TiN is formed on the interlayer insulating film 500 and located in the vertical direction. A source electrode 610 extends from the data line 600 and is connected to the source region 210 through the contact hole C1. A drain electrode 620 is formed opposite the source electrode 610 and connected to the drain region 230 through the contact hole C2.

A passivation film 700 covers the data line 600, the source and the drain electrodes 610 and 620, and has a contact hole C3 exposing the drain electrode 620. A via hole C16 exposing the metal pattern 62 for a storage capacitor is formed in the passivation film 700 and the interlayer insulating film 500.

A transparent pixel electrode 800 is formed on the passivation film 700 and located inside a pixel surrounded by the data line 600 and the gate line 400. The pixel electrode 800 is connected to the drain electrode 620 through the contact hole C3 and to the metal pattern 62 for a storage capacitor through the via hole C16.

The storage electrode 420, the first insulating film 52 and the metal pattern 62 may be formed as a multiple-layered film. It will be described with reference to FIG. 49.

Figure 49:
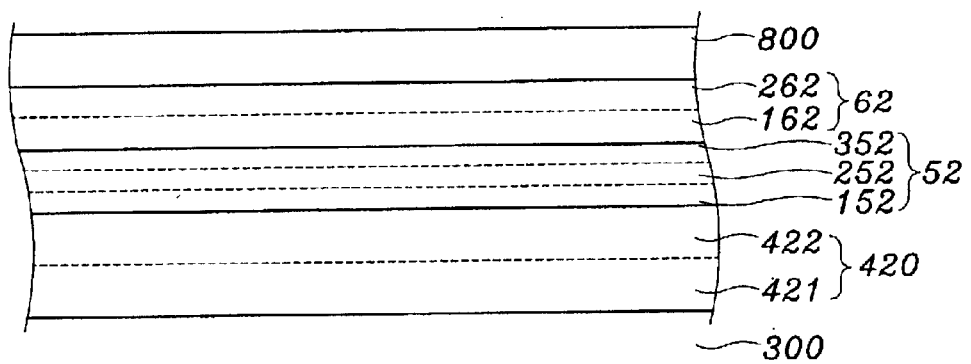
FIG. 49 is an enlarged view of a portion P in FIG. 48.

FIG. 49 is an enlarged cross sectional view of a portion P in FIG. 48 and shows the multiple-layered structure.

As shown in FIG. 49, the storage electrode 420 made of a metal for a gate wire and formed on the gate insulating film 300 is a double-layered film including an aluminum film 421 and a titanium film 422.

The first insulating film 52 formed on the storage electrode 420 has a multiple-layered structure including a $SiO_2$ film 152 and a $SiN_x$ film 252 or a triple-layered structure including a $SiO_2$ film 152, a $SiN_x$ film 252 and $SiO_2$ film 352.

Moreover, the metal pattern 62 formed on the first insulating film 52 has a double-layered structure including a lower film 162 and an upper film 262 or a multiple-layered structure. The upper film 262 of the double-layered structure or the most upper film of the multiple-layered structure is made of materials having a smaller etch rate than the second insulating film 500 and the passivation film 700 such as-Cr, Mo or Nd.

The metal pattern 62 contacts the pixel electrode 800.

The structure described above may be adopted to the mode where a gate line of the previous pixel overlaps a pixel electrode and plays a role of one electrode of a storage capacitor. It is described with reference to FIGS. 50 and 51.

Figure 50:
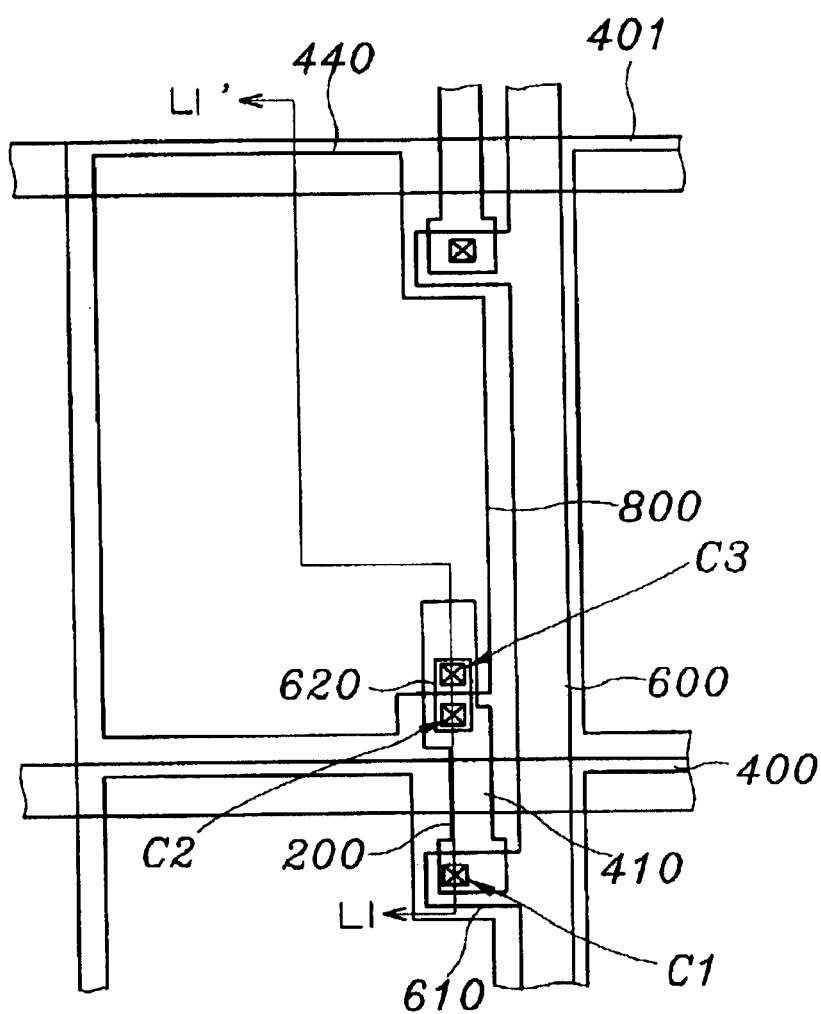
FIG. 50 is a layout view of an LCD according to the eighteenth embodiment of the present invention.
Figure 51:
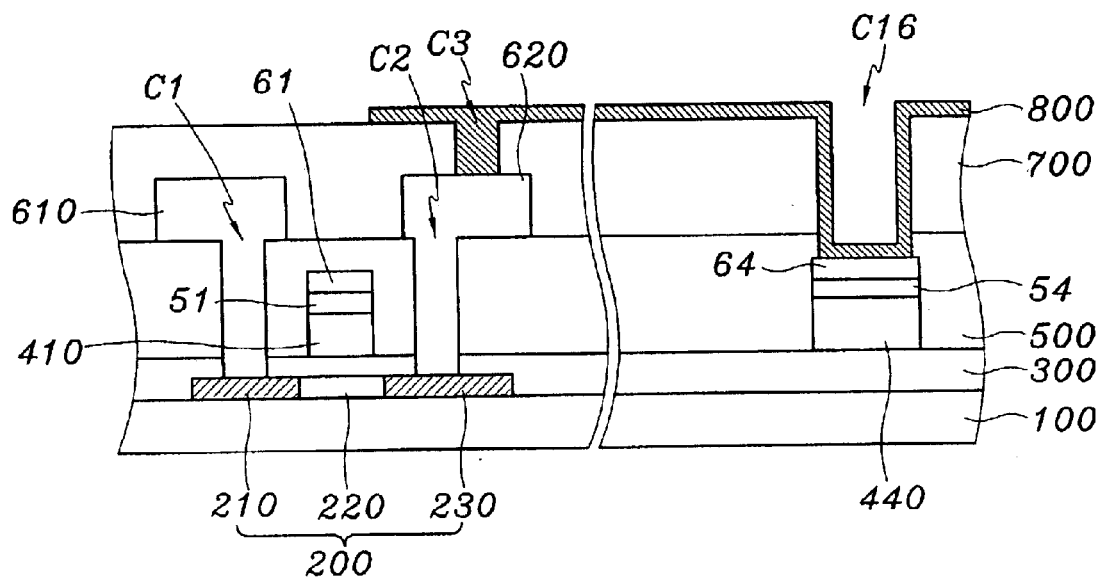
FIG. 51 is a cross sectional view taken along the line LI–LI' in FIG. 50.

FIG. 50 is a layout view of an LCD according to the eighteenth embodiment of the present invention and FIG. 51 is a cross sectional view taken along the line LI–LI' in FIG. 50.

In this embodiment, a portion of a previous gate line plays a role of a storage electrode.

As shown in FIGS. 50 and 51, a storage capacitor includes the first storage electrode 440 which is a portion of a previous gate line 401, an insulating film for a storage capacitor 54 formed on the first storage electrode 440 and the second storage electrode 64. A pixel electrode 800 is connected to the second storage electrode 64 through a via hole C16 formed in the passivation film 700 and the insulating film 500.

The structure of this embodiment is the same as the structure of the seventeenth embodiment except that the previous gate line 401 and the pixel electrode 800 overlap each other and form a storage capacitor.

Since the insulating film 54 for a storage capacitor has a 500 Å thickness, the storage capacitance can be increased.

Next, a manufacturing method of an LCD according to the seventh embodiment of the present invention will be described with reference to FIGS. 47, 52A to 52K.

Figure 52A:
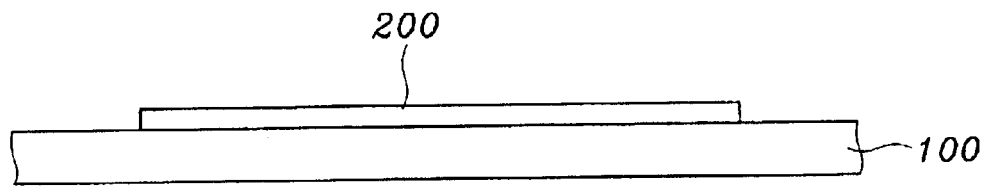
FIGS. 52A to 52K are cross sectional views of the intermediate structures of an LCD shown in FIGS. 47 and 48 according to the seventh embodiment.

As shown in FIG. 52A, a polycrystalline silicon layer 200 is formed on an insulating substrate 100. A thermal process or a laser annealing may be performed to improve crystallization characteristics of the silicon layer 200.

Figure 52B:
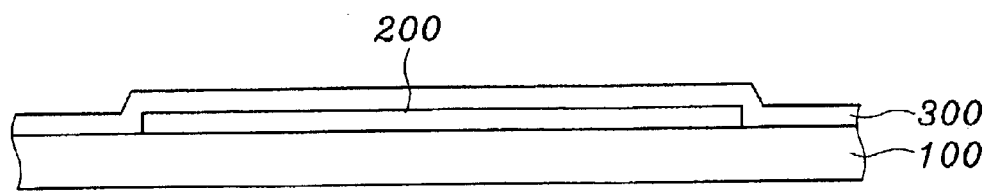

As shown in FIG. 52B, a gate insulating film 300 made of $SiO_2$ or $SiN_x$ is formed on the silicon layer 200 and the substrate 100, and has a 500 Å~3,000 Å thickness.

Figure 52C:
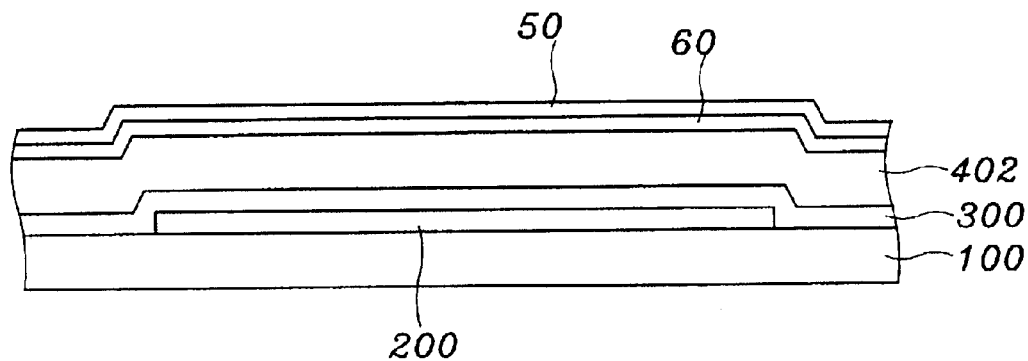

As shown in FIGS. 47 and 52C, a conductive film 402 for a gate wire made of Al is deposited. The first insulating film 50 having a 500 Å~3,000 Å thickness and a metal film 60 for a storage capacitor are sequentially deposited thereon. The conductive film 402 may be formed as a double-layered structure by sequentially depositing an Al film and a Ti film, and the first insulating film 50 may be formed as a double-layered structure including a SiO$_2$ film and a SiN$_x$ film or as a mutiple-layered structure including a SiO$_2$, SiN$_x$ and SiO$_2$. Moreover, the metal film 60 may be formed as a multiple-layered structure and the most upper layer of the metal film 60 for a storage capacitor may be made of Mo, Nd or Cr having a low etch rate against the etchant of an ITO.

Figure 52D:
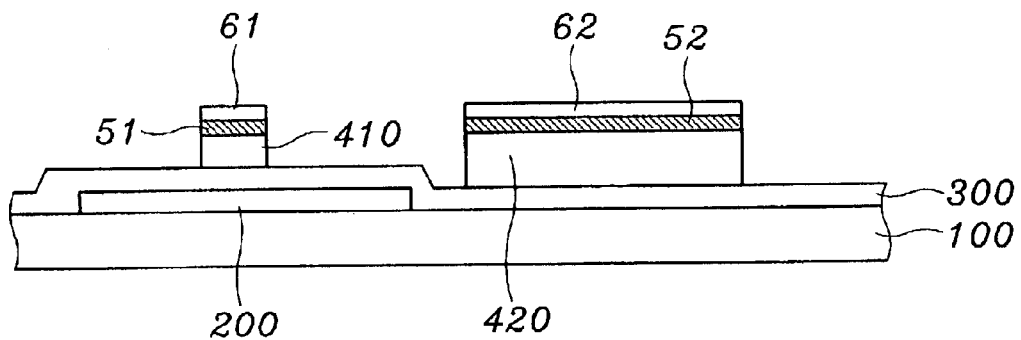

As shown in FIGS. 47 and 52D, the conductive film 402, the first insulating film 50 and the metal film 60 are simultaneously patterned to form the wire including a gate line 400, a gate electrode 410, a storage electrode 420 and a storage electrode line 430. Therefore, the insulating film pattern and the metal film pattern have the same pattern as the wire. In this step, a storage capacitor is formed of the storage electrode 420, the first insulating film pattern 52 and the metal pattern 62 for the storage capacitor.

Figure 52E:
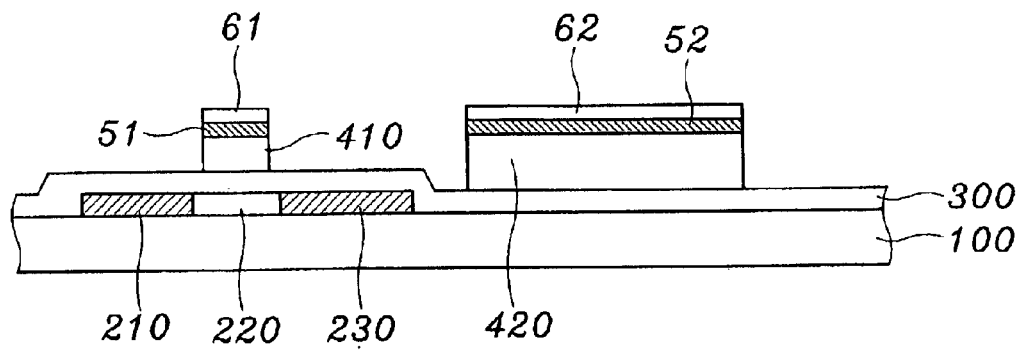

As shown in FIG. 52E, ions are injected into the silicon layer 200 by using the wire as an implant mask to form a source region 210 and a drain region 230.

Figure 52F:
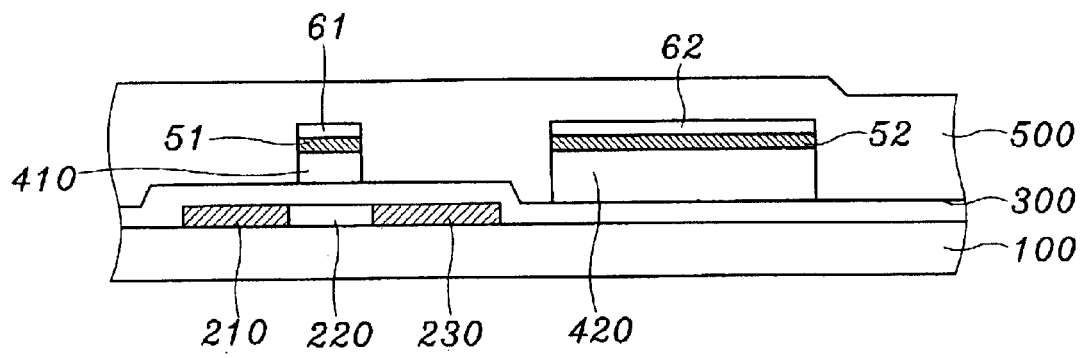
Figure 52G:
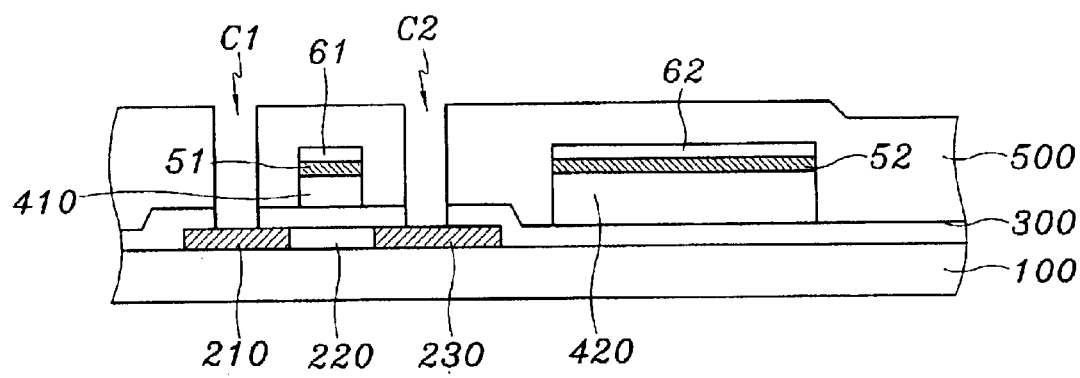

As shown in FIGS. 52F and 52G, the second insulating film 500 is deposited. Contact holes C1 and C2 exposing the source region 210 and the drain region 230 are formed in the gate insulating film 300 and the second insulating film 500. If any contact hole exposing the gate electrode 410 is required, the contact holes C1 and C2 exposing the source and the drain regions 210 and 230 are formed by three steps. It will be described in detail with reference to FIGS. 53A to 53C later.

Figure 52H:
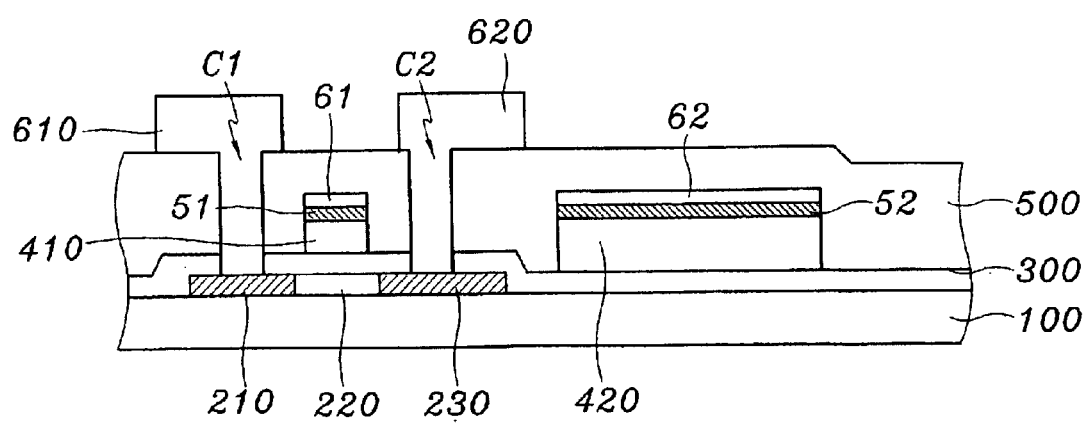

As shown in FIGS. 47 and 52H, a metal layer for a data wire such as Ti or TiN is deposited and patterned to form a data line 600, a source electrode 610 and a drain electrode 620. The source and the drain electrode 610 and 620 are respectively connected to the source and the drain regions 210 and 230.

Figure 52I:
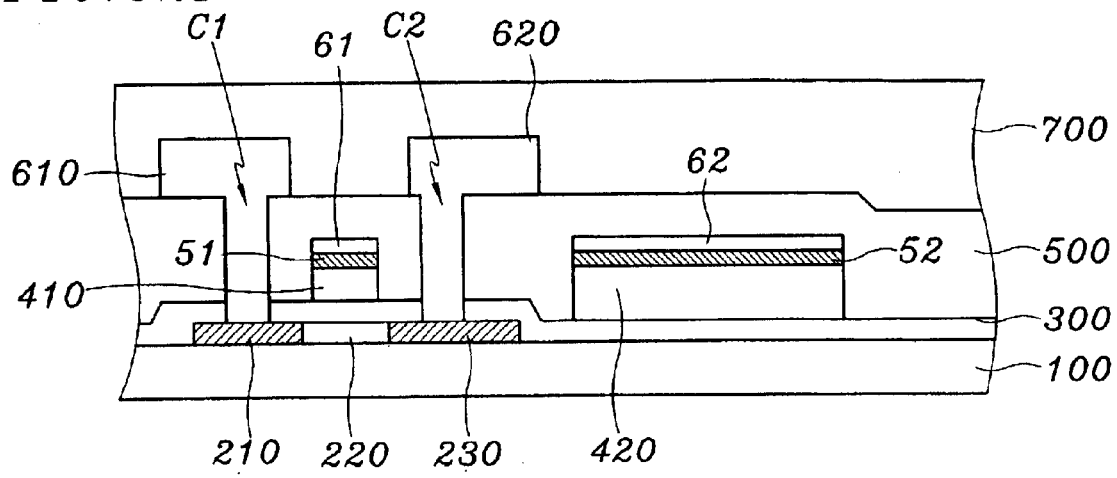

As shown in FIG. 52I, a passivation film 700 is deposited. The passivation film 700 is made of a material having the same etch rate as the second insulating film 500.

Figure 52J:
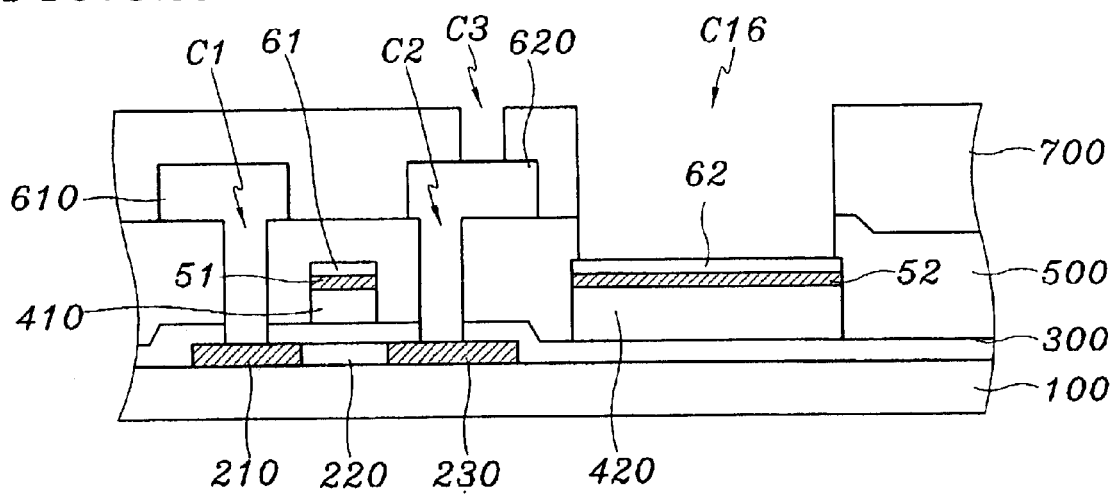

Next, as shown in FIG. 52J, the passivation film 700 and the second insulating film 500 are etched to form a contact hole C3 exposing the drain electrode 620 and a via hole C16 exposing the metal pattern 62 for a storage capacitor. In this step, since the insulating layer 500 and 700 formed over the metal pattern 62 is thicker than the insulating layer 700 formed over the drain electrode 620, over-etching of the insulating layer 700 over the drain electrode 620 may occur.

Figure 52K:
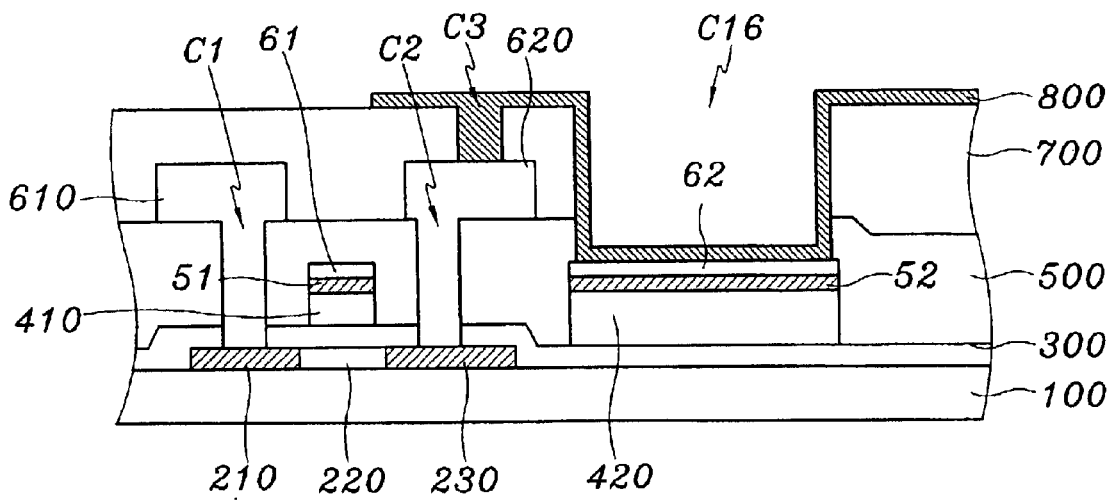

As shown in FIGS. 47 and 52K, an indium-tin-oxide layer is deposited and patterned to form a pixel electrode 800. The pixel electrode 800 is connected to the drain electrode 620 through the contact hole C3 and to the metal pattern 62 through the via hole C16. As described above, since the most upper layer of the metal pattern 62 is made of a material having a low etch rate against an ITO etchant, the layer can be an etch-stopper. Therefore, it is possible to form the first insulating film 52 having a uniform thickness over the storage electrode 420. Moreover, since the drain electrode 620 is made of Ti or TiN, erosion of the drain electrode does not easily occur even when an ITO etchant is infiltrated to the drain electrode 620 through the over-etched contact holes C3.

Figure 53A:
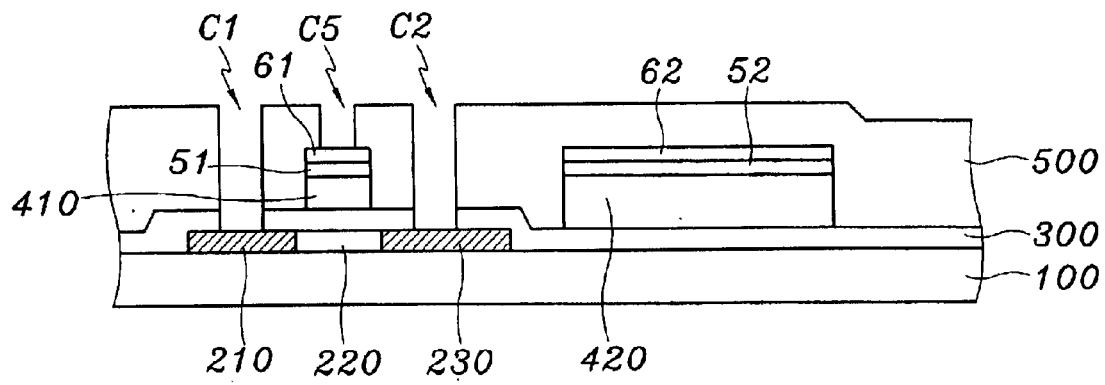
FIGS. 53A to 53C are cross sectional views of the intermediate structures of the structure shown in FIG. 52G.
Figure 53B:
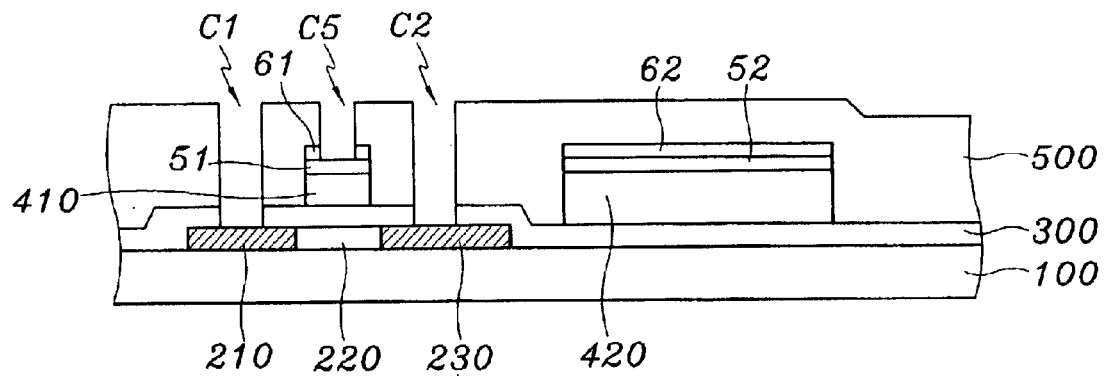
Figure 53C:
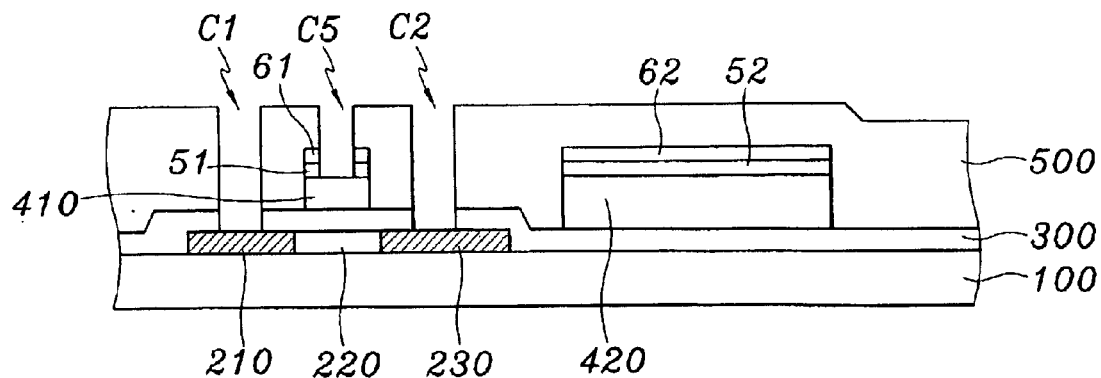

The step of forming contact holes exposing a source and a drain regions according to FIG. 52G is described more in detail with reference to FIGS. 53A to 53C.

As shown in FIGS. 53A to 53C, the second insulating film 500 over the source and the drain regions 210 and 230 and the metal pattern 61 is etched to expose the metal pattern 61 located over the gate electrode 410. The exposed metal pattern 61 is etched to expose the first insulating film 51. The exposed first insulating film 51 and the gate insulating film 300 are etched to expose the gate electrode 410, and the source and the drain regions 210 and 230.

The contact hole C16 over the gate electrode is formed when the data wire is required to be connected to the gate wire.

In this embodiment, since one electrode of the storage capacitor is made of the metal pattern for the gate wire, ion doping step is not required. Moreover, since the storage capacitor is simultaneously formed in the step of forming the gate wire, any additional step is not required.

As described in the embodiments of the present invention, it is possible to form the storage capacitor without an additional step. It is possible to obtain sufficient storage capacitance and reduce the capacitance deviation of the pixels because the dielectric of the storage capacitor can be formed with a thin thickness. Moreover, charging time of the display signal voltages into the pixels is reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A liquid crystal display comprising:

an insulating substrate;

a semiconductor layer formed on the substrate and including a source region, a drain region and a channel region located between the source region and the drain region;

a gate insulating film covering the semiconductor layer;

a gate electrode and a storage electrode formed on the gate insulating film;

an interlayer insulating film covering the gate electrode and the storage electrode and having a recess formed in an upper surface thereof and overlying the storage electrode; and a pixel electrode connected to the drain region and formed over the interlayer insulating film opposite the storage electrode.

2. A liquid crystal display of claim 1, further comprising:

a source electrode and a drain electrode formed on the interlayer insulating film; and a first contact hole and a second contact hole formed in the interlayer insulating film and the gate insulating film and exposing the source region and the drain region, respectively and wherein the source and the drain electrodes are connected to the source and the drain regions through the first contact hole and the second contact hole, respectively.

3. A liquid crystal display of claim 2, further comprising:

a passivation film covering the source electrode and the drain, electrode;

a third contact hole formed in the passivation film and exposing the drain electrode, wherein the pixel electrode is connected to the drain electrode though the third contact hole; and a via hole exposing the recess.

4. A liquid crystal display of claim 1, wherein a thickness of the interlayer insulating film between the recess and the storage electrode is between 500 Å~3,000 Å.

5. A liquid crystal display of claim 1, wherein the semiconductor layer is formed of polycrystalline silicon.

6. A manufacturing method of a liquid crystal display comprising the steps of:

forming a semiconductor layer on an insulating substrate;

forming a gate insulating film covering the semiconductor layer;

forming a gate electrode and a storage electrode on the gate insulating film;

depositing an interlayer insulating film covering the gate electrode and the storage electrode;

partially etching the interlayer insulating film to reduce the thickness of a first portion of the interlayer insulating film opposite the storage electrode; and forming a pixel electrode on the interlayer insulating film.

7. A manufacturing method of a liquid crystal display of claim 6, wherein the reduced thickness of the first portion is 500 Å~3,000 Å.

8. A manufacturing method of a liquid crystal display of claim 6, further comprising the step of forming a source and a drain regions by doping the semiconductor layer using the gate electrode as a mask.

9. A manufacturing method of a liquid crystal display of claim 6, wherein the interlayer insulating film has a double-layered structure including an upper and a lower layers having different etch rates.

10. A manufacturing method of a liquid crystal display of claim 9, wherein the upper layer of the interlayer insulating film is made of a material having the same etch rate as the passivation film.

11. A manufacturing method of a liquid crystal display of claim 10, wherein the upper layer opposite the storage electrode is removed.

12. A manufacturing method of a liquid crystal display of claim 11, wherein the lower layer has a 500Å~3,000 Å thickness.

* * * * *